United States Patent
Kodama et al.

(10) Patent No.: US 7,700,261 B2
(45) Date of Patent: *Apr. 20, 2010

(54) POSITIVE PHOTOSENSITIVE COMPOSITION AND A PATTERN-FORMING METHOD USING THE SAME

(75) Inventors: Kunihiko Kodama, Shizuoka (JP); Kaoru Iwato, Shizuoka (JP); Hideaki Tsubaki, Shizuoka (JP); Norihiko Taguchi, Shizouka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/055,359

(22) Filed: Mar. 26, 2008

(65) Prior Publication Data

US 2009/0081581 A1   Mar. 26, 2009

(30) Foreign Application Priority Data

Sep. 26, 2007   (JP)   ............... 2007-249783

(51) Int. Cl.
G03F 7/039   (2006.01)
G03F 7/20   (2006.01)
G03F 7/30   (2006.01)

(52) U.S. Cl. .................... 430/270.1; 430/326; 430/910; 526/328; 526/328.5; 526/329.3; 560/205; 560/220

(58) Field of Classification Search .................. None
See application file for complete search history.

(56) References Cited

U.S. PATENT DOCUMENTS

| | | | |
|---|---|---|---|
| 7,488,567 B2 * | 2/2009 | Harada et al. ............. | 430/270.1 |
| 2003/0219680 A1 | 11/2003 | Nishimura et al. | |
| 2006/0154181 A1 * | 7/2006 | Hada et al. .................. | 430/322 |
| 2007/0134588 A1 * | 6/2007 | Kanda et al. ............. | 430/270.1 |
| 2008/0206668 A1 * | 8/2008 | Hoshino et al. .......... | 430/270.1 |

FOREIGN PATENT DOCUMENTS

| | | | |
|---|---|---|---|
| EP | 1 795 960 A2 * | 6/2007 | |
| JP | 2003-330192 A | 11/2003 | |
| JP | 2004-184637 A | 7/2004 | |
| JP | 2005-331918 A | 12/2005 | |

OTHER PUBLICATIONS

Derwent English abstract for JP2003-330192 (Nishimura et al).*
Machine-assisted English translation of JP2003-330192 (Nishimura et al), provided by JPO.*

* cited by examiner

*Primary Examiner*—Sin J. Lee
(74) *Attorney, Agent, or Firm*—Sughrue Mion, PLLC

(57) ABSTRACT

A positive photosensitive composition comprises: (A) a compound that generates an acid upon irradiation with actinic ray or radiation; and (B) a resin that increases its solubility in an alkali developer by action of an acid, wherein the resin (B) has a repeating unit that has an acid-decomposable group and is represented by formula (I):

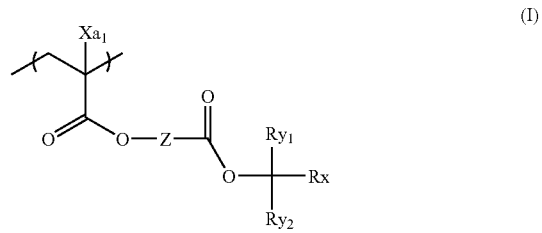

(I)

wherein $Xa_1$ represents a hydrogen atom, an alkyl group, a cyano group, or a halogen atom; $Ry_1$ and $Ry_2$ each independently represents an alkyl group or a cycloalkyl group; Rx represents an alkyl group having 2 or more carbon atoms, or a cycloalkyl group; and Z represents an alkylene group.

23 Claims, 1 Drawing Sheet

FIGURE
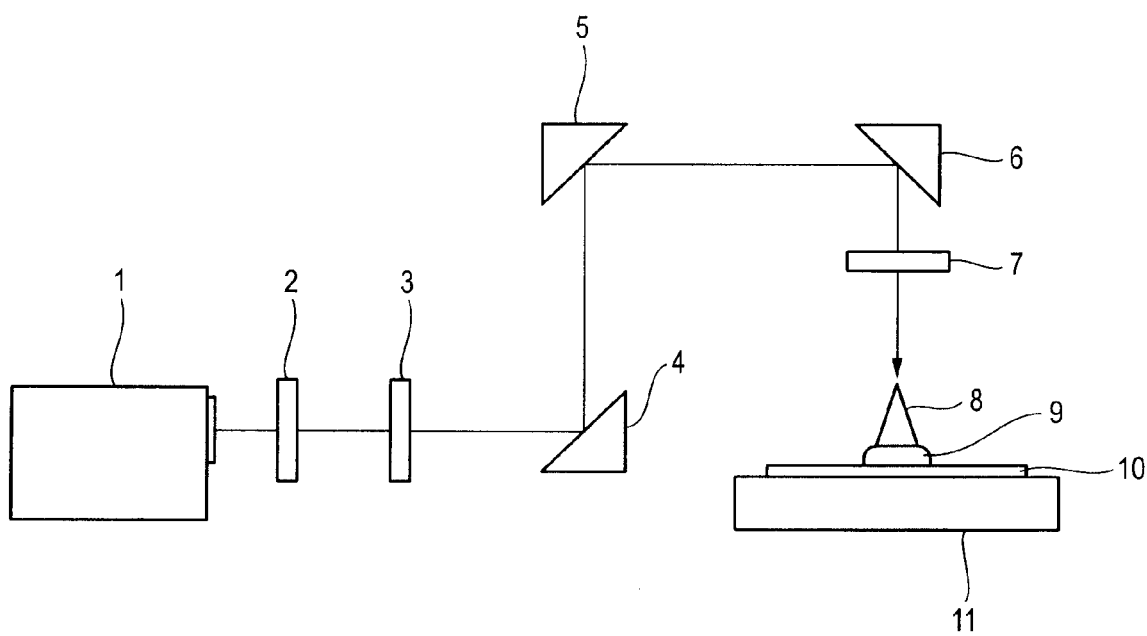

POSITIVE PHOTOSENSITIVE COMPOSITION AND A PATTERN-FORMING METHOD USING THE SAME

BACKGROUND OF THE INVENTION

1. Field of the Invention

The present invention relates to a positive photosensitive composition for use in the manufacturing processes of semiconductors such as IC and the like, liquid crystals, the manufacture of circuit substrates for thermal heads and the like, and other photo-fabrications, and a pattern-forming method using the same. More specifically, the invention relates to a positive photosensitive composition suitable for use in the case where far ultraviolet rays of 250 nm or less, preferably 220 nm or less, are used as exposure light sources, and electron beams are used as irradiation source, and a pattern-forming method using the same.

2. Description of the Related Art

Chemical amplification photosensitive compositions are pattern-forming materials capable of generating an acid at an exposed part upon irradiation with radiation such as far ultraviolet rays, changing the solubility in a developing solution between the irradiated part with the actinic radiation and the non-irradiated part by reaction with the acid as a catalyst, and forming a pattern on a substrate.

In a case where a KrF excimer laser is used as an exposure light source, resins having poly(hydroxystyrene) small in absorption in the region of 248 nm as a fundamental skeleton are mainly used, so that a good pattern having high sensitivity and high resolution can be formed as compared with conventional naphthoquinonediazide/novolak resins.

On the other hand, when a light source of a shorter wavelength, e.g., an ArF excimer laser (193 nm), is used as an exposure light source, even these chemical amplification photosensitive compositions are not sufficient, since compounds containing an aromatic group substantially show large absorption in the region of 193 nm.

Therefore, resists containing a resin having an alicyclic hydrocarbon structure for an ArF excimer laser have been developed. Various improvements have been tried in resists for an ArF excimer laser. For example, in JP-A-2005-331918, JP-A-2004-184637 and JP-A-2003-330192, various improvements of characteristics have been done in repeating units having an alicyclic acid-decomposable group by the introduction of repeating units having a spacer part between the main chain and the acid-decomposable group.

However, in forming a pattern having a line width of as fine as 100 nm or less, a line pattern formed falls down even if resolution performance is excellent, which causes a drawback such as falling down of a pattern leading to a defect in manufacturing a device, and the stability of performances to the change in exposure quantity (exposure latitude) is not sufficient.

SUMMARY OF THE INVENTION

Accordingly, an object of the invention is to provide a positive photosensitive composition improved in falling down of a pattern and exposure latitude performance even in forming a fine pattern of a line width of 100 nm or less, and another object is to provide a pattern-forming method using the same.

The invention is as follows.

(1) A positive photosensitive composition comprising:

(A) a compound that generates an acid upon irradiation with actinic ray or radiation; and (B) a resin that increases its solubility in an alkali developer by action of an acid, wherein the resin (B) has a repeating unit that has an acid-decomposable group and is represented by formula (I):

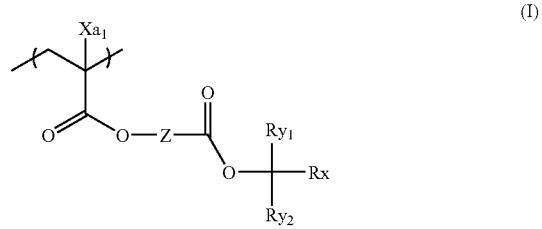

wherein $Xa_1$ represents a hydrogen atom, an alkyl group, a cyano group, or a halogen atom; $Ry_1$ and $Ry_2$ each independently represents an alkyl group or a cycloalkyl group; Rx represents an alkyl group having 2 or more carbon atoms, or a cycloalkyl group; and Z represents an alkylene group.

(2) The positive photosensitive composition as described in the above item (1), wherein the resin (B) further has a repeating unit having at least one group selected from a lactone group, a hydroxyl group, a cyano group, and an alkali-soluble group.

(3) The positive photosensitive composition as described in the above item (1), wherein the resin (B) further has a repeating unit having a hydroxystyrene structure.

(4) The positive photosensitive composition as described in any of the above items (1) to (3), wherein the resin (B) further has a repeating unit that has an acid-decomposable group and is other than the repeating unit represented by formula (I).

(5) A resin having: a repeating unit represented by formula (I); and a repeating unit having at least one group selected from a lactone group, a hydroxyl group, a cyano group, and an alkali-soluble group:

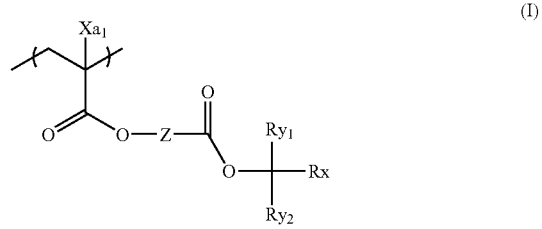

wherein $Xa_1$ represents a hydrogen atom, an alkyl group, a cyano group, or a halogen atom; $Ry_1$ and $Ry_2$ each independently represents an alkyl group or a cycloalkyl group; Rx represents an alkyl group having 2 or more carbon atoms, or a cycloalkyl group; and Z represents an alkylene group.

(6) A resin having a repeating unit represented by formula (I-a):

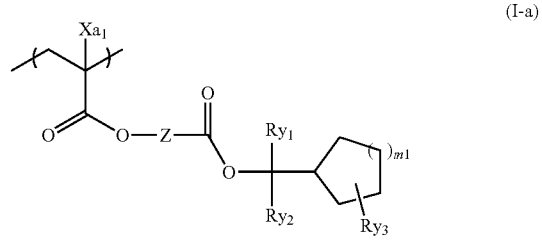

wherein $Xa_1$ represents a hydrogen atom, an alkyl group, a cyano group, or a halogen atom; $Ry_1$ and $Ry_2$ each independently represents an alkyl group or a cycloalkyl group; $Ry_3$ represents a hydrogen atom or an alkyl group; Z represents an alkylene group; and m1 represents 1 or 2.

(7) The resin as described in the above item (5) or (6), wherein at least one of $Ry_1$ and $Ry_2$ is an alkyl group having 2 or more carbon atoms.

(8) A polymerizable compound represented by the following formula (I'):

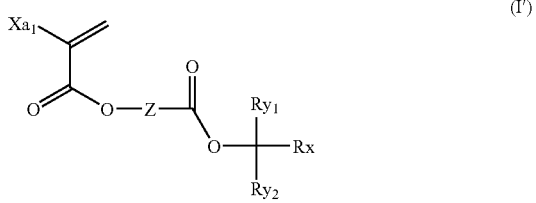

wherein $Xa_1$ represents a hydrogen atom, an alkyl group, a cyano group, or a halogen atom; $Ry_1$ and $Ry_2$ each independently represents an alkyl group or a cycloalkyl group; Rx represents an alkyl group having 2 or more carbon atoms, or a cycloalkyl group; and Z represents an alkylene group.

(9) A polymerizable compound represented by the following formula (I-a1):

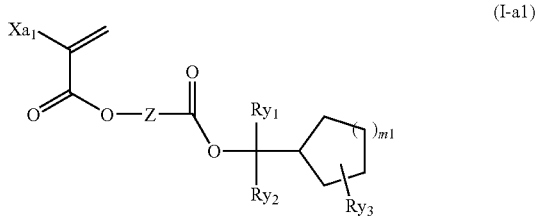

wherein $Xa_1$ represents a hydrogen atom, an alkyl group, a cyano group, or a halogen atom; $Ry_1$ and $Ry_2$ each independently represents an alkyl group or a cycloalkyl group; $Ry_3$ represents a hydrogen atom or an alkyl group; Z represents an alkylene group; and m1 represents 1 or 2.

(10) The polymerizable compound as described in the above item (8) or (9), wherein at least one of $Ry_1$ and $Ry_2$ is an alkyl group having 2 or more carbon atoms.

(11) A pattern-forming method comprising: forming a film with the positive photosensitive composition as described in any of the above items (1) to (4); and exposing and developing the film.

BRIEF DESCRIPTION OF THE DRAWINGS

FIG. 1 is a schematic drawing of a laboratory apparatus of two-beam interference exposure.

1 denotes a laser, 2 denotes a diaphragm, 3 denotes a shutter, 4, 5 and 6 denote reflection mirrors, 7 denotes a condenser lens, 8 denotes a prism, 9 denotes an immersion liquid, 10 denotes a wafer having an antireflection film and a resist film, and 11 denotes a wafer stage.

DETAILED DESCRIPTION OF THE INVENTION

The best mode for carrying out the invention will be described below.

Incidentally, in the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

(A) Compounds Capable of Generating an Acid Upon Irradiation with Actinic Ray or Radiation:

The positive photosensitive composition in the invention contains a compound capable of generating an acid upon irradiation with actinic ray or radiation (hereinafter also referred to as "an acid generator").

As such acid generators, photopolymerization initiators of photo-cationic polymerization, photopolymerization initiators of photo-radical polymerization, photo-decoloring agents of dyestuffs, photo-discoloring agents, well-known compounds capable of generating an acid upon irradiation with actinic ray or radiation that are used in micro-resists and the like, and the mixtures of these compounds can be optionally used.

For example, diazonium salt, phosphonium salt, sulfonium salt, iodonium salt, imidosulfonate, oximesulfonate, diazodisulfone, disulfone, and o-nitrobenzyl sulfonate can be exemplified.

Further, compounds obtained by introducing a group or a compound capable of generating an acid upon irradiation with actinic ray or radiation to the main chain or side chain of a polymer, e.g., the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

The compounds capable of generating an acid upon irradiation with light as disclosed in U.S. Pat. No. 3,779,778 and EP-126,712 can also be used.

Of the compounds capable of generating an acid upon irradiation with actinic ray or radiation, compounds represented by the following formula (ZI), (ZII) or (ZIII) can be exemplified as preferred compounds.

In formula (ZI), $R_{201}$, $R_{202}$ and $R_{203}$ each independently represents an organic group.

$X^-$ represents a non-nucleophilic anion, preferably a sulfonate anion, a carboxylate anion, a bis(alkylsulfonyl)-amide anion, a tris(alkylsulfonyl)methide anion, $BF_4^-$, $PF_6^-$, $SbF_6^-$, etc., are exemplified, and preferably an organic anion having a carbon atom.

As preferred organic anions, organic anions represented by any of the following formulae (AN1) to (AN4) are exemplified.

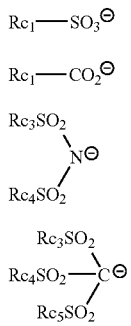

In formulae (AN1) and (AN2), $Rc_1$ represents an organic group.

As the organic group represented by $Rc_1$, an organic group having from 1 to 30 carbon atoms is exemplified, preferably an alkyl group and an aryl group, which may be substituted, and a group obtained by linking a plurality of these groups with a linking group such as a single bond, —O—, —CO$_2$—, —S—, —SO$_3$— or —SO$_2$N(Rd$_1$)— can be exemplified. $Rd_1$ represents a hydrogen atom or an alkyl group, and may form a cyclic structure together with the bonding alkyl group and aryl group.

As the organic groups represented by $Rc_1$, more preferably an alkyl group substituted with a fluorine atom or a fluoroalkyl group on the 1-position, and a phenyl group substituted with a fluorine atom or a fluoroalkyl group can be exemplified. By the presence of the fluorine atom or the fluoroalkyl group, the acidity of the acid generated by light irradiation increases to enhance sensitivity. When the organic group represented by $Rc_1$ has 5 or more carbon atoms, it is preferred that at least one of the carbon atoms has hydrogen atoms, not all the hydrogen atoms are substituted with fluorine atoms, and it is more preferred that the number of hydrogen atoms is larger than the number of fluorine atoms. The toxicity to ecology decreases by the absence of a perfluoroalkyl group having 5 or more carbon atoms.

As especially preferred embodiment of $Rc_1$, a group represented by the following formula can be exemplified.

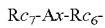

In the above formula, $Rc_6$ represents a perfluoroalkylene group preferably having 4 or less carbon atoms, more preferably from 2 to 4 carbon atoms, and still more preferably 2 or 3 carbon atoms, or a phenylene group substituted with 3 to 5 fluorine atoms and/or 1 to 3 fluoroalkyl groups.

Ax represents a linking group (preferably a single bond, —O—, —CO$_2$—, —S—, —SO$_3$— or —SO$_2$N(Rd$_1$)-). $Rd_1$ represents a hydrogen atom or an alkyl group, and may form a cyclic structure by bonding to $Rc_7$.

$Rc_7$ represents a hydrogen atom, a fluorine atom, a straight chain or branched alkyl group, a monocyclic or polycyclic cycloalkyl group, or an aryl group. The alkyl group, cycloalkyl group and aryl group may be substituted but preferably not substituted with a fluorine atom.

In formulae (AN3) and (AN4), $Rc_3$, $Rc_4$ and $Rc_5$ each independently represents an organic group.

As the organic groups represented by $Rc_3$, $Rc_4$ and $Rc_5$, the same organic groups as preferred organic groups represented by $Rc_1$ are preferably exemplified.

$Rc_3$ and $Rc_4$ may be bonded to each other to form a ring. As the groups formed by bonding $Rc_3$ to $Rc_4$, an alkylene group and an arylene group are exemplified, and a perfluoroalkylene group having from 2 to 4 carbon atoms is preferred. By forming a ring by bonding $Rc_3$ to $Rc_4$, the acidity of the acid generated by light irradiation increases and sensitivity is enhanced.

In formula (ZI), the number of carbon atoms of the organic groups represented by $R_{201}$, $R_{202}$ and $R_{203}$ is generally from 1 to 30, and preferably from 1 to 20.

Further, any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

A compound represented by formula (ZI) may be a compound having a plurality of structures represented by formula (ZI). For instance, a compound represented by formula (ZI) may be a compound having a structure that at least one of $R_{201}$, $R_{202}$ and $R_{203}$ is bonded to at least one of $R_{201}$, $R_{202}$ and $R_{203}$ of another compound represented by formula (ZI).

As preferred components (ZI), the following compounds (ZI-1), (ZI-2) and (ZI-3) can be exemplified.

Compound (ZI-1) is an arylsulfonium compound in the case where at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryldialkyl-sulfonium compound, a diarylcycloalkylsulfonium compound, and an aryldicycloalkylsulfonium compound can be exemplified.

As the aryl groups of the arylsulfonium compound, aryl groups, e.g., a phenyl group and a naphthyl group, and hetero aryl groups, e.g., an indole residue and a pyrrole residue are preferred, and a phenyl group and an indole residue are more preferred. When the arylsulfonium compound has two or more aryl groups, these two or more aryl groups may be the same or different from each other.

The alkyl group that the arylsulfonium compound may have according to necessity is preferably a straight chain or branched alkyl group having from 1 to 15 carbon atoms, e.g., a methyl group, an ethyl group, a propyl group, an n-butyl group, a sec-butyl group, a t-butyl group, etc., can be exemplified.

The cycloalkyl group that the arylsulfonium compound may have according to necessity is preferably a cycloalkyl group having from 3 to 15 carbon atoms, e.g., a cyclopropyl group, a cyclobutyl group, a cyclohexyl group, etc., can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and especially preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent is substituted on the p-position of the aryl group.

Compound (ZI-2) is described below.

Compound (ZI-2) is a compound in the case where $R_{201}$, $R_{202}$ and $R_{203}$ in formula (ZI) each independently represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably represents a straight chain, branched or cyclic 2-oxoalkyl group, or an alkoxycarbonylmethyl group, and especially preferably a straight chain or branched 2-oxoalkyl group.

The alkyl group represented by $R_{201}$, $R_{202}$ and $R_{203}$ is preferably a straight chain or branched alkyl group having from 1 to 10 carbon atoms and, e.g., a methyl group, an ethyl group, a propyl group, a butyl group, and a pentyl group can be exemplified. The alkyl group represented by $R_{201}$, $R_{202}$ and $R_{203}$ is more preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbonyl group can be exemplified. The cycloalkyl group represented by $R_{201}$, $R_{202}$ and $R_{203}$ is more preferably a cyclic 2-oxoalkyl group.

As the straight chain, branched or cyclic 2-oxoalkyl group represented by $R_{201}$, $R_{202}$ and $R_{203}$, preferably a group having >C=O on the 2-position of the above alkyl group and cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and has a phenacylsulfonium salt structure.

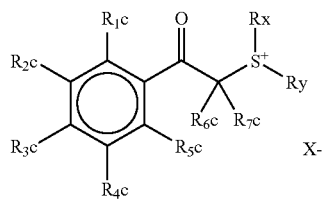

(ZI-3)

In formula (ZI-3), $R_{1c}$, $R_{2c}$, $R_{3c}$, $R_{4c}$ and $R_{5c}$ each independently represents a hydrogen atom, an alkyl group, a cycloalkyl group, an alkoxy group, or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group, or a vinyl group.

Any two or more of $R_{1c}$ to $R_{7c}$, and $R_x$ and $R_y$ may be bonded to each other to form a cyclic structure, and the cyclic structure may contain an oxygen atom, a sulfur atom, an ester bond, or an amido bond. As the groups formed by bonding any two or more of $R_{1c}$ to $R_{7c}$, and $R_x$ and $R_y$, a butylene group, a pentylene group, etc., can be exemplified.

$X^-$ represents a non-nucleophilic anion, and the same anion as the non-nucleophilic anion represented by $X^-$ in formula (ZI) can be exemplified.

The alkyl group represented by $R_{1c}$ to $R_{7c}$ is, e.g., a straight chain or branched alkyl group having from 1 to 20, and preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

The cycloalkyl group represented by $R_{1c}$ to $R_{7c}$ is preferably a cycloalkyl group having from 3 to 8 carbon atoms and, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), and a cyclic alkoxyl group having from 3 to 8 carbon atoms (e.g., a cyclopentyloxy group, and a cyclohexyloxy group) can be exemplified.

Preferably any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15. By selecting such substituents, the solubility in a solvent is bettered and the generation of particles during preservation can be restrained.

As the alkyl group represented by $R_x$ and $R_y$, the same alkyl group as represented by $R_{1c}$ to $R_{7c}$ can be exemplified. The alkyl group represented by $R_x$ and $R_y$ is more preferably a straight chain or branched 2-oxoalkyl group or an alkoxycarbonylmethyl group.

As the cycloalkyl group represented by $R_x$ and $R_y$, the same cycloalkyl group as represented by $R_{1c}$ to $R_{7c}$ can be exemplified. The cycloalkyl group represented by $R_x$ and $R_y$ is more preferably a cyclic 2-oxoalkyl group.

As the straight chain or branched alkyl group, and the cyclic 2-oxoalkyl group, a group having >C=O on the 2-position of the alkyl group or the cycloalkyl group represented by $R_{1c}$ to $R_{7c}$ can be exemplified.

As the alkoxyl group in the alkoxycarbonylmethyl group, the same alkoxyl group as represented by $R_{1c}$ to $R_{5c}$ can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), $R_{204}$, $R_{205}$, $R_{206}$ and $R_{207}$ each independently represents an aryl group, an alkyl group, or a cycloalkyl group.

The aryl group represented by $R_{204}$ to $R_{207}$ is preferably an aryl group, e.g., a phenyl group or a naphthyl group, and more preferably a phenyl group.

The alkyl group represented by $R_{204}$ to $R_{207}$ is preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbonyl group can be exemplified.

$R_{204}$ to $R_{207}$ may each have a substituent. As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a non-nucleophilic anion, and the same anion as the non-nucleophilic anion represented by $X^-$ in formula (ZI) can be exemplified.

As the compounds capable of generating an acid upon irradiation with actinic ray or radiation, compounds represented by the following formula (ZIV), (ZV) or (ZVI) can further be exemplified as preferred compounds.

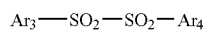

ZIV

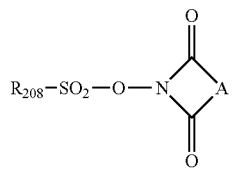

ZV

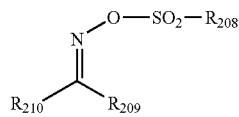

ZVI

In formulae (ZIV) to (ZVI), $Ar_3$ and $Ar_4$ each independently represents an aryl group.

$R_{208}$ represents an alkyl group, a cycloalkyl group, or an aryl group.

$R_{209}$ and $R_{210}$ each independently represents an alkyl group, a cycloalkyl group, an aryl group, or an electron attractive group. $R_{209}$ preferably represents an aryl group. $R_{210}$ preferably represents an electron attractive group, and more preferably a cyano group or a fluoroalkyl group.

A represents an alkylene group, an alkenylene group, or an arylene group.

Of the compounds capable of generating an acid upon irradiation with actinic ray or radiation, preferred compounds are the compounds represented by any of formula (ZI), (ZII) and (ZIII), more preferred compounds are the compounds represented by formula (ZI), and especially preferred compounds are the compounds represented by any of formulae (ZI-1), (ZI-2) and (ZI-3).

Further, compounds capable of generating an acid represented by any of the following formulae (AC1), (AC2) and (AC3) upon irradiation with actinic ray or radiation are preferred.

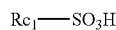

AC1

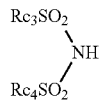

AC2

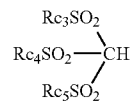

AC3

$Rc_1$, $Rc_3$, $Rc_4$ and $Rc_5$ in formulae (AC1) to (AC3) have the same meanings as those of $Rc_1$, $Rc_3$, $Rc_4$ and $Rc_5$ in formulae (AN1) to (AN4) respectively.

Especially preferred acid generators are the compounds represented by formula (ZI) wherein $X^-$ represents an anion selected from formulae (AN1), (AN3) and (AN4).

Of the compounds capable of generating an acid upon irradiation with actinic ray or radiation, the examples of especially preferred compounds are shown below.

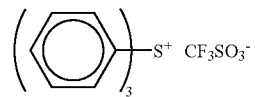

(z1)

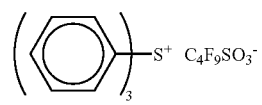

(z2)

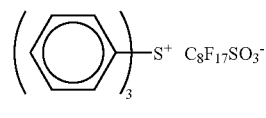

(z3)

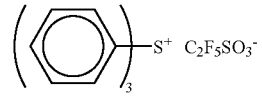

(z4)

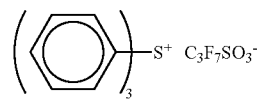

(z5)

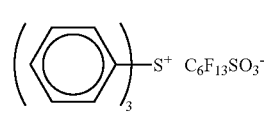

(z6)

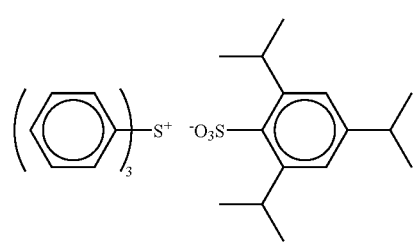

(z7)

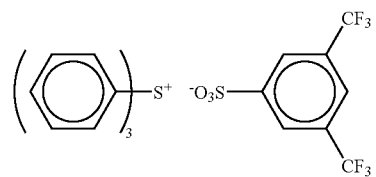

(z8)

-continued
(z9)
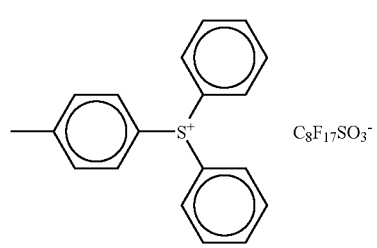
(z10)
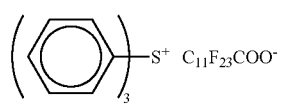
(z11)
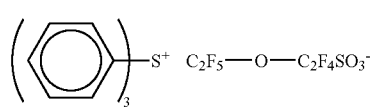
(z12)
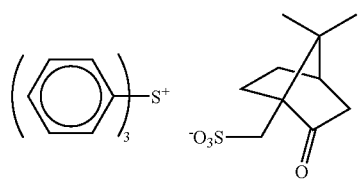
(z13)
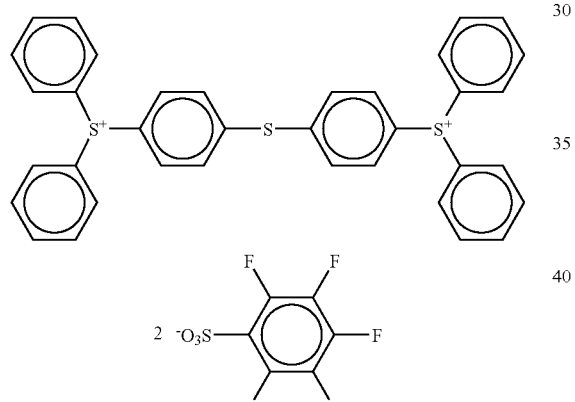
(z14)
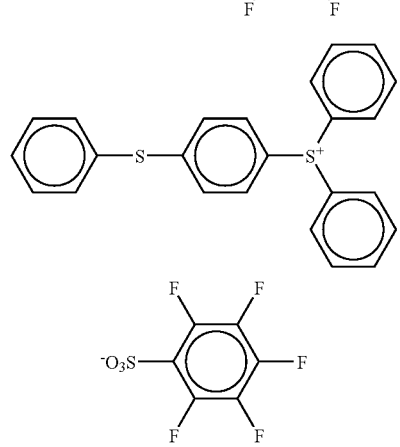
(z15)
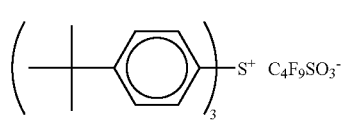
-continued
(z16)
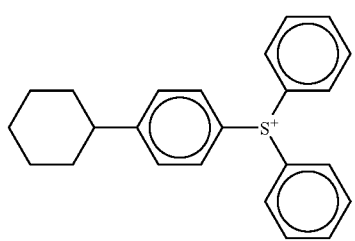
(z17)
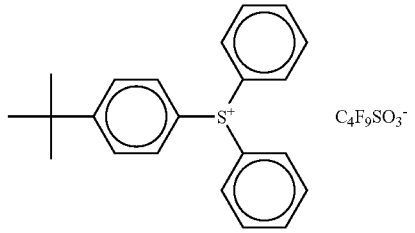
(z18)
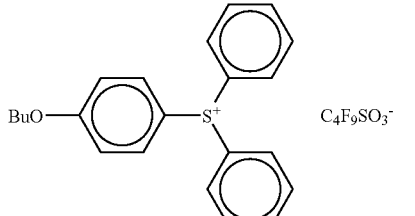
(z19)
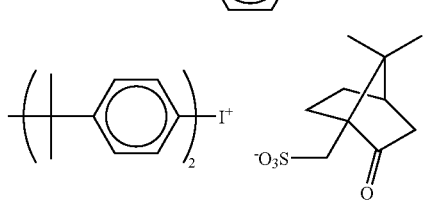
(z20)
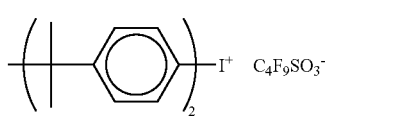
(z21)
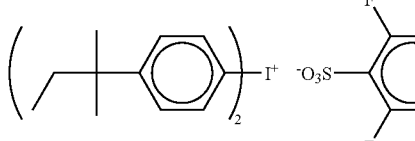
(z22)
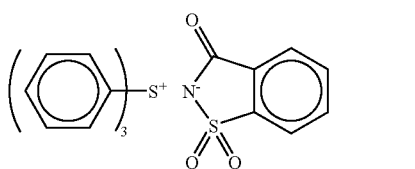
(z23)
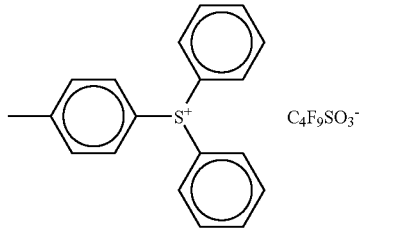

-continued
(z24) 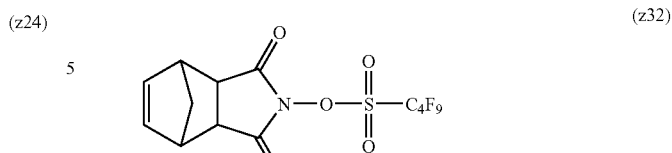
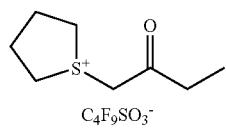
(z25) 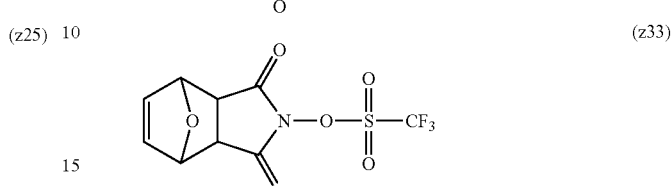
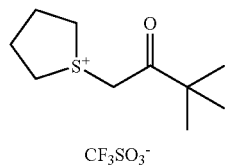
(z26) 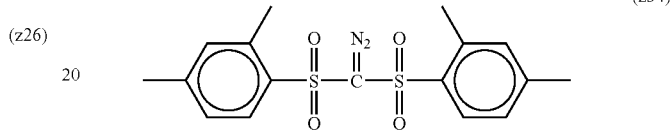
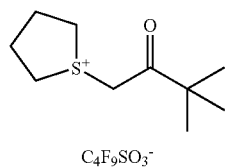
(z34) 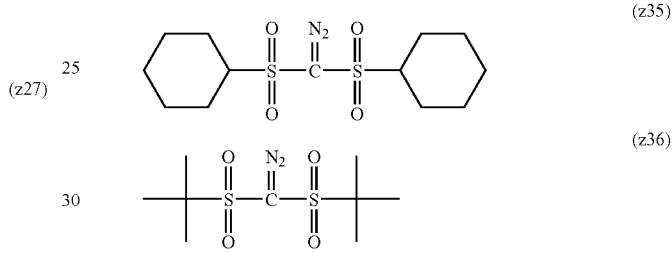
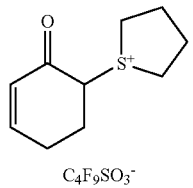
(z27)
(z35)
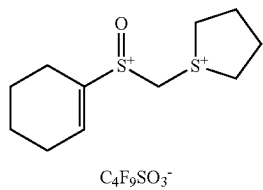
(z28)
(z36) 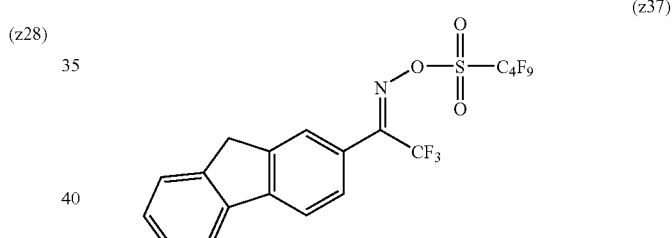
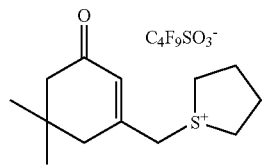
(z37) 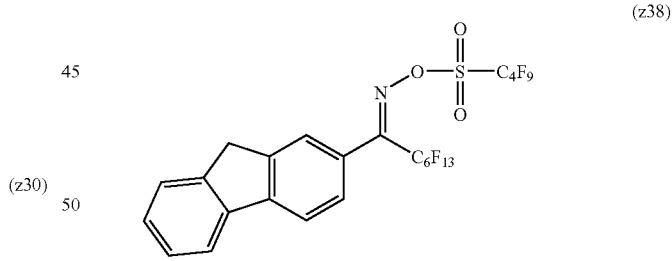
(z29)
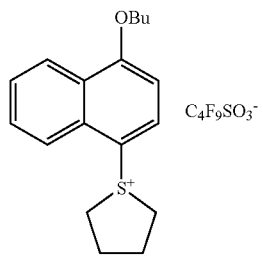
(z38)
(z30)
(z39) 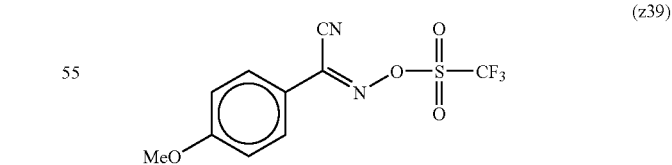
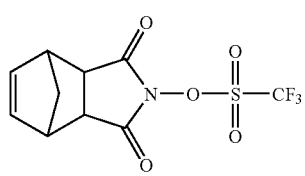
(z31)
(z40) 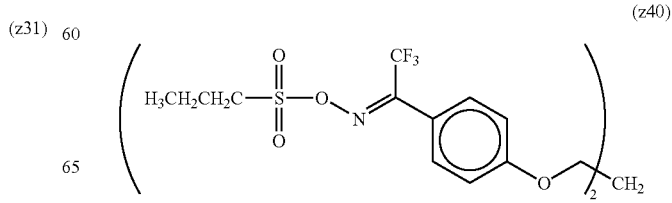

-continued
(z41)
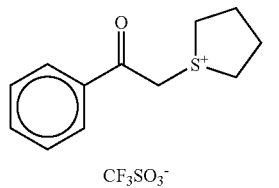
CF₃SO₃⁻
(z42)
C₄F₉SO₃⁻
(z43)
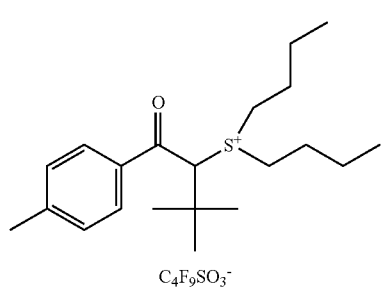
C₄F₉SO₃⁻
(z44)
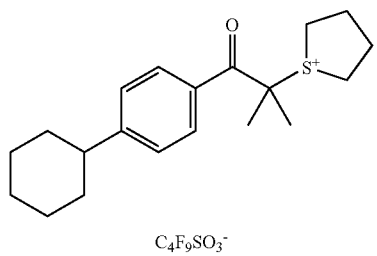
C₄F₉SO₃⁻
(z45)
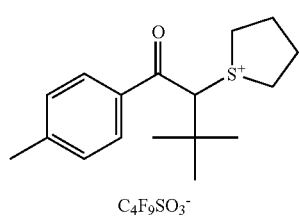
C₄F₉SO₃⁻
(z46)
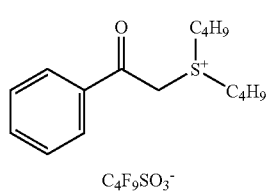
C₄F₉SO₃⁻
(z47)
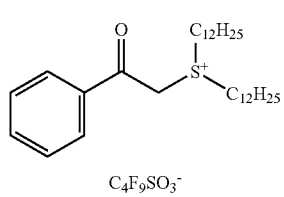
C₄F₉SO₃⁻
-continued
(z48)
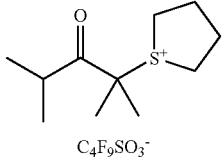
C₄F₉SO₃⁻
(z49)
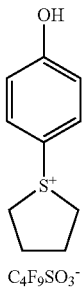
C₄F₉SO₃⁻
(z50)
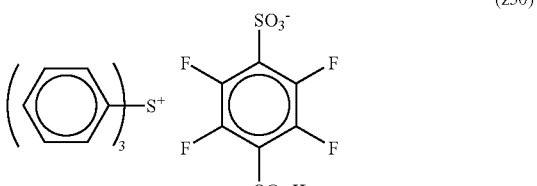
(z51)
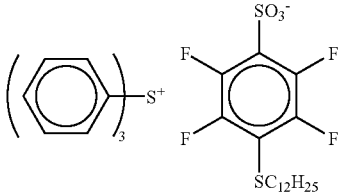
(z52)
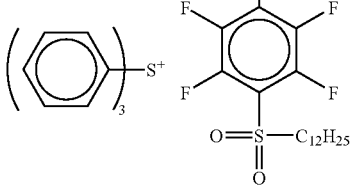
(z53)
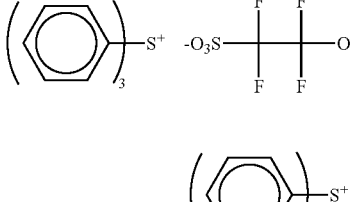
(z54)
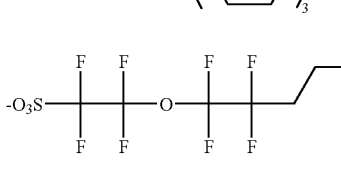

-continued (z55) 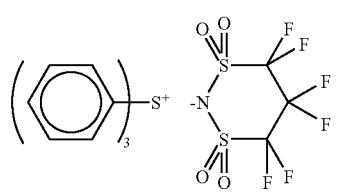

(z56) 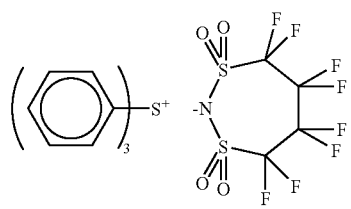

(z57) 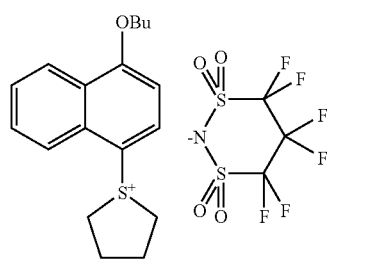

(z58) 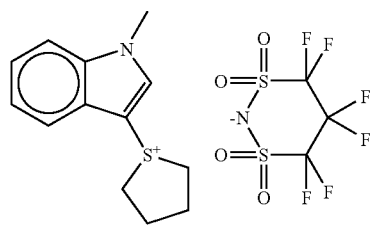

(z59) 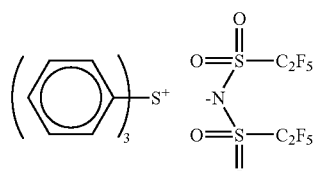

(z60) 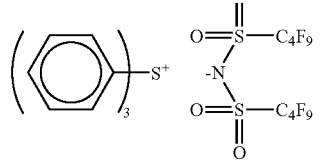

(z61) 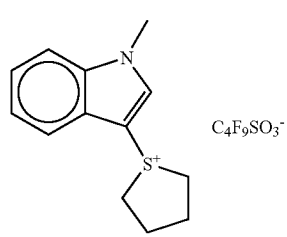

-continued (z62) 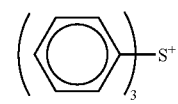

(z63)

(z64)

(z65)

(z66)

(z67)

The acid generators can be used by one kind alone, or two or more kinds of acid generators can be used in combination. When two or more acid generators are used in combination, it is preferred to combine compounds capable of generating two kinds of organic acids in which the total atom number exclusive of a hydrogen atom differs by 2 or more.

The content of the acid generators is preferably from 0.1 to 20 mass % based on all the solids content of the positive photosensitive composition, more preferably from 0.5 to 10 mass %, and still more preferably from 1 to 7 mass %.

(B) Resin that Increases its Solubility in an Alkali Developer by Action of an Acid:

A resin that increases its solubility in an alkali developer by action of an acid (also referred to as "component (B)") used in the positive photosensitive composition in the invention has a repeating unit having an acid-decomposable group represented by the following formula (I):

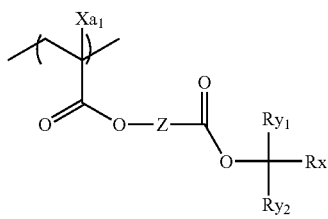

In formula (I), $Xa_1$ represents a hydrogen atom, an alkyl group, a cyano group, or a halogen atom.

$Ry_1$ and $Ry_2$ each independently represents an alkyl group or a cycloalkyl group.

Rx represents an alkyl group having 2 or more carbon atoms, or a cycloalkyl group.

Z represents an alkylene group.

The —C(=O)—O—C($Ry_1$)($Ry_2$)(Rx) group in formula (I) is a group capable of decomposing by the action of an acid to generate a carboxyl group and capable of decomposing by the action of an acid to increase solubility in an alkali developer (also referred to as "an acid-decomposable group").

The alkyl group represented by $Xa_1$ in formula (I) is preferably a straight chain alkyl group having from 1 to 4 carbon atoms and, for example, a methyl group and an ethyl group can be exemplified. The alkyl group represented by $Xa_1$ may be substituted with a hydroxyl group, a halogen atom, and the like. $Xa_1$ preferably represents a hydrogen atom or a methyl group.

The alkyl group represented by $Ry_1$ and $Ry_2$ is a straight chain or branched alkyl group preferably having from 1 to 8 carbon atoms, more preferably from 1 to 4 carbon atoms and, for example, a methyl group, an ethyl group, a propyl group, an isopropyl group, a butyl group, an isobutyl group, a t-butyl group, etc., are exemplified, and a methyl group and an ethyl group are preferred.

The alkyl group having 2 or more carbon atoms represented by Rx is a straight chain or branched alkyl group preferably having from 2 to 12 carbon atoms, more preferably from 2 to 6 carbon atoms, and still more preferably from 3 to 6 carbon atoms, and an ethyl group, an isopropyl group and a t-butyl group are preferred.

As the cycloalkyl group represented by $Ry_1$, $Ry_2$ and Rx, a monocyclic cycloalkyl group having from 3 to 8 carbon atoms and a polycyclic cycloalkyl group having from 7 to 14 carbon atoms are exemplified. As preferred monocyclic cycloalkyl groups, a cyclopentyl group, a cyclohexyl group, a cyclopropyl group, etc., are exemplified. As preferred polycyclic cycloalkyl groups, an adamantyl group, a norbornane group, a tetracyclododecanyl group, a tricyclodecanyl group, a diamantyl group, etc., are exemplified.

When Rx represents an alkyl group having 2 or more carbon atoms or a cycloalkyl group, an acid decomposing property increases, and sensitivity and post exposure baking temperature dependency are bettered as compared with the case of Rx representing a methyl group.

The alkylene group represented by Z is preferably an alkylene group having from 1 to 8 carbon atoms. The alkylene chain may contain a linking group having a hetero atom such as an oxygen atom, a sulfur atom, an ester group, a ketone group, etc. The preferred alkylene group is an alkylene group having from 1 to 4 carbon atoms, and —$CH_2$—, —$CH_2CH_2$—, —$CH(CH_3)$—, —$C(CH_3)_2$— are especially preferred. It is preferred for the alkylene group represented by Z not to have acid eliminability.

A polymerizable compound for forming the repeating unit represented by formula (I) can be easily synthesized according to well-known methods. For example, the polymerizable compound can be synthesized according to methods similar to the method disclosed in JP-A-2005-331918, i.e., by the reaction of an alcohol with a carboxylic acid halogenide compound in the presence of a base, followed by the reaction of the obtained product with a carboxylic acid compound in the presence of a base, as shown below.

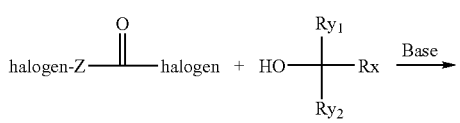

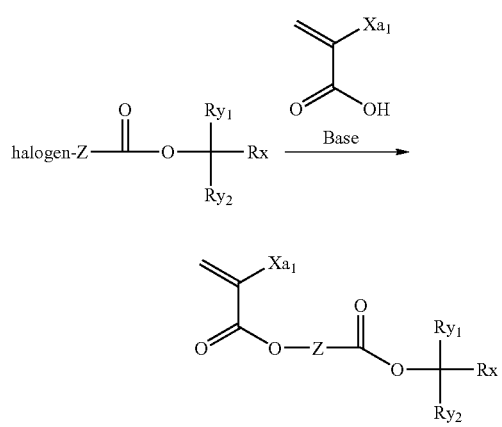

The preferred specific examples of the repeating units represented by formula (I) are shown below, but the invention is not restricted thereto. In the formulae, $Xa_1$ represents a hydrogen atom, an alkyl group, a cyano group or a halogen atom.

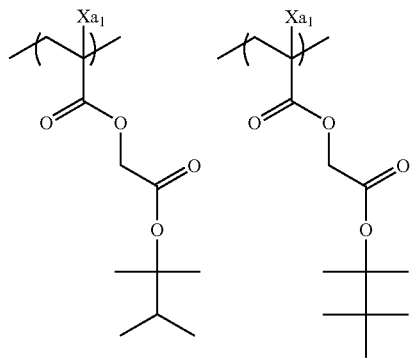

-continued
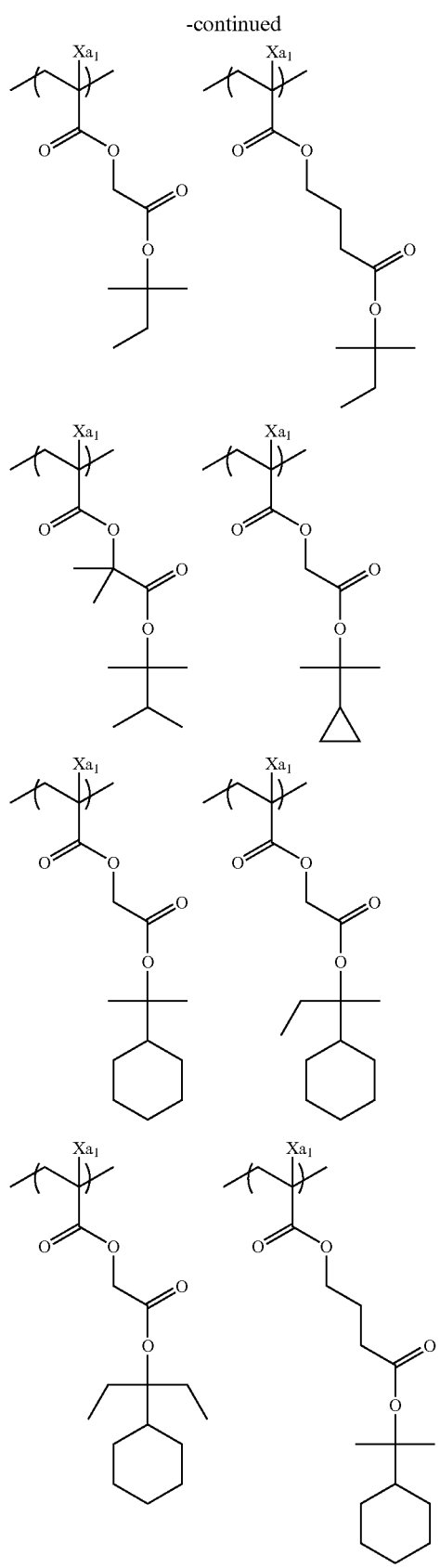
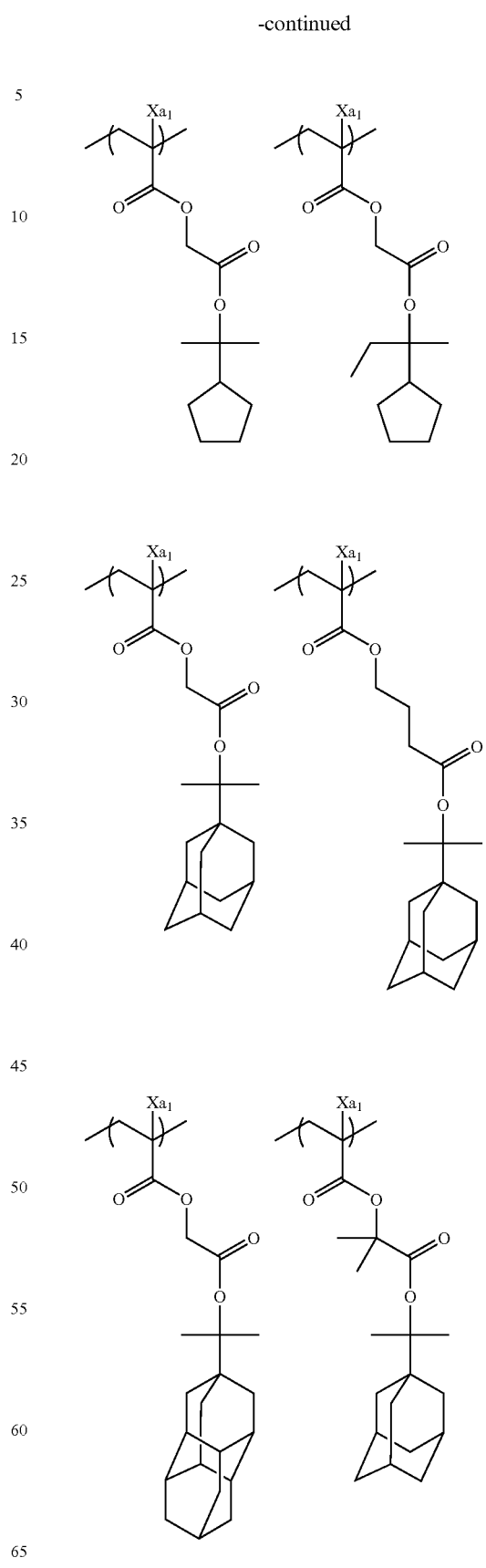

-continued

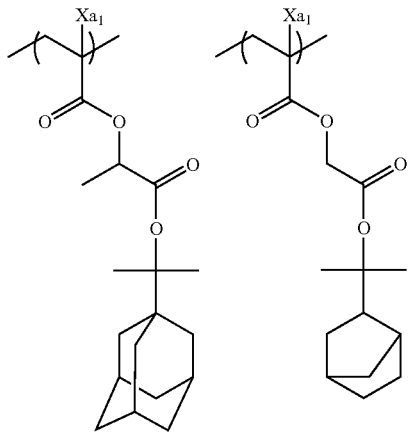

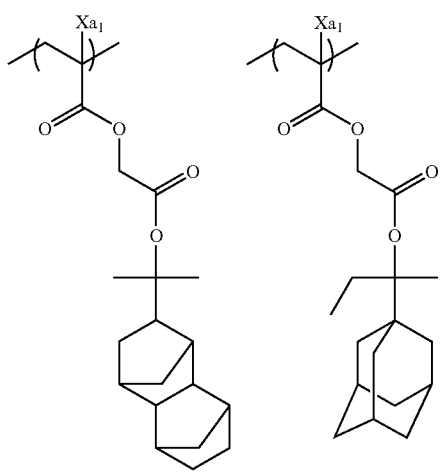

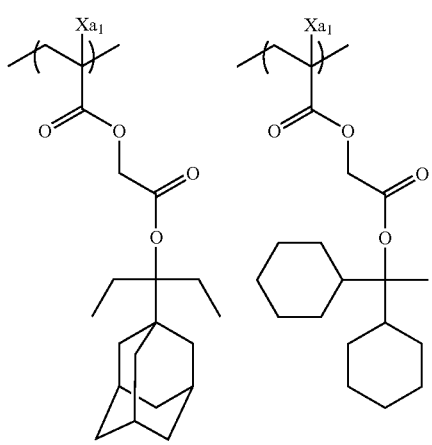

-continued

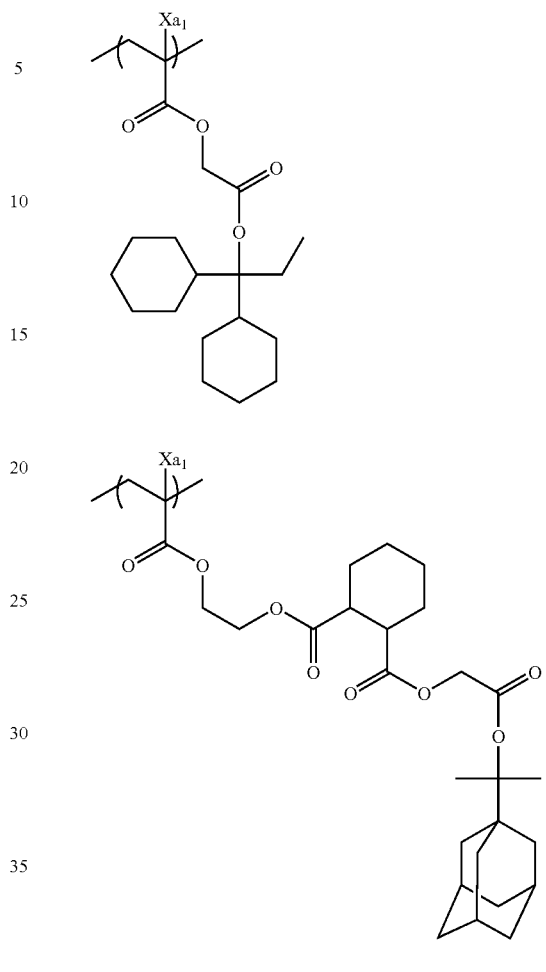

It is preferred for component (B) to have a repeating unit having an acid-decomposable group other than the repeating unit having an acid-decomposable group represented by formula (I).

As the acid-decomposable group, e.g., a group obtained by protecting the hydrogen atom of an alkali-soluble group, such as a carboxyl group, a phenolic hydroxyl group, a sulfonic acid group, a thiol group, etc., with a group that is eliminated by the action of an acid can be exemplified.

As the group that is eliminated by the action of an acid, e.g., —C($R_{36}$)($R_{37}$)($R_{38}$), —C($R_{36}$)($R_{37}$)(O$R_{39}$), —C($R_{O1}$)($R_{O2}$)(O$R_{39}$), and the like can be exemplified.

In the formulae, $R_{36}$ to $R_{39}$ each independently represents an alkyl group, a cycloalkyl group, an aryl group, an aralkyl group, or an alkenyl group. $R_{36}$ and $R_{37}$ may be bonded to each other to form a ring.

$R_{O1}$ and $R_{O2}$ each independently represents a hydrogen atom, an alkyl group, a cycloalkyl group, an aryl group, an aralkyl group, or an alkenyl group.

The repeating unit having an acid-decomposable group other than the repeating unit having an acid-decomposable group represented by formula (I) is preferably a repeating unit represented by the following formula (II).

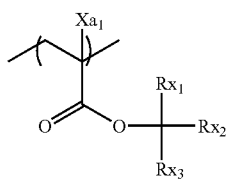
(II)

In formula (II), $Xa_1$ represents a hydrogen atom, an alkyl group, a cyano group or a halogen atom.

$Rx_1$, $Rx_2$ and $Rx_3$ each independently represents an alkyl group or a cycloalkyl group. At least two of $Rx_1$ to $Rx_3$ may be bonded to each other to form a cycloalkyl group.

$Xa_1$ in formula (II) is the same as $Xa_1$ in formula (I).

The alkyl group represented by $Rx_1$ to $Rx_3$ is preferably a straight chain or branched alkyl group having from 1 to 4 carbon atoms and, e.g., a methyl group, an ethyl group, an n-propyl group, an isopropyl group, an n-butyl group, an isobutyl group, a t-butyl group, etc., can be exemplified.

As the cycloalkyl group represented by $Rx_1$ to $Rx_3$, a monocyclic or polycyclic cycloalkyl group can be exemplified, and monocyclic cycloalkyl groups, e.g., a cyclopentyl group and a cyclohexyl group, and polycyclic cycloalkyl groups, e.g., a norbornyl group, a tetracyclodecanyl group, a tetracyclo-dodecanyl group, and an adamantyl group are preferred.

As a cycloalkyl group formed by bonding at least two of $Rx_1$ to $Rx_3$, monocyclic cycloalkyl groups, e.g., a cyclopentyl group and a cyclohexyl group, and polycyclic cycloalkyl groups, e.g., a norbornyl group, a tetracyclodecanyl group, a tetracyclododecanyl group, and an adamantyl group are preferred.

An embodiment that $Rx_1$ represents a methyl group or an ethyl group, and $Rx_2$ and $Rx_3$ are bonded to each other to form a monocyclic or polycyclic cycloalkyl group is preferred.

The specific examples of preferred repeating units having an acid-decomposable group other than the repeating unit having an acid-decomposable group represented by formula (I) are shown below, but the invention is not restricted thereto.

(In the formulae, Rx represents H, $CH_3$, $CF_3$ or $CH_2OH$, and Rxa and Rxb each represents an alkyl group having from 1 to 4 carbon atoms.)

1
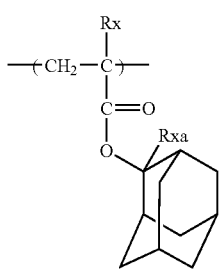

2
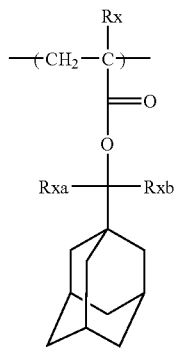

3
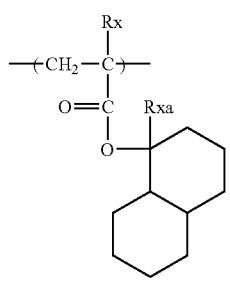

4
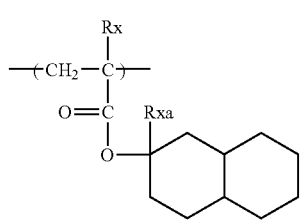

5
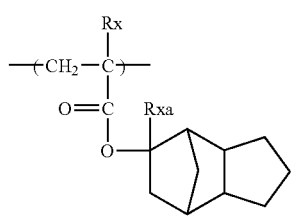

6
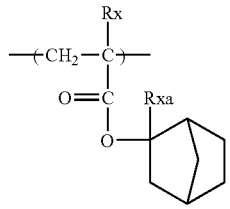

7
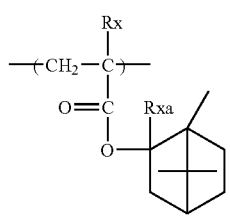

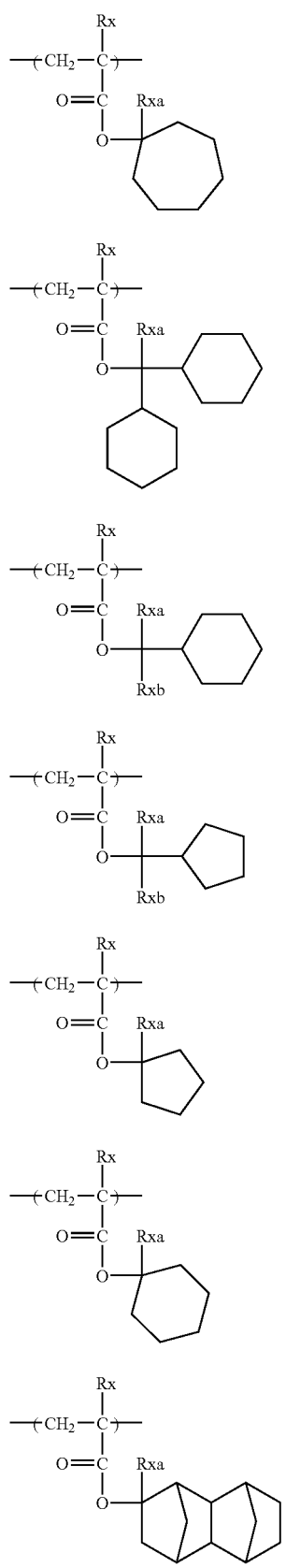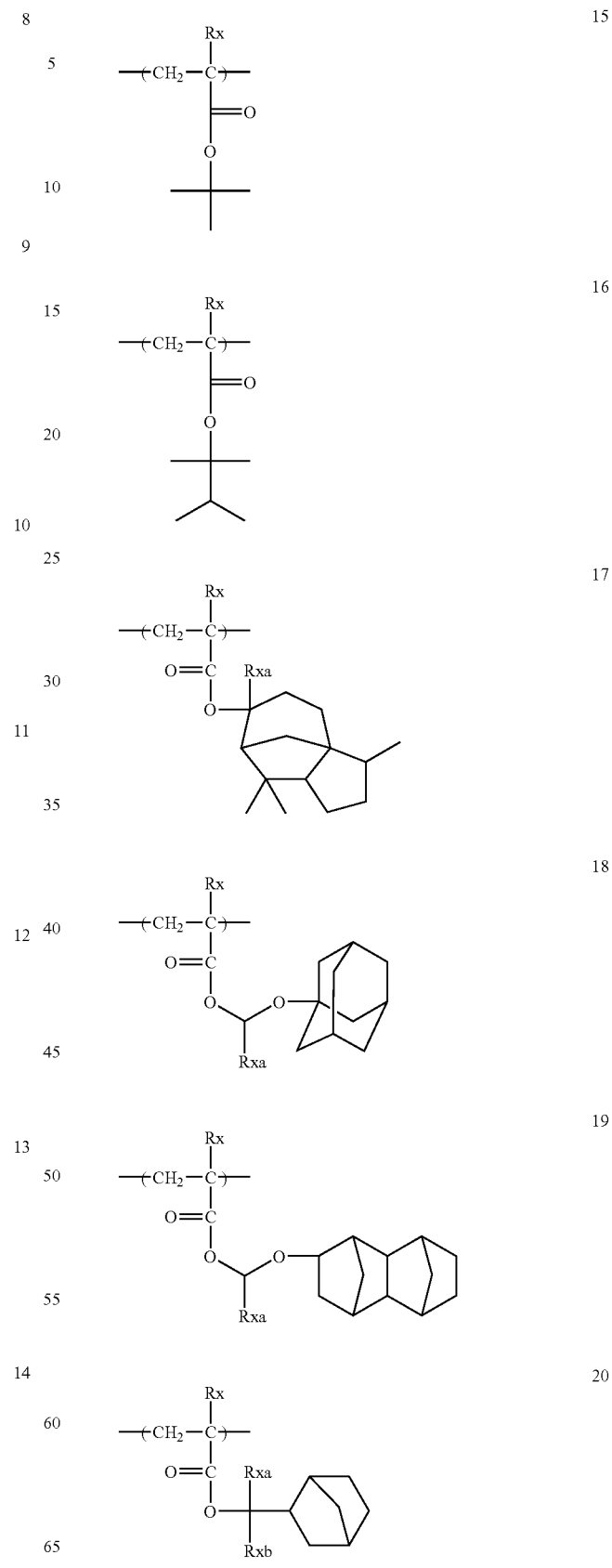

-continued

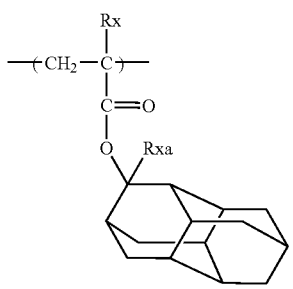

21

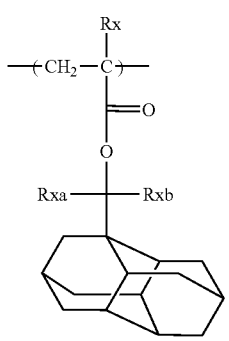

22

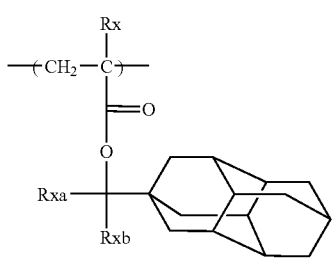

23

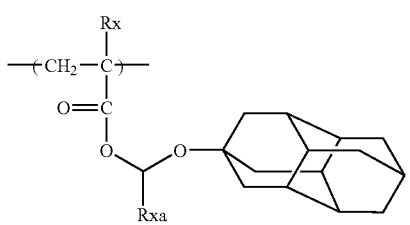

24

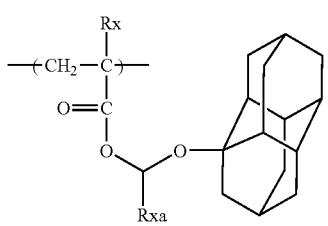

25

Of the above specific examples of the repeating units represented by formula (II), repeating units 1, 2, 10, 11, 12, 13 and 14 are preferred.

When the repeating unit having an acid-decomposable group represented by formula (I) and other repeating unit having an acid-decomposable group (preferably the repeating unit represented by formula (II)) are used in combination, the ratio of the repeating unit having an acid-decomposable group represented by formula (I) and other repeating unit having an acid-decomposable group is preferably from 90/10 to 10/90 in molar ratio, and more preferably from 80/20 to 20/80.

The content of all the repeating units each having an acid-decomposable group in component (B) is preferably from 20 to 50 mol % to all the repeating units in the polymer, and more preferably from 25 to 45 mol %.

It is preferred for component (B) to have a repeating unit having at least one kind of a group selected from a lactone group, a hydroxyl group, a cyano group, and an alkali-soluble group.

It is preferred for component (B) to have a repeating unit having a lactone structure.

As the lactone structure, any group can be used so long as it has a lactone structure, but preferably 5- to 7-membered ring lactone structures, and 5- to 7-membered ring lactone structures condensed with other ring structures in forming a bicyclo structure or a spiro structure are preferred. It is more preferred to have a repeating unit having a lactone structure represented by any of the following formulae (LC1-1) to (LC1-16). A lactone structure may be directly bonded to the main chain of a polymer. Preferred lactone structures are (LC1-1), (LC1-4), (LC1-5), (LC1-6), (LC1-13) and (LC1-14). By the use of a specific lactone structure, line edge roughness and development defect are bettered.

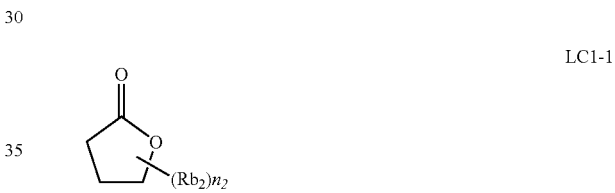

LC1-1

LC1-2

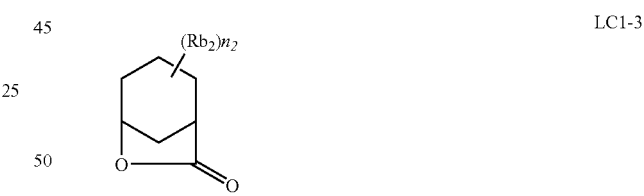

LC1-3

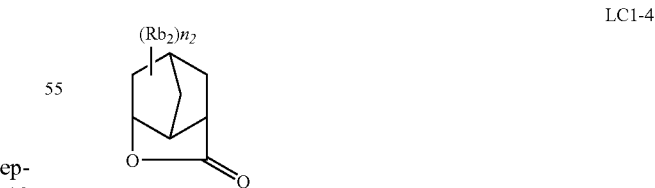

LC1-4

LC1-5

LC1-6 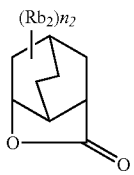

LC1-7 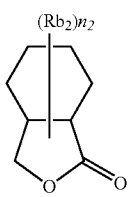

LC1-8 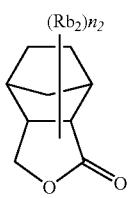

LC1-9 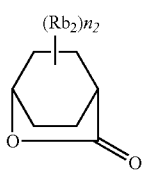

LC1-10 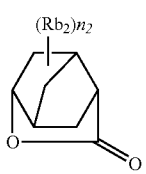

LC1-11 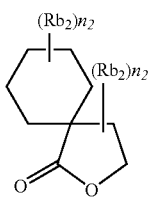

LC1-12 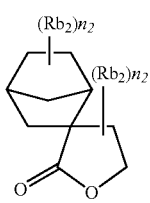

LC1-13 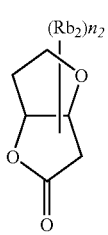

LC1-14 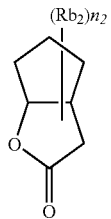

LC1-15 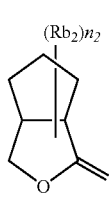

LC1-16 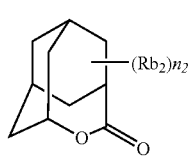

A lactone structural site may have or may not have a substituent ($Rb_2$). As preferred substituents ($Rb_2$), an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, and an acid-decomposable group are exemplified. More preferred substituents are an alkyl group having from 1 to 4 carbon atoms, a cyano group, and an acid-decomposable group. $n_2$ represents an integer of from 0 to 4. When $n_2$ is 2 or more, a plurality of $Rb_2$'s may be the same or different from each other, and a plurality of $Rb_2$'s may be bonded to each other to form a ring.

As repeating unit having a lactone structure represented by any of formulae (LC1-1) to (LC1-16), a repeating unit represented by the following formula (AI) can be exemplified.

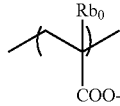   (AI)

In formula (AI), $Rb_0$ represents a hydrogen atom, a halogen atom, or an alkyl group having from 1 to 4 carbon atoms. As the examples of preferred substituents that the alkyl group represented by $Rb_0$ may have, a hydroxyl group and a halogen atom are exemplified. As the halogen atom represented by $Rb_0$, a fluorine atom, a chlorine atom, a bromine atom, and an iodine atom are exemplified. $Rb_0$ preferably represents a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group of combination of any of these groups, and preferably a single bond or a linking group represented by -$Ab_1$-$CO_2$—. $Ab_1$ represents a straight chain or branched alkylene group, or a monocyclic or polycyclic cycloalkylene group, and preferably a methylene group, an ethylene group, a cyclohexylene group, an adamantylene group, or a norbornylene group.

V represents a group having a structure represented by any of formulae (LC1-1) to (LC1-16).

Repeating units having a lactone structure generally have optical isomers, and any optical isomer may be used. One kind of optical isomer may be used alone, or a plurality of optical isomers may be used as mixture. When one kind of optical isomer is mainly used, the optical purity (ee) of the optical isomer is preferably 90 or more, and more preferably 95 or more.

The content of repeating units having a lactone structure is preferably from 15 to 60 mol % based on all the repeating units in the polymer, more preferably from 20 to 50 mol %, and still more preferably from 30 to 50 mol %.

The specific examples of repeating units having a lactone structure are shown below, but the invention is not restricted to these compounds.

(In the formulae, Rx represents H, CH$_3$, CH$_2$OH or CF$_3$.)

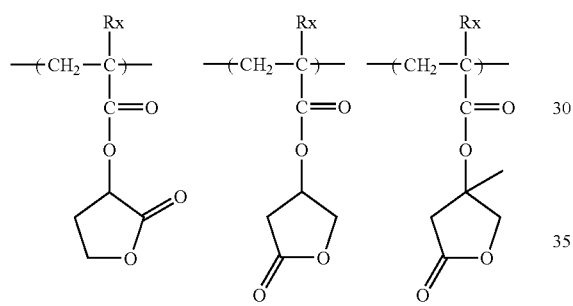

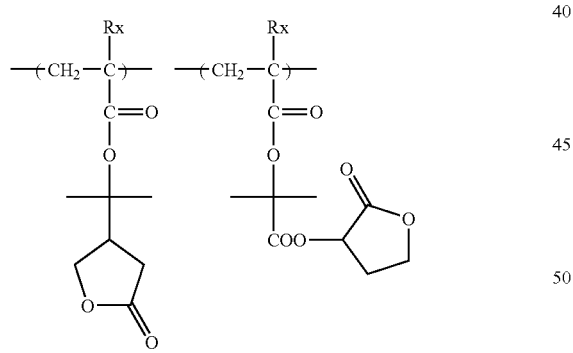

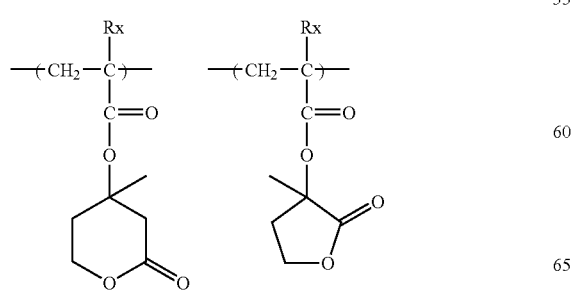

-continued

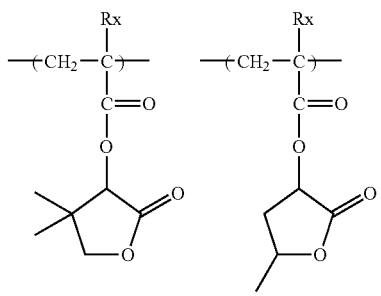

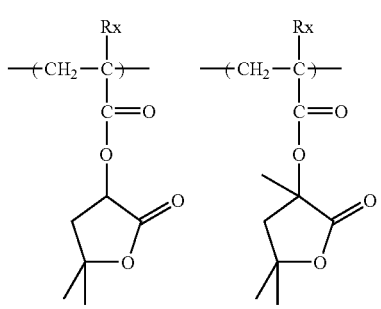

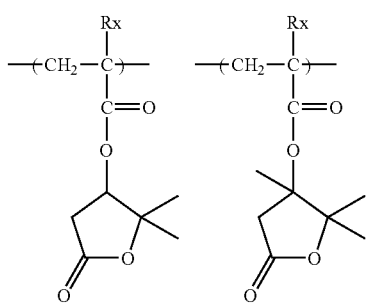

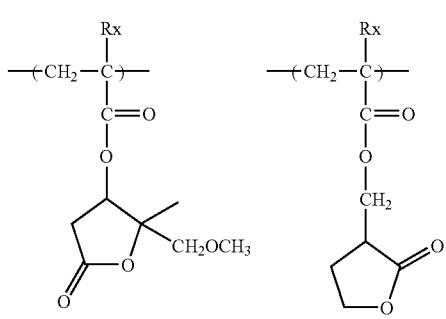

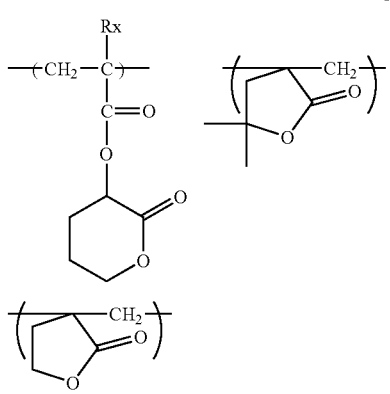

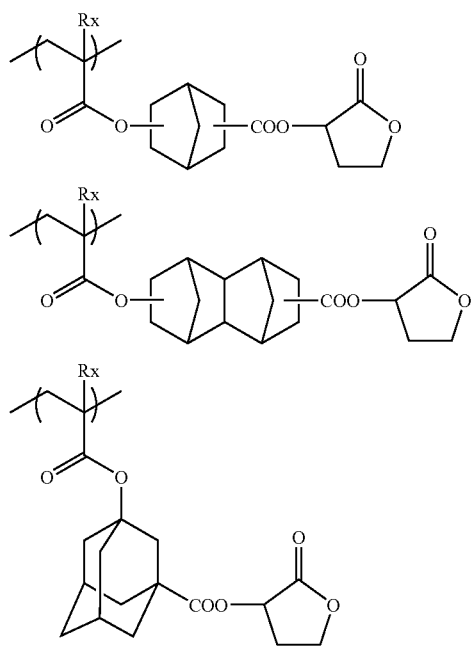
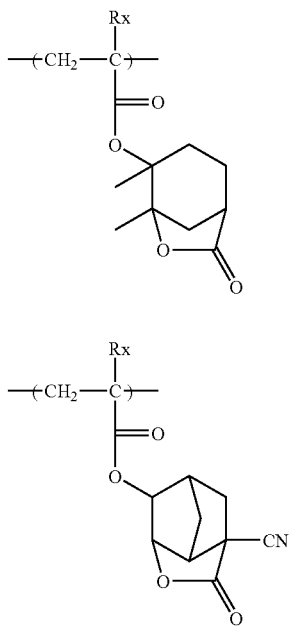
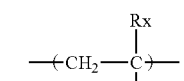
(In the formulae, Rx represents H, CH$_3$, CH$_2$OH or CF$_3$.)
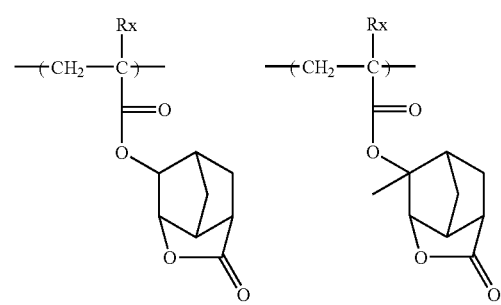
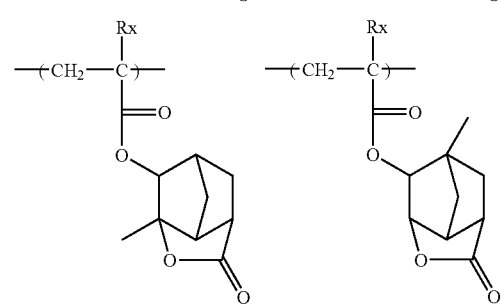
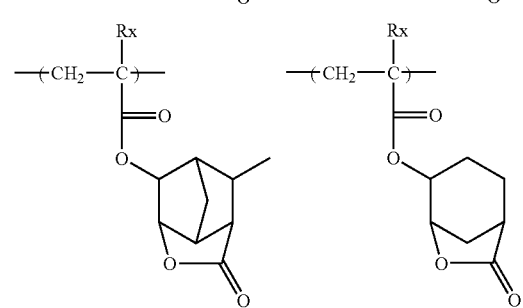
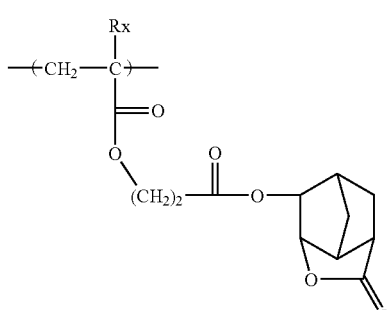
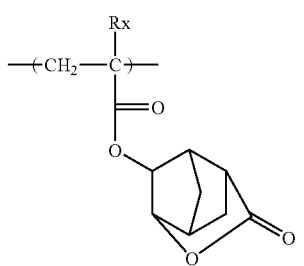

-continued
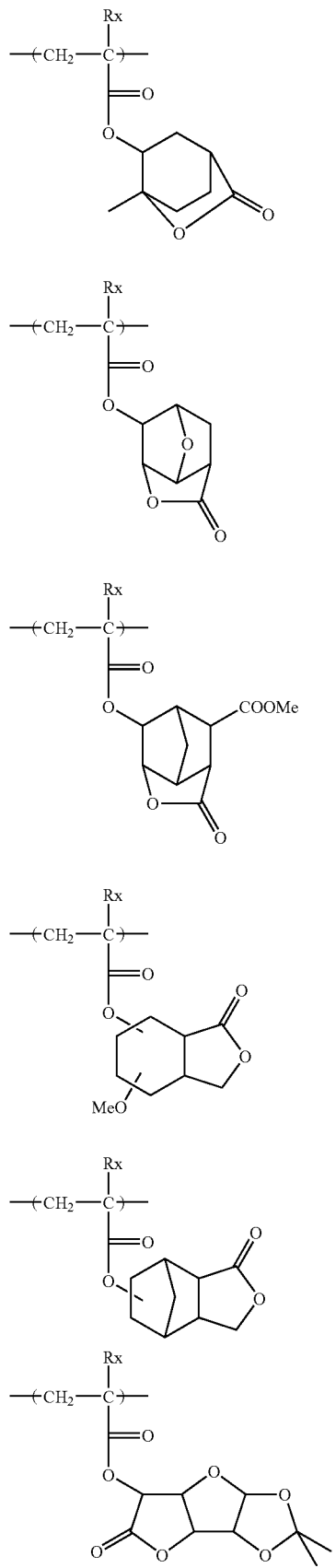
-continued
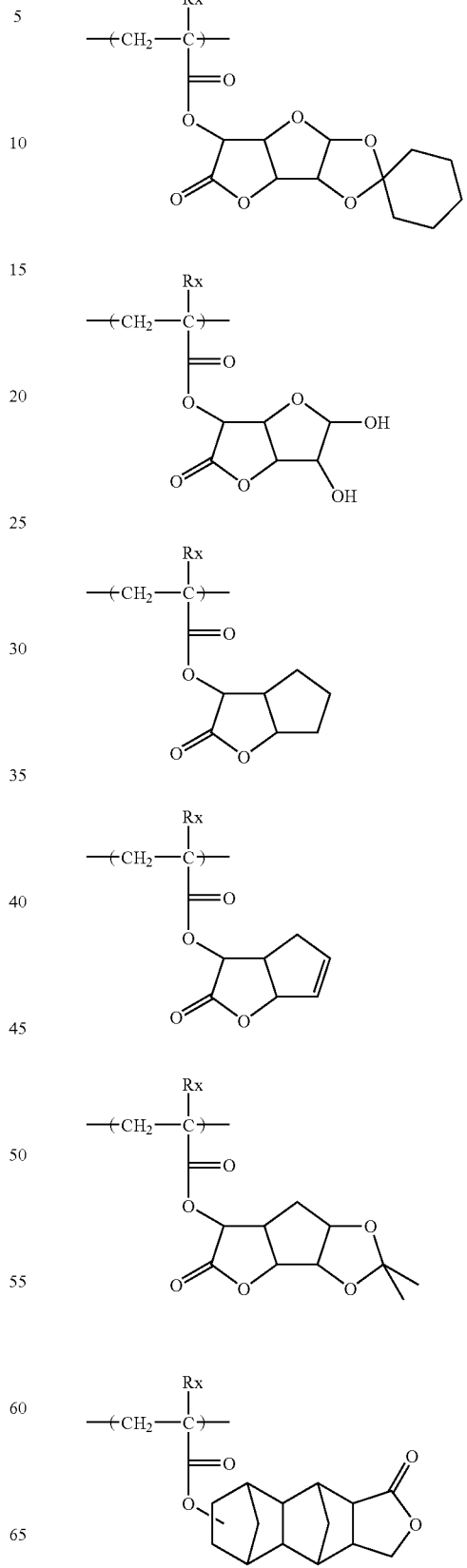

(In the formulae, Rx represents H, CH₃, CH₂OH or CF₃.)
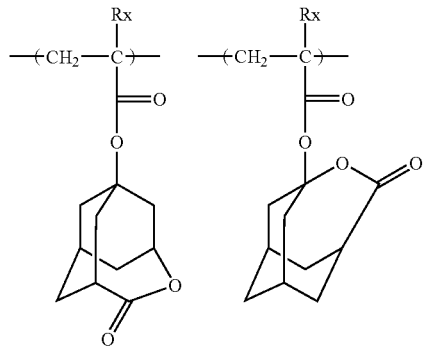
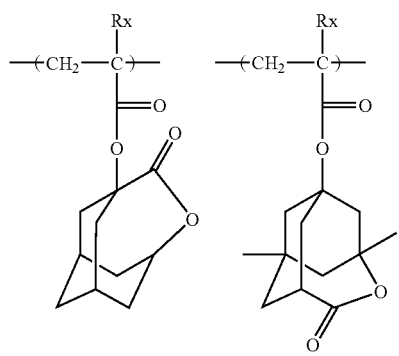
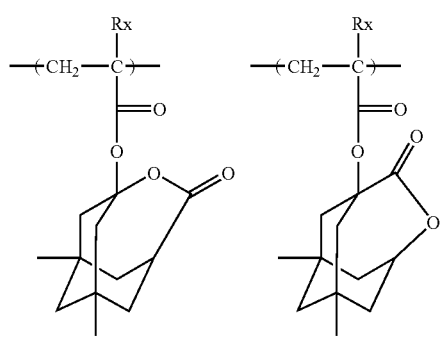
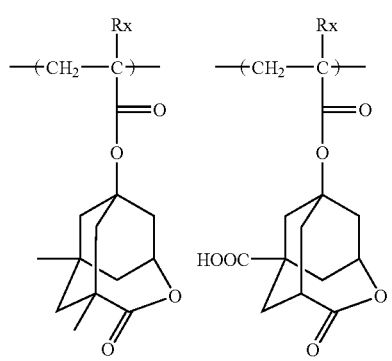
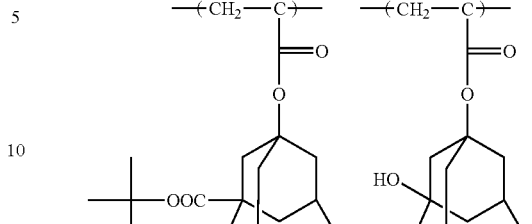
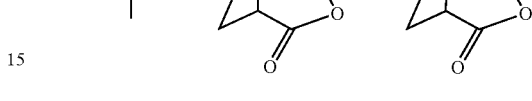
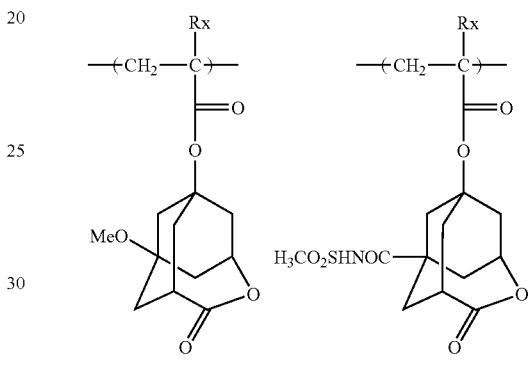
As repeating units having an especially preferred lactone structure, the following repeating units are exemplified. By the selection of an optimal lactone structure, pattern profile and pitch dependency are bettered.
(In the formulae, Rx represents H, CH₃, CH₂OH or CF₃.)
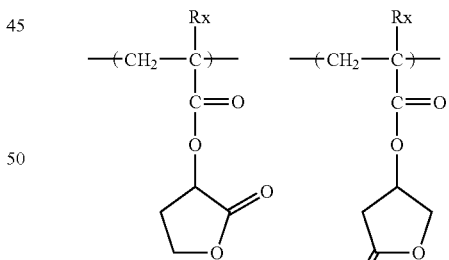
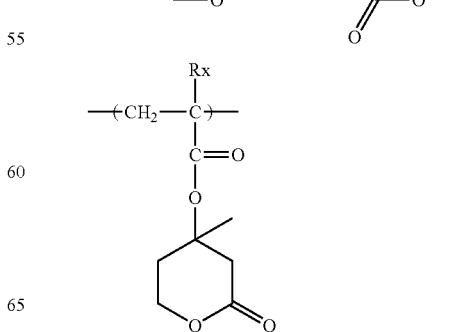

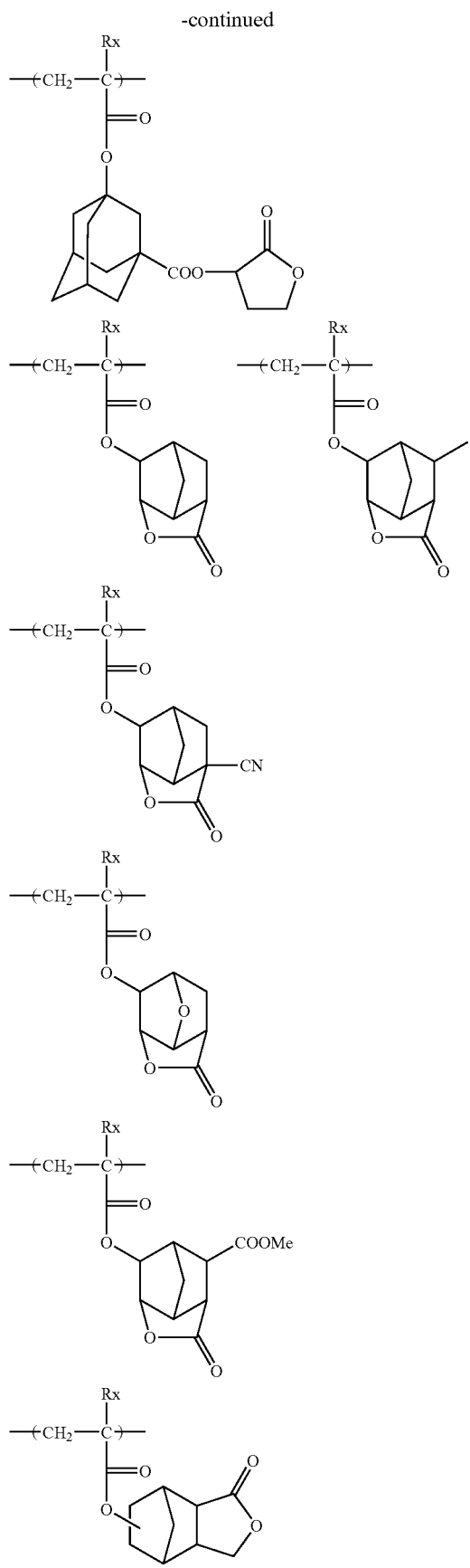

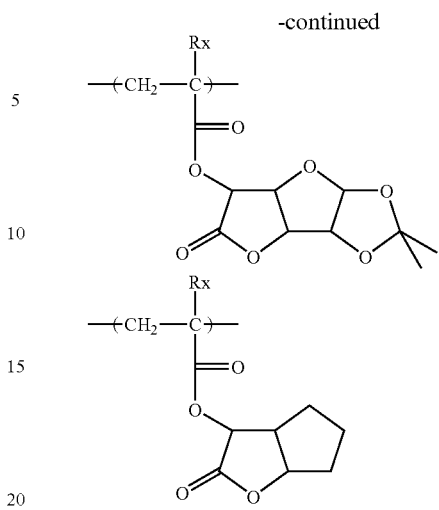

It is preferred for component (B) to have a repeating unit having a hydroxyl group or a cyano group, by which the adhesion to a substrate and the affinity with a developing solution are improved. A repeating unit having a hydroxyl group or a cyano group is preferably a repeating unit having an alicyclic hydrocarbon structure substituted with a hydroxyl group or a cyano group. As the alicyclic hydrocarbon structure in the alicyclic hydrocarbon structure substituted with a hydroxyl group or a cyano group, an adamantyl group, a diamantyl group, and a norbornane group are preferred. As preferred alicyclic hydrocarbon structures substituted with a hydroxyl group or a cyano group, partial structures represented by any of the following formula (VIIa) to (VIId) are exemplified.

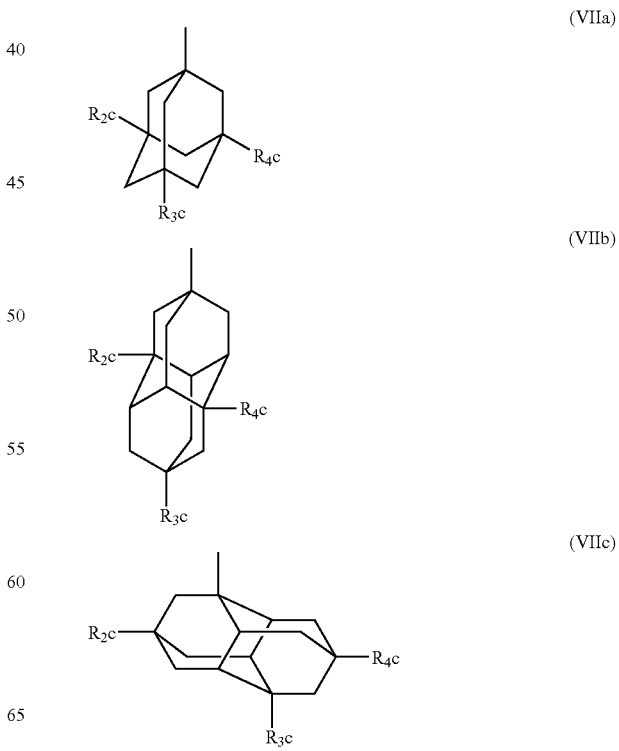

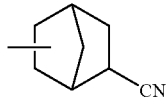

In formulae (VIIa) to (VIIc), $R_{2c}$, $R_{3c}$ and $R_{4c}$ each independently represents a hydrogen atom, a hydroxyl group or a cyano group, provided that at least one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group and the remainder represents a hydrogen atom, and more preferably in formula (VIIa), two of $R_{2c}$, $R_{3c}$ and $R_{4c}$ represent a hydroxyl group and the remainder represents a hydrogen atom.

As the repeating unit having the partial structures represented by any of formula (VIIa) to (VIId), repeating units represented by any of the following formulae (AIIa) to (AIId) can be exemplified.

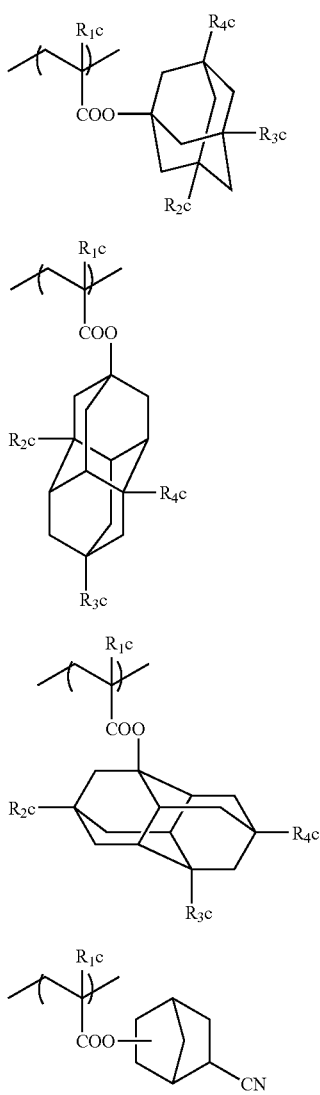

In formulae (AIIa) and (AIIb), $R_1c$ represents a hydrogen atom, a methyl group, a trifluoromethyl group, or a hydroxymethyl group.

$R_{2c}$, $R_{3c}$ and $R_{4c}$ have the same meanings as those of $R_{2c}$, $R_{3c}$ and $R_{4c}$ in formulae (VIIa) to (VIIc) respectively.

The content of the repeating unit having the alicyclic hydrocarbon structure substituted with a hydroxyl group or a cyano group is preferably from 5 to 40 mol % to all the repeating units in the polymer, more preferably from 5 to 30 mol %, and still more preferably from 10 to 25 mol %.

The specific examples of the repeating units having a hydroxyl group or a cyano group are shown below, but the invention is not restricted thereto.

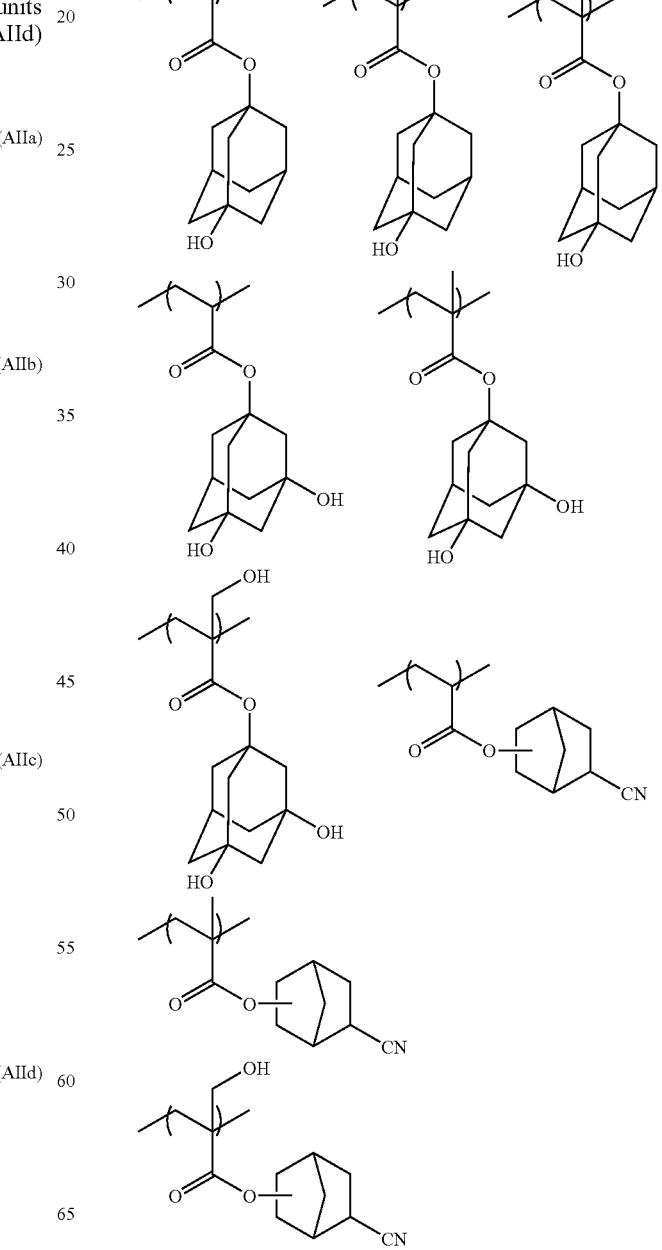

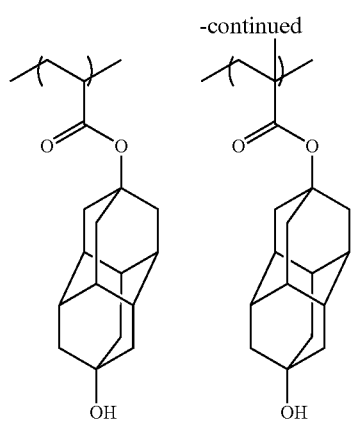

It is preferred for component (B) to have a repeating unit having an alkali-soluble group. As alkali-soluble groups, a carboxyl group, a sulfonamido group, a sulfonylimido group, a bisulfonylimido group, and an aliphatic alcohol substituted with an electron attractive group on the α-position (e.g., a hexafluoroisopropanol group) are exemplified, and it is more preferred to have a repeating unit having a carboxyl group. By containing a repeating unit having an alkali-soluble group, resolution in the use for contact hole is increased. As the repeating unit having an alkali-soluble group, a repeating unit in which an alkali-soluble group is directly bonded to the main chain of a resin such as a repeating unit by acrylic acid or methacrylic acid, a repeating unit in which an alkali-soluble group is bonded to the main chain of a resin via a linking group, and a repeating unit in which an alkali-soluble group is introduced to the terminals of a polymer chain by using a polymerization initiator having an alkali-soluble group and a chain transfer agent in polymerization are exemplified, and any of these are preferably used. The linking group may have a monocyclic or polycyclic hydrocarbon structure. Repeating units by acrylic acid and methacrylic acid are especially preferred.

The repeating unit having an alkali-soluble group is used preferably in a proportion of from 1 to 20 mol % to all the repeating units in the polymer, more preferably from 3 to 15 mol %, and still more preferably from 5 to 10 mol %.

The specific examples of the repeating units having an alkali-soluble group are shown below, but the invention is not restricted thereto.

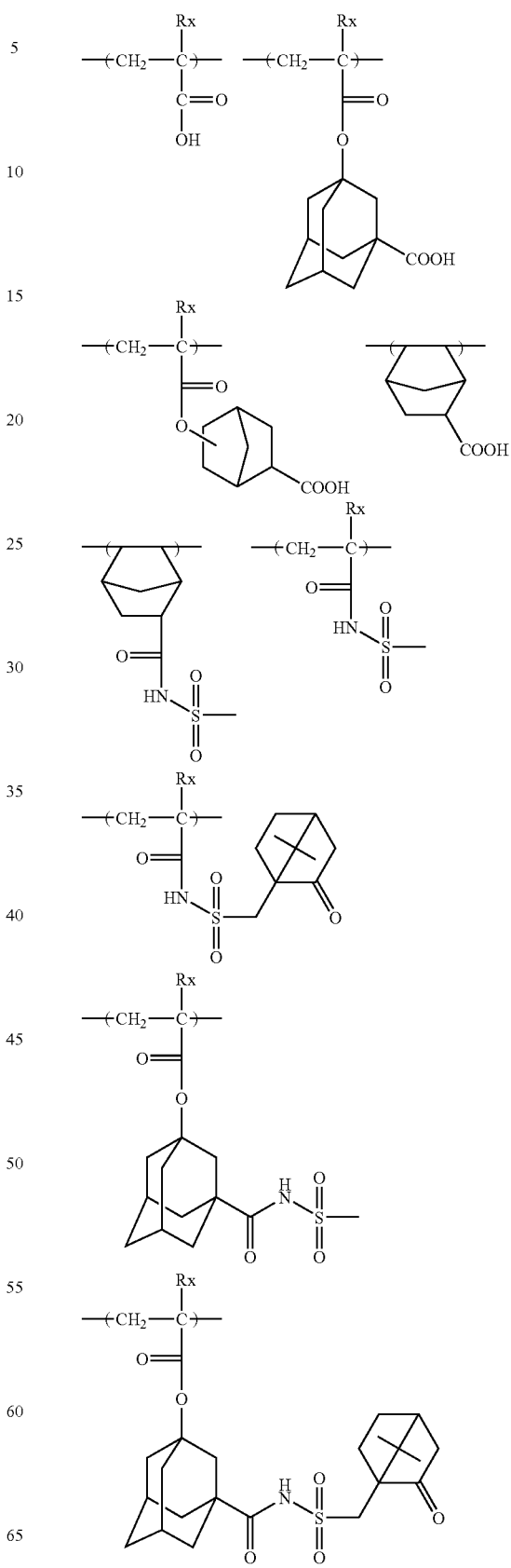

(In the formulae, Rx represents H, $CH_3$, $CF_3$ or $CH_2OH$.)

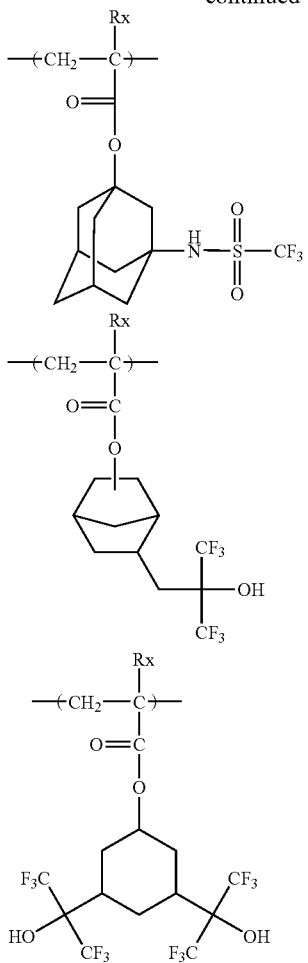

The repeating unit having at least a group selected from a lactone group, a hydroxyl group, a cyano group, and an alkali-soluble group is more preferably a repeating unit having at least two groups selected from a lactone group, a hydroxyl group, a cyano group, and an alkali-soluble group, and still more preferably a repeating unit having a cyano group and a lactone group.

Component (B) may further have contain a repeating unit having an alicyclic hydrocarbon structure and not showing acid decomposability, by which the elution of low molecular weight components from a resist film into an immersion liquid can be reduced at the time of immersion exposure. As such repeating units, for example, 1-adamantyl(meth)acrylate, diamantyl(meth)acrylate, tricyclodecanyl(meth)acrylate, and cyclohexyl(meth)acrylate are exemplified.

Component (B) can contain various repeating structural units besides the above repeating structural units for the purpose of the adjustments of dry etching resistance, aptitude for standard developing solutions, adhesion to a substrate, resist profile, and general requisite characteristics of the resist, e.g., resolution, heat resistance and sensitivity.

As these repeating structural units, the repeating structural units corresponding to the monomers shown below can be exemplified, but the invention is not restricted thereto.

By containing such repeating structural units, fine adjustment of performances required of component (B), in particular, the following performances becomes possible, that is, (1) Solubility in a coating solvent, (2) A film-forming property (a glass transition point), (3) An alkali developing property, (4) Decrease in layer thickness (hydrophobic-hydrophilic property, selection of an alkali-soluble group), (5) Adhesion of an unexposed part to a substrate, and (6) Dry etching resistance.

The examples of such monomers include compounds having one addition polymerizable unsaturated bond selected from acrylic acid esters, methacrylic acid esters, acrylamides, methacrylamides, allyl compounds, vinyl ethers, vinyl esters, etc.

In addition to these compounds, addition polymerizable unsaturated compounds copolymerizable with the monomers corresponding to the above various repeating structural units may be used for copolymerization.

In component (B), the molar ratio of the content of each repeating structural unit is arbitrarily set to adjust dry etching resistance and aptitude for standard developing solutions of a resist, adhesion to a substrate, and resist profile, further, general requisite characteristics of a resist, e.g., resolution, heat resistance and sensitivity.

When the positive resist composition of the invention is for ArF exposure, it is preferred that component (B) does not have an aromatic group from the aspect of the transparency to ArF rays.

Component (B) is preferably such that all the repeating units consist of (meth)acrylate repeating units. In this case, any of the following can be used, that is, repeating units consisting of methacrylate repeating units alone, repeating units consisting of acrylate repeating units alone, and repeating units consisting of methacrylate repeating units and acrylate repeating units, but it is preferred that acrylate repeating units account for 50 mol % or less of all the repeating units. Component (B) is more preferably a copolymer comprising from 20 to 50 mol % of (meth)acrylate repeating units having an acid-decomposable group represented by formula (I), from 20 to 50 mol % of (meth)acrylate repeating units having a lactone structure, from 5 to 30 mol % of (meth)acrylate repeating units having an alicyclic hydrocarbon structure substituted with a hydroxyl group or a cyano group, and further containing from 0 to 20 mol % of other (meth)acrylate repeating units.

In component (B), a resin having a repeating unit represented by the following formula (I), and a repeating unit having at least a group selected from a lactone group, a hydroxyl group, a cyano group, and an alkali-soluble group is a novel compound.

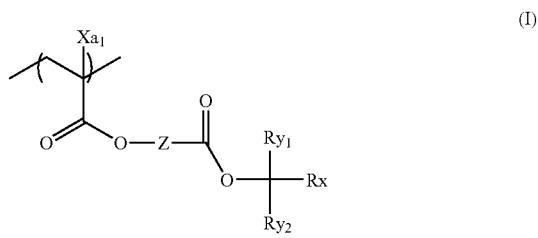

In formula (I), $Xa_1$ represents a hydrogen atom, an alkyl group, a cyano group, or a halogen atom.

$Ry_1$ and $Ry_2$ each independently represents an alkyl group or a cycloalkyl group.

Rx represents an alkyl group having 2 or more carbon atoms, or a cycloalkyl group.

Z represents an alkylene group.

In component (B), a resin having a repeating unit represented by the following formula (I-a) is a novel compound.

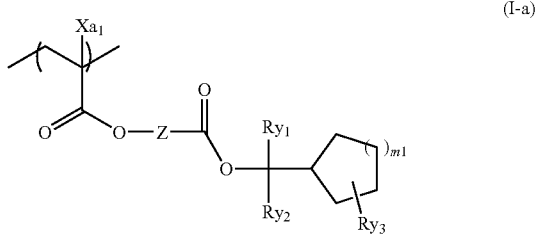

In formula (I-a), $Xa_1$ represents a hydrogen atom, an alkyl group, a cyano group, or a halogen atom.

$Ry_1$ and $Ry_2$ each independently represents an alkyl group or a cycloalkyl group.

$Ry_3$ represents a hydrogen atom or an alkyl group.

Z represents an alkylene group.

m1 represents 1 or 2.

In repeating units (I) and (I-a), it is preferred that at least one of $Ry_1$ and $Ry_2$ represents an alkyl group having 2 or more carbon atoms.

A polymerizable compound represented by the following formula (I') corresponding to repeating unit (I) is a novel compound.

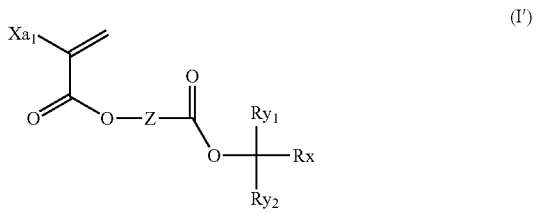

In formula (I'), $Xa_1$ represents a hydrogen atom, an alkyl group, a cyano group, or a halogen atom.

$Ry_1$ and $Ry_2$ each independently represents an alkyl group or a cycloalkyl group.

Rx represents an alkyl group having 2 or more carbon atoms, or a cycloalkyl group.

Z represents an alkylene group.

A polymerizable compound represented by the following formula (I-a1) corresponding to repeating unit (I-a) is a novel compound.

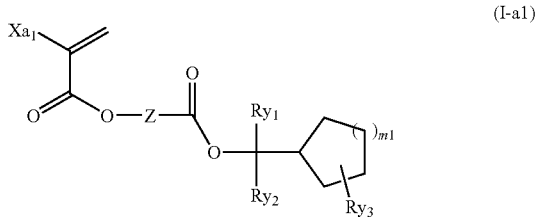

In formula (I-a1), $Xa_1$ represents a hydrogen atom, an alkyl group, a cyano group, or a halogen atom.

$Ry_1$ and $Ry_2$ each independently represents an alkyl group or a cycloalkyl group.

$Ry_3$ represents a hydrogen atom or an alkyl group.

Z represents an alkylene group.

m1 represents 1 or 2.

In formulae (I') and (I-a1), it is preferred that at least one of $Ry_1$ and $Ry_2$ represents an alkyl group having 2 or more carbon atoms.

Component (B) can be synthesized according to ordinary methods (for example, radical polymerization). For example, as ordinary synthesizing methods, a batch polymerization method of dissolving a monomer seed and an initiator in a solvent and heating the solution to perform polymerization, and a dropping polymerization method of adding a solution of a monomer seed and an initiator to a heated solvent over 1 to 10 hours by dropping are exemplified, and the dropping polymerization method is preferred. As reaction solvents, ethers, e.g., tetrahydrofuran, 1,4-dioxane, diisopropyl ether, etc., ketones, e.g., methyl ethyl ketone, methyl isobutyl ketone, etc., ester solvents, e.g., ethyl acetate, amide solvents, e.g., dimethylformamide and dimethyacetamide, and the later-described solvents capable of dissolving the composition of the invention, e.g., propylene glycol monomethyl ether acetate, propylene glycol monomethyl ether, and cyclohexanone are exemplified. It is more preferred to use the same solvent in the polymerization as the solvent used in the positive resist composition of the invention, by which the generation of particles during preservation can be restrained.

It is preferred to perform the polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group, or a carboxyl group are preferred. As preferred initiators, azobisisobutyronitrile, azobis-dimethylvaleronitrile, dimethyl-2,2'-azobis(2-methyl-propionate), etc., are exemplified. Initiators are added additionally or dividedly, as desired, and the reaction product is put into a solvent after termination of the reaction, and an objective polymer is recovered as powder or in a solid state. The reaction concentration is from 5 to 50 mass %, and preferably from 10 to 30 mass %. The reaction temperature is generally from 10 to 150° C., preferably from 30 to 120° C., and more preferably from 60 to 100° C.

The weight average molecular weight of component (B) is preferably from 1,000 to 200,000 as the polystyrene equivalent by the GPC method, more preferably from 3,000 to 20,000, and most preferably from 5,000 to 15,000. By making the weight average molecular weight from 1,000 to 200,000, deteriorations of heat resistance and dry etching resistance can be prevented, and degradations of developing property and film-forming property due to increase in viscosity can be prevented.

The degree of dispersion (molecular weight distribution) of component (B) is generally in the range of from 1 to 5, preferably from 1 to 3, and more preferably from 1 to 2. The smaller the molecular weight distribution, the more excellent is the resin in resolution and the resist form, and the more smooth is the sidewall of the resist pattern, and the more excellent is the roughness property.

When component (B) is used in a positive photosensitive composition irradiated with KrF excimer laser rays, electron beams, X-rays, or high energy rays of wavelengths of 50 nm or less (EUV and the like), it is preferred for component (B) to have the repeating unit represented by formula (I) and further a repeating unit having a hydroxystyrene structure. As the repeating unit having a hydroxystyrene structure, at least one of o-, m-, p-hydroxystyrene and hydroxystyrene protected with an acid-decomposable group is exemplified. As the hydroxy-styrene repeating units protected with an acid-decomposable group, 1-alkoxyethoxystyrene and t-butylcarbonyloxystyrene are preferred. In addition to the repeating unit represented by formula (I) and the repeating unit having a hydroxystyrene structure, component (B) may further have the repeating unit represented by formula (II).

The specific examples of the resins having the repeating unit having a hydroxystyrene structure and the repeating unit represented by formula (I) for use in the invention are shown below, but the invention is not restricted thereto. In the formulae, $Xa_1$ represents a hydrogen atom, an alkyl group, a cyano group, or a halogen atom.

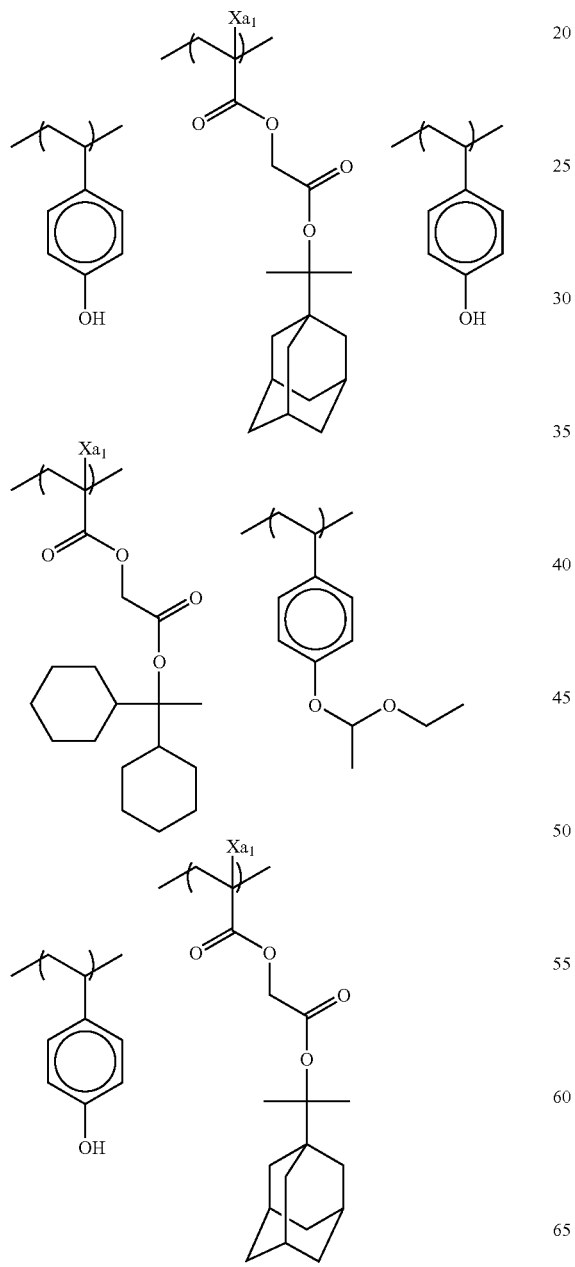

-continued

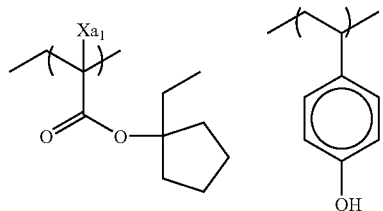

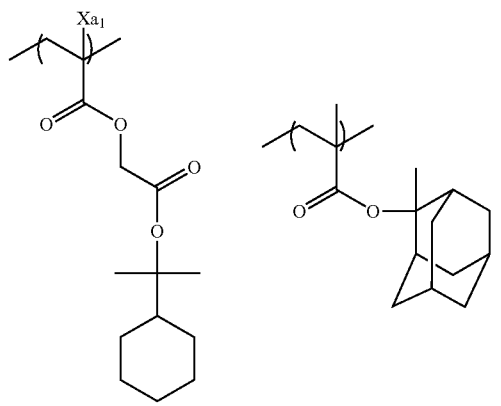

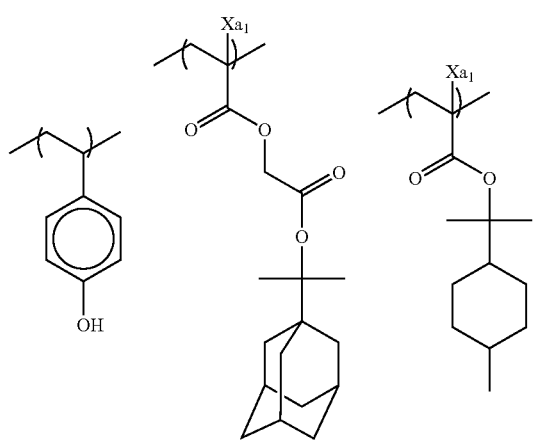

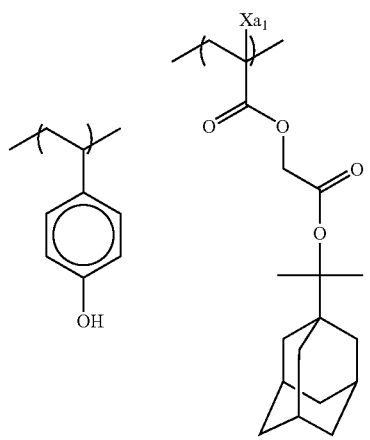

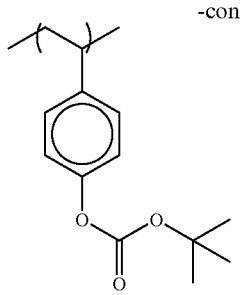

In the positive photosensitive composition of the invention, the blending amount of component (B) in the composition as a whole is preferably from 50 to 99.9 mass % based on all the solids content, and more preferably from 60 to 99.0 mass %.

Further, in the invention, component (B) may be used by one kind alone, or two or more components (B) may be used in combination.

Dissolution-Controlling Compounds Having a Molecular Weight of 3,000 or Less and at Least One Group Selected from an Alkali-Soluble Group, a Hydrophilic Group and an Acid-Decomposable Group:

A dissolution-controlling compound having a molecular weight of 3,000 or less and at least one group selected from an alkali-soluble group, a hydrophilic group and an acid-decomposable group (hereinafter also referred to as "a dissolution-controlling compound") may be added to the positive photosensitive composition of the invention.

As the dissolution-controlling compounds, compounds having an alkali-soluble group such as a carboxyl group, a sulfonylimido group, or a hydroxyl group substituted with a fluoroalkyl group on the α-position, compounds having a hydrophilic group such as a hydroxyl group, a lactone group, a cyano group, an amido group, a pyrrolidone group, or a sulfonamido group, and compounds having an acid-decomposable group are preferably used. As the acid-decomposable group, a group obtained by protecting a carboxyl group or a hydroxyl group with an acid-decomposable protecting group is preferably used. So as not to reduce transmission of 220 nm or less, it is preferred to use a compound not having an aromatic ring as the dissolution-controlling compound, or to use a compound having an aromatic ring in an addition amount of 20 wt % or less based on the solids content of the composition.

As preferred dissolution-controlling compounds, carboxylic acid compounds having an alicyclic hydrocarbon structure such as adamantane (di)carboxylic acid, norbornane-carboxylic acid, or cholic acid, compounds of protecting the carboxylic acids thereof with an acid-decomposable protecting group, saccharides such as polyol, and compounds of protecting the hydroxyl groups thereof with an acid-decomposable protecting group are preferably used.

The molecular weight of the dissolution-controlling compound is 3,000 or less, preferably from 300 to 3,000, and more preferably from 500 to 2,500.

The addition amount of the dissolution-controlling compound is preferably from 3 to 40 mass % based on the solids content of the positive photosensitive composition, and more preferably from 5 to 20 mass %.

The specific examples of the dissolution-controlling compounds are shown below, but the invention is not restricted to these compounds.

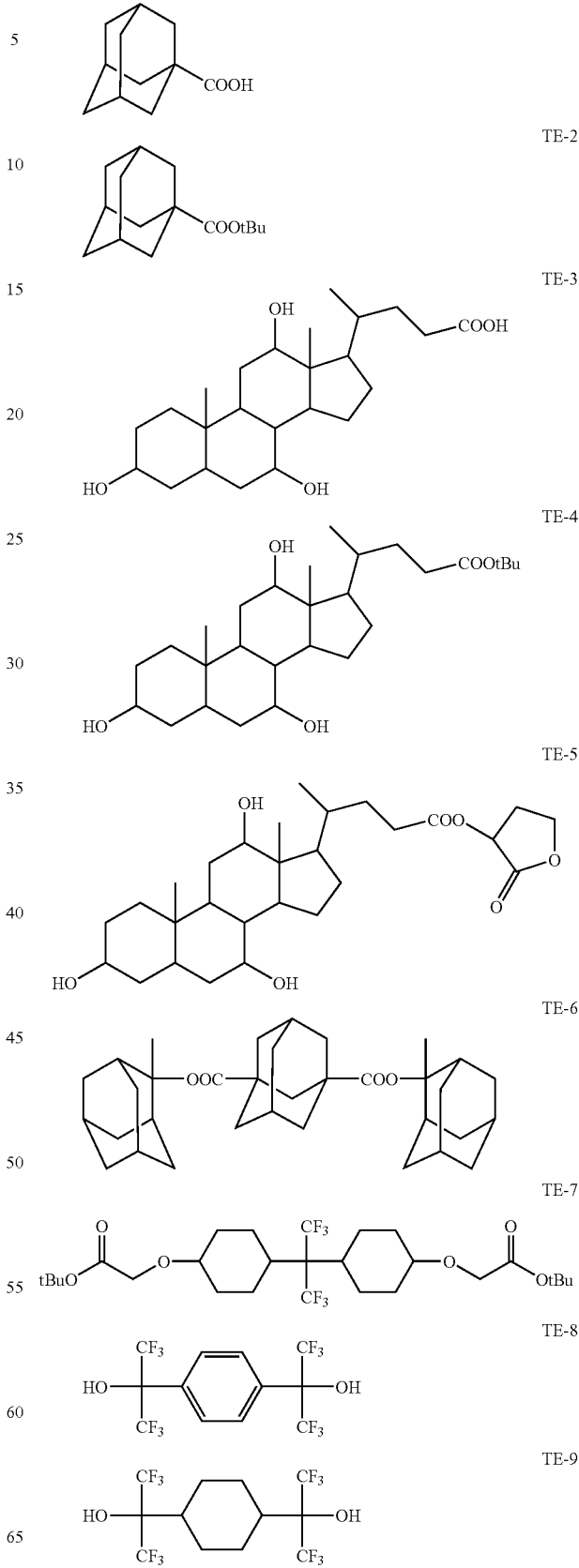

-continued

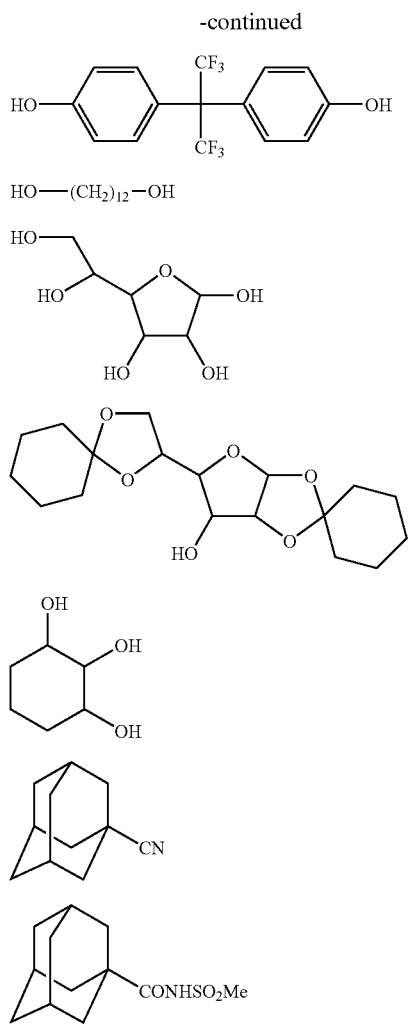

TE-10
TE-11
TE-12
TE-13
TE-14
TE-15
TE-16

-continued

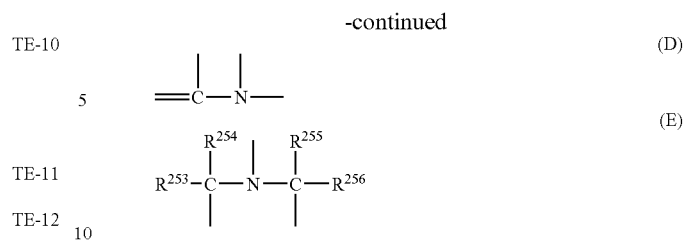

In formula (A), $R^{250}$, $R^{251}$ and $R^{252}$ each independently represents a hydrogen atom, an alkyl group having from 1 to 20 carbon atoms, a cycloalkyl group having from 3 to 20 carbon atoms, or an aryl group having from 6 to 20 carbon atoms, and $R^{250}$ and $R^{251}$ may be bonded to each other to form a ring. These groups may have a substituent, and as the alkyl group and cycloalkyl group each having a substituent, an aminoalkyl group having from 1 to 20 carbon atoms, an aminocycloalkyl group having from 3 to 20 carbon atoms, a hydroxyalkyl group having from 1 to 20 carbon atoms, and a hydroxycycloalkyl group having from 3 to 20 carbon atoms are preferred.

These groups may contain an oxygen atom, a sulfur atom or a nitrogen atom in the alkyl chain.

In formula (E), $R^{253}$, $R^{254}$, $R^{255}$ and $R^{256}$ each independently represents an alkyl group having from 1 to 6 carbon atoms, or a cycloalkyl group having from 3 to 6 carbon atoms.

As preferred examples of the basic compounds, guanidine, aminopyrrolidine, pyrazole, pyrazoline, piperazine, aminomorpholine, aminoalkylmorpholine, and piperidine can be exemplified, and these compounds may each have a substituent. As further preferred compounds, compounds having an imidazole structure, a diazabicyclo structure, an onium hydroxide structure, an onium carboxylate structure, a trialkylamine structure, an aniline structure, or a pyridine structure, alkylamine derivatives having at least one of a hydroxyl group and an ether bond, aniline derivatives having at least one of a hydroxyl group and an ether bond, etc., can be exemplified.

As the compounds having an imidazole structure, imidazole, 2,4,5-triphenylimidazole and benzimidazole can be exemplified. As the compounds having a diazabicyclo structure, 1,4-diazabicyclo[2,2,2]octane, 1,5-diazabicyclo[4,3,0]nona-5-ene, and 1,8-diazabicyclo[5,4,0]undeca-7-ene can be exemplified. As the compounds having an onium hydroxide structure, triarylsulfonium hydroxide, phenacylsulfonium hydroxide, sulfonium hydroxide having a 2-oxoalkyl group, specifically triphenylsulfonium hydroxide, tris(t-butyl-phenyl)sulfonium hydroxide, bis(t-butylphenyl)iodonium hydroxide, phenacylthiophenium hydroxide, and 2-oxopropyl-thiophenium hydroxide can be exemplified. The compounds having an onium carboxylate structure are compounds having an onium hydroxide structure in which the anionic part is carboxylated, e.g., acetate, adamantane-1-carboxylate and perfluoroalkyl carboxylate are exemplified. As the compounds having a trialkylamine structure, tri(n-butyl)amine and tri(n-octyl)amine are exemplified. As the aniline compounds, 2,6-diisopropylaniline and N,N-dimethylaniline are exemplified. As the alkylamine derivatives having at least one of a hydroxyl group and an ether bond, ethanolamine, diethanolamine, triethanolamine, and tris(methoxyethoxyethyl)amine are exemplified. As the aniline derivatives having at least one of a hydroxyl group and an ether bond, N,N-bis(hydroxyethyl)aniline is exemplified.

These basic compounds are used alone or in combination of two or more. The basic compounds is generally used in an Basic Compounds:

For reducing the fluctuation of performances due to aging from exposure to heating, or for restraining the diffusion of an acid generated by exposure into the film, it is preferred for the positive photosensitive composition of the invention to contain a basic compound.

As the basic compounds, nitrogen-containing basic compounds and onium salt compounds can be exemplified.

As preferred structures of the nitrogen-containing basic compounds, compounds having a partial structure represented be any of the following formulae (A) to (E) can be exemplified.

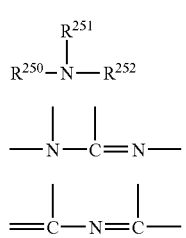

(A)
(B)
(C)

amount of from 0.001 to 10 mass % based on the solids content of the positive photosensitive composition, and preferably from 0.01 to 5 mass %. For obtaining a sufficient addition effect, the addition amount is preferably 0.001 mass % or more, and in view of sensitivity and the developing property of a non-exposed area, the amount is preferably 10 mass % or less.

Fluorine and/or Silicon Surfactants:

It is preferred for the positive photosensitive composition in the invention to further contain either one, or two or more, of fluorine and/or silicon surfactants (a fluorine surfactant, a silicon surfactant, a surfactant containing both a fluorine atom and a silicon atom).

By containing fluorine and/or silicon surfactants, it becomes possible for the positive photosensitive composition of the invention to provide a resist pattern excellent in sensitivity and resolution, and low in defects in adhesion and development in using an exposure light source of 250 nm or lower, in particular, 220 nm or lower.

As these fluorine and/or silicon surfactants, the surfactants disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451 can be exemplified. The commercially available surfactants shown below can also be used as they are.

As the commercially available fluorine surfactants and silicon surfactants usable in the invention, e.g., Eftop EF301 and EF303 (manufactured by Shin-Akita Kasei Co., Ltd.), Fluorad FC 430 and 431 (manufactured by Sumitomo 3M Limited), Megafac F171, F173, F176, F189, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. The fluoro-aliphatic compounds can be synthesized by the method disclosed in JP-A-2002-90991.

As the polymers having fluoro-aliphatic groups, copolymers of monomers having fluoro-aliphatic groups and at least one of (poly(oxyalkylene)) acrylate and (poly(oxy-alkylene)) methacrylate are preferred, and they may be distributed at random or block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxy-alkylene) acrylate (or methacrylate) may be not only bipolymers but also terpolymers or higher polymers obtained by copolymerization of monomers having different two or more kinds of fluoro-aliphatic groups and different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly-(oxypropylene)) acrylate (or methacrylate), copolymers of acrylate (or methacrylate) having a $C_8F_{17}$ group and (poly-(oxyalkylene)) acrylate (or methacrylate), and copolymers of acrylate (or methacrylate) having a $C_8F_{17}$ group, (poly(oxy-ethylene)) acrylate (or methacrylate), and poly(oxypropylene) acrylate (or methacrylate) are exemplified.

Fluorine and/or silicon surfactants are used in an amount of preferably from 0.0001 to 2 mass % to all the amount of the photosensitive composition (excluding solvents), and more preferably from 0.001 to 1 mass %.

Solvents:

For using the positive photosensitive composition of the invention, the above components are dissolved in a prescribed solvent.

As the solvents usable in the invention, organic solvents such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, tetrahydrofuran, etc., are exemplified.

In the invention, solvents may be used alone or as mixture, but it is preferred to use mixed solvents containing two or more kinds of solvents having different functional groups. By the use of such a mixed solvent, not only the solubility of materials is heightened and the generation of particles by aging can be restrained, but also a good pattern profile can be obtained. As the preferred functional groups for solvents, an ester group, a lactone group, a hydroxyl group, a ketone group, and a carbonate group are exemplified. As the mixed solvents having different functional groups, the following mixed solvents (S1) to (S5) are preferred.

(S1) Mixed solvent mixed of a solvent having a hydroxyl group and a solvent not having a hydroxyl group (S2) Mixed solvent mixed of a solvent having an ester structure and a solvent having a ketone structure (S3) Mixed solvent mixed of a solvent having an ester structure and a solvent having a lactone structure (S4) Mixed solvent mixed of a solvent having an ester structure, a solvent having a lactone structure, and a solvent having a hydroxyl group (S5) Mixed solvent mixed of a solvent having an ester structure, a solvent having a carbonate structure, and a solvent having a hydroxyl group By the use of these mixed solvents, the generation of particles during preservation of a resist solution can be reduced and the generation of coating defects can be restrained.

As the solvents having a hydroxyl group, e.g., ethylene glycol, ethylene glycol monomethyl ether, ethylene glycol monoethyl ether, propylene glycol, propylene glycol monomethyl ether, propylene glycol monoethyl ether, ethyl lactate, etc., are exemplified, and of these solvents, propylene glycol monomethyl ether and ethyl lactate are preferred.

As the solvents not having a hydroxyl group, e.g., propylene glycol monomethyl ether acetate, ethylethoxy-propionate, 2-heptanone, γ-butyrolactone, cyclohexanone, butyl acetate, N-methylpyrrolidone, N,N-dimethylacetamide, dimethyl sulfoxide, etc., can be exemplified, and of these solvents, propylene glycol monomethyl ether acetate, ethylethoxypropionate, 2-heptanone, γ-butyrolactone, cyclohexanone, and butyl acetate are preferred, and propylene glycol monomethyl ether acetate, ethylethoxypropionate, 2-heptanone, and cyclohexanone are especially preferred.

As the solvents having a ketone structure, cyclohexanone, 2-heptanone, etc., are exemplified, and cyclohexanone is preferred.

As the solvents having an ester structure, propylene glycol monomethyl ether acetate, ethylethoxypropionate, butyl acetate, etc., are exemplified, and propylene glycol monomethyl ether acetate is preferred.

As the solvent having a lactone structure, γ-butyrolactone is exemplified.

As the solvents having a carbonate structure, propylene carbonate and ethylene carbonate are exemplified, and propylene carbonate is preferred.

The mixing ratio (by mass) of the solvent having a hydroxyl group and the solvent not having a hydroxyl group is from 1/99 to 99/1, preferably from 10/90 to 90/10, and more preferably from 20/80 to 60/40. Mixed solvents containing in a proportion of 50 mass % or more of the solvents not having a hydroxyl group are especially preferred for capable of obtaining coating uniformity.

The mixing ratio (by mass) of the solvent having an ester structure and the solvent having a ketone structure is from 1/99 to 99/1, preferably from 10/90 to 90/10, and more preferably from 40/60 to 80/20. Mixed solvents containing in a proportion of 50 mass % or more of the solvents having an ester structure are especially preferred for capable of obtaining coating uniformity.

The mixing ratio (by mass) of the solvent having an ester structure and the solvent having a lactone structure is from 70/30 to 99/1, preferably from 80/20 to 99/1, and more preferably from 90/10 to 99/1. Mixed solvents containing in a proportion of 70 mass % or more of the solvents having an ester structure are especially preferred in the light of aging stability.

When the solvent having an ester structure, the solvent having a lactone structure and the solvent having a hydroxyl group are mixed, it is preferred to mix in a proportion of from 30 to 80 mass % of the solvent having an ester structure, from 1 to 20 mass % of the solvent having a lactone structure, and from 10 to 60 mass % of the solvent having a hydroxyl group.

When the solvent having an ester structure, the solvent having a carbonate structure and the solvent having a hydroxyl group are mixed, it is preferred to mix in a proportion of from 30 to 80 mass % of the solvent having an ester structure, from 1 to 20 mass % of the solvent having a carbonate structure, and from 10 to 60 mass % of the solvent having a hydroxyl group.

As preferred embodiments, solvents containing alkylene glycol monoalkyl ether carboxylate (preferably propylene glycol monomethyl ether acetate) are preferred, mixed solvents of alkylene glycol monoalkyl ether carboxylate and other solvents are more preferred, and it is still more preferred that other solvent is at least a solvent selected from the solvents having at least a functional group selected from a hydroxyl group, a ketone group, a lactone group, an ester group, an ether group, and a carbonate group. Especially preferred solvents are mixed solvents of at least one solvent selected from among ethyl lactate, γ-butyrolactone, propylene glycol monomethyl ether, butyl acetate, and cyclohexanone, with propylene glycol monomethyl ether acetate.

By selecting optimal solvents, the performance of development defects can be improved.

Other Additives:

If necessary, the positive photosensitive composition of the invention can further contain dyes, plasticizers, surfactants other than the above-described fluorine and/or silicon surfactants, photosensitizers, and compounds for accelerating solubility in a developing solution.

Compounds for accelerating solubility in a developing solution usable in the invention are low molecular weight compounds having two or more phenolic OH groups or one or more carboxyl groups and a molecular weight of 1,000 or less. When the solubility accelerating compounds have carboxyl groups, alicyclic or aliphatic compounds are preferred.

A preferred addition amount of these dissolution accelerating compounds is preferably in a proportion of from 2 to 50 mass % based on the acid-decomposable resin, and more preferably from 5 to 30 mass %. The amount is preferably 50 mass % or less in the point of restraint of development residue and prevention of pattern deformation at development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219,294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the invention is by no means restricted to these compounds.

In the invention, surfactants other than fluorine and/or silicon surfactants can also be used. Specifically, nonionic surfactants, such as polyoxyethylene alkyl ethers, polyoxyethylene alkylallyl ethers, polyoxyethylene-polyoxypropylene block copolymers, sorbitan aliphatic esters, and polyoxyethylene sorbitan aliphatic esters can be exemplified.

These surfactants can be used by one kind alone, or some kinds of surfactants can be used in combination.

Pattern-Forming Method:

The positive photosensitive composition in the invention is used by dissolving the above components in a prescribed solvent, preferably dissolving in the mixed solvent as described above, filtering, and coating the solution on a prescribed support as follows. The filter for use in filtration is preferably made of polytetrafluoroethylene, polyethylene or nylon having a pore diameter of 0.1 μm or less, more preferably 0.05 μm or less, and more preferably 0.03 μm or less.

For example, the positive resist composition is coated on a substrate such as the one used in the manufacture of precision integrated circuit devices (e.g., silicon/silicon dioxide coating) by an appropriate coating method with a spinner or a coater and dried to form a photosensitive film.

The photosensitive film is irradiated with actinic ray or radiation through a prescribed mask, preferably subjected to baking (heating), and then development and rinsing. Thus, a good pattern can be obtained.

At the time of irradiation with actinic ray or radiation, exposure (immersion exposure) may be performed by filling a liquid (an immersion medium) having higher refractive index than that of air between a resist film and a lens, by which resolution can be raised. As the immersion medium, any liquids can be used so long as they are liquids higher in refractive index than air, but pure water is preferred.

An immersion liquid (immersion medium) for use in immersion exposure is described below.

An immersion liquid having a temperature coefficient of refractive index as small as possible is preferred so as to be transparent to the exposure wavelength and to hold the distortion of optical image reflected on the resist to the minimum. In particular, when the exposure light source is an ArF excimer laser (wavelength: 193 nm), it is preferred to use water as the immersion liquid for easiness of availability and easy handling property, in addition to the above points.

Further, in view of the improvement of refractive index, a medium having a refractive index of 1.5 or more can also be used, e.g., an aqueous solution and an organic solvent can be used as the medium.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As the additive, aliphatic alcohols having a refractive index almost equal to the refractive index of water are preferred, specifically methyl alcohol, ethyl alcohol and isopropyl alcohol are exemplified. By the addition of an alcohol having a refractive index almost equal to that of water, even if the alcohol component in water is evaporated and the concentration of the content is changed, the fluctuation of the refractive index of the liquid as a whole can be made extremely small. On the other hand, when substances opaque to the light of 193 nm or impurities largely different from water in a refractive index are mixed, these substances bring about the distortion of the optical image reflected on the resist. Accordingly, the water used is preferably distilled water. Further, pure water filtered through an ion exchange filter may be used.

The electric resistance of water is preferably 18.3 MΩ·cm or higher, and TOC (organic substance concentration) is preferably 20 ppb or lower. Further, it is preferred that water has been subjected to deaeration treatment.

It is possible to heighten lithographic performance by increasing the refractive index of an immersion liquid. From such a point of view, additives capable of heightening a refractive index may be added to water, or heavy water ($D_2O$) may be used in place of water.

In the case of exposing the resist film comprising the resist composition of the invention through an immersion medium, a hydrophobic resin (HR) may further be added to the composition as needed. The hydrophobic resin (HR) added is localized over a resist film surface layer. Thus, when the immersion medium is water, a backward contact angle of the resist film surface is improved so that the followability of immersion water may be improved. Any hydrophobic resin (HR) can be used as long as it can improve a backward contact angle over the film surface. However, the resin preferably contains at least one of a fluorine atom and a silicon atom. The backward contact angle of a resist film is preferably from 60° to 90°, more preferably 70° or more. The amount of the hydrophobic resin to be added can be properly controlled so that the backward contact angle of a resist film may fall within the foregoing range. The amount of the resin is preferably from 0.1 to 10% by weight, more preferably from 0.1 to 5% by weight, based on the weight of the total solid components of the resist composition. The hydrophobic resin (HR) is localized in the interface as described above. However, as is different from a surfactant, it does not necessarily have a hydrophilic group within the molecule and is not required to contribute to uniform mixing of polar/non-polar materials.

The backward contact angle is a contact angle that is measured when a contact line at the interface of a droplet and a substrate makes a backward movement, and it is generally known to be useful in simulating the easiness of movement of a droplet in a dynamic state. When a droplet ejected from the tip of a needle is landed on a substrate and the droplet is again sucked into the needle, the backward contact angle can be simply defined as a contact angle at the time the interface of the droplet recedes. The contact angle can be measured with a measuring method generally called an expansion contraction method.

In an immersion exposure process, it is necessary for an immersion liquid to be capable of moving on a wafer following up the movement of an exposure head scanning on the wafer at a high speed and forming an exposure pattern, so that the contact angle of the immersion liquid to the resist film in a dynamic state is important, and the performance capable of following up the high speed scanning of the exposure head without leaving the droplet is required of the resist film.

A fluorine atom or a silicon atom in the hydrophobic resin (HR) may be present either in the main chain or in the side chain by substitution.

The hydrophobic resin (HR) is preferably a resin wherein its partial structure containing a fluorine atom is an alkyl group having a fluorine atom, a cycloalkyl group having a fluorine atom or an aryl group having a fluorine atom.

The alkyl group having a fluorine atom (containing preferably from 1 to 10 carbon atoms, more preferably from 1 to 4 carbon atoms) is a straight or branched alkyl group wherein at least one hydrogen atom is replaced by a fluorine atom, and may further have other substituents.

The cycloalkyl group having a fluorine atom is a monocyclic or polycyclic alkyl group wherein at least one hydrogen atom is replaced by a fluorine atom, and may further have other substituents.

Examples of the aryl group having a fluorine atom include aryl groups such as a phenyl group and a naphthyl group wherein at least one hydrogen atom is replaced by a fluorine atom. The aryl group may further have other substituents.

As the alkyl group having a fluorine atom, the cycloalkyl group having a fluorine atom, or the aryl group having a fluorine atom, preferred ones are those which are represented by the following general formulae (F2) to (F4) which, however, are not to be construed to limit the invention in any way.

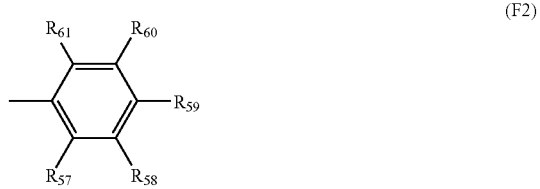

(F2)

(F3)

(F4)

In the following general formulae (F2) to (F4), $R_{57}$ to $R_{68}$ each independently represents a hydrogen atom, a fluorine atom or an alkyl group, provided that at least one of $R_{57}$ to $R_{61}$, $R_{62}$ to $R_{64}$, or $R_{65}$ to $R_{68}$ represents a fluorine atom or an alkyl group (containing preferably from 1 to 4 carbon atoms) wherein at least one hydrogen atom is replaced by a fluorine atom. It is preferred that all of $R_{57}$ to $R_{16}$ and all of $R_{65}$ to $R_{67}$ are fluorine atoms. $R_{62}$, $R_{63}$, and $R_{68}$ each is preferably an alkyl group (containing preferably from 1 to 4 carbon atoms) wherein at least one hydrogen atom is replaced by a fluorine atom, more preferably a perfluoroalkyl group containing from 1 to 4 carbon atoms. $R_{62}$ and $R_{63}$ may be connected to each other to form a ring.

Specific examples of the group represented by the general formula (F2) include a p-fluorophenyl group, a pentafluorophenyl group, and a 3,5-di(trifluoromethyl)phenyl group.

Specific examples of the group represented by the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisopropyl group, a nonafluoro-t-butyl group, and a perfluoroisopentyl group are preferred, with a hexafluoroisopropyl group and a heptafluoroisopropyl group being more preferred.

Specific examples of the group represented by the general formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferred.

Specific examples of a repeating unit containing a fluorine atom will be shown hereinafter which, however, are not to be construed to limit the invention in any way.

In the specific examples, $X_1$ represents a hydrogen atom, —CH$_3$, —F or —CF$_3$, and $X_2$ represents —F or CF$_3$.

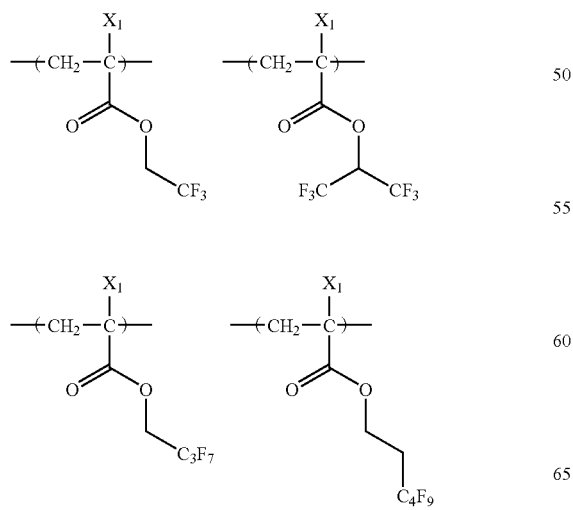
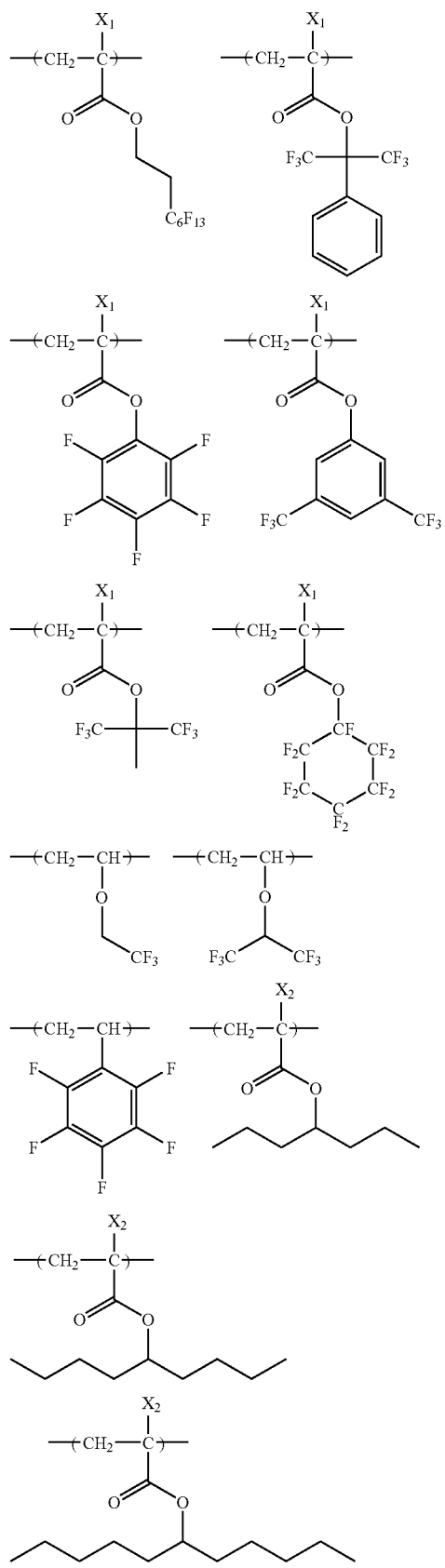

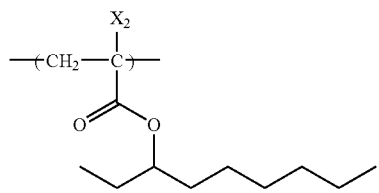
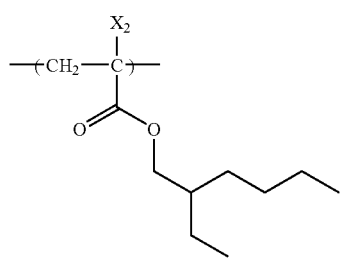
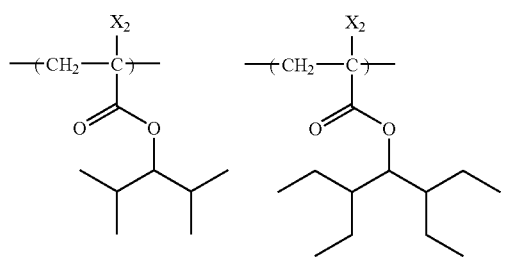
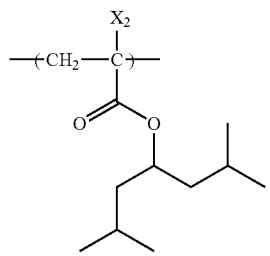
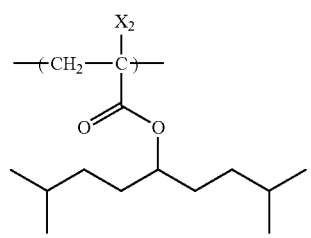

The hydrophobic resin (HR) is preferably a resin having, as a partial structure having at least one silicon atom, an alkylsilyl structure (preferably trialkylsilyl group) or a cyclic siloxane structure.

Specific examples of the alkylsilyl structure or the cyclic siloxane structure include those groups which are represented by the following formulae (CS-1) to (CS-3).

(CS-1)

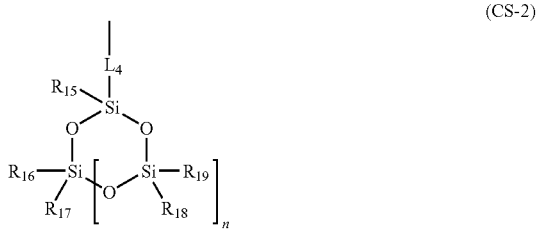

(CS-2)

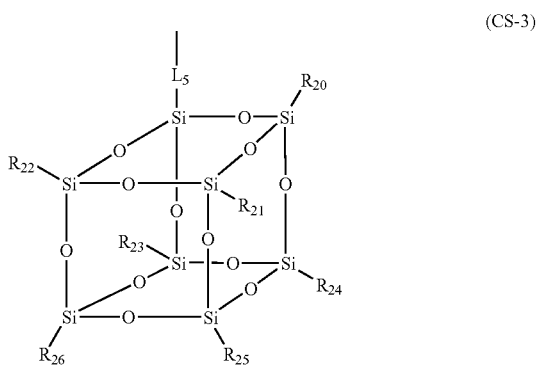

(CS-3)

In the formulae (CS-1) to (CS-3), $R_{12}$ to $R_{26}$ each independently represents a straight or branched alkyl group (containing preferably from 1 to 20 carbon atoms) or a cycloalkyl group (containing preferably from 3 to 20 carbon atoms).

$L_3$ to $L_5$ each represents a single bond or a divalent linking group. As the divalent linking group, there are illustrated ones selected from the group consisting of an alkylene group, a phenyl group, an ether group, a thioether group, a carbonyl group, an ester group, an amido group, a urethane group, and a urea group, and combinations of two or more thereof.

n represents an integer of 1 to 5.

Specific examples of the repeating unit having at least one silicon atom are shown below which, however, are not to be construed to limit the invention in any way.

In the specific examples, $X_1$ represents a hydrogen atom, —$CH_3$, —F or —$CF_3$.

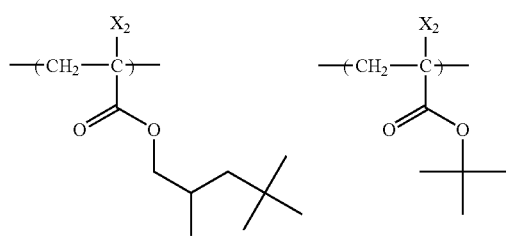

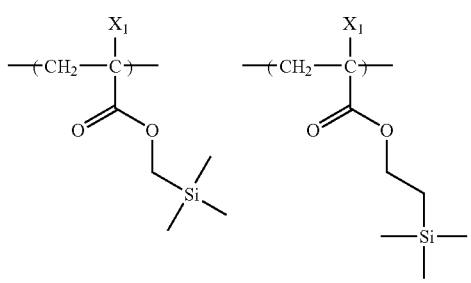

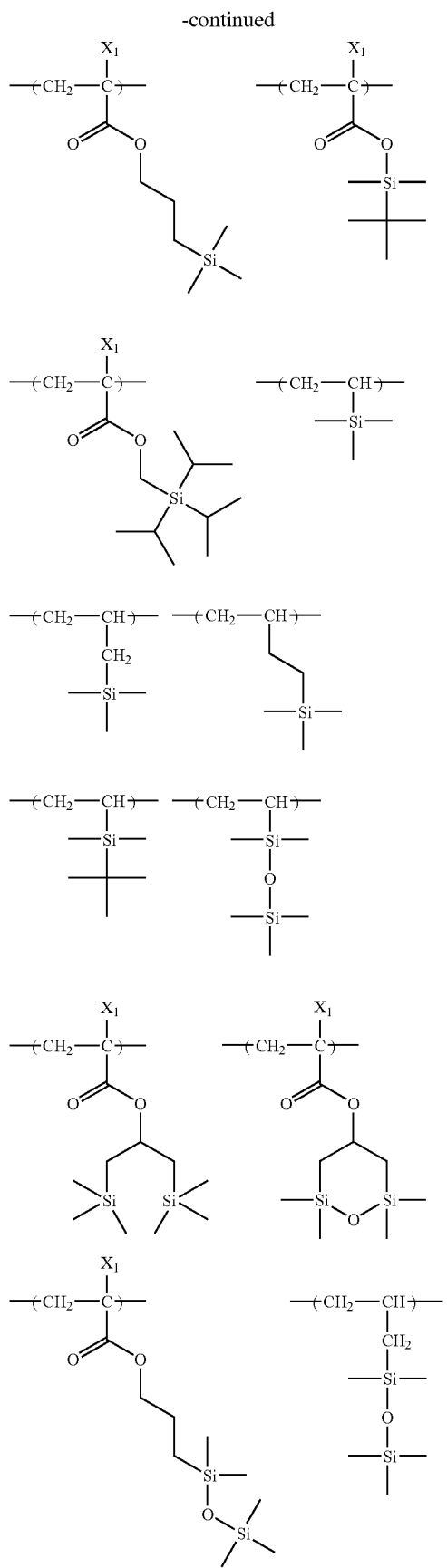
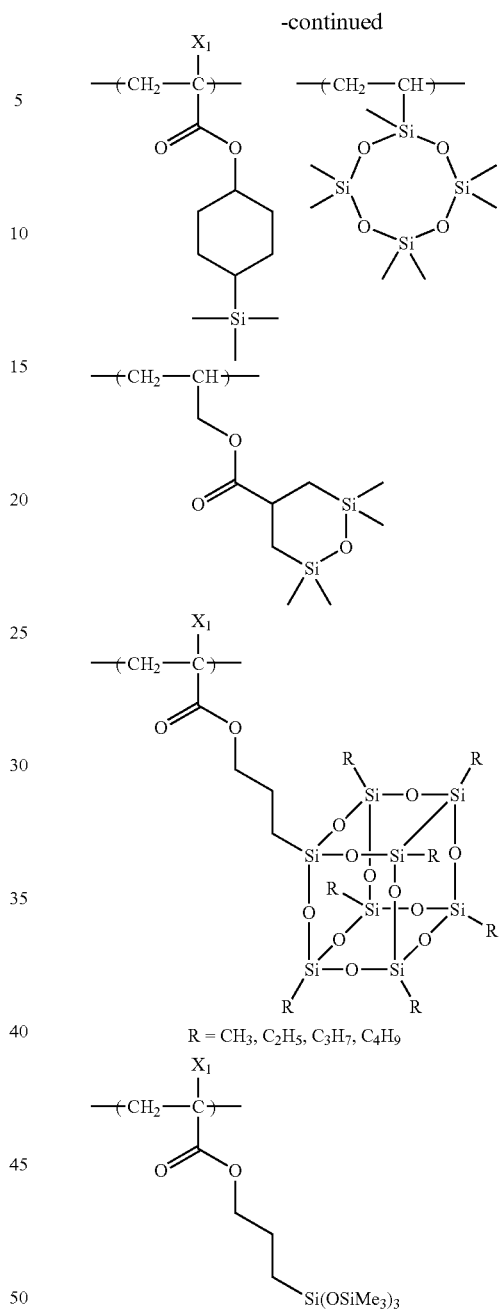

The hydrophobic resin (HR) may further contain at least one group selected from among the following groups of (x) to (z).

(x) an alkali-soluble group (y) a group that decomposes by action of an alkali developer to undergo an increase in solubility of the resin in the alkali developer (z) a group that decomposes by action of an acid Examples of the alkali-soluble group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl) imido group, a bis(alkylsulfoyl)methylene group, bis(alkylsulfonyl)imido group, a tris(alkylcarbonyl)methylene group, and a tris(alkylsulfonyl)methylene group.

Preferred alkali-soluble groups are a fluorinated alcohol group (preferably a hexafluoroisopropanol), a sulfonimido group, and a bis(carbonyl)methylene group.

As the repeating unit having the alkali-soluble group (x), any of a repeating unit wherein the alkali-soluble group is directly connected to the main chain of a resin comprising a repeating unit of acrylic acid or methacrylic acid, and a repeating unit wherein the alkali-soluble group is connected to the main chain of the resin via a linking group is preferred. Further, it is also preferred to introduce the alkali-soluble group into the end of the polymer by using a polymerization initiator or chain transfer agent having the alkali-soluble group upon polymerization.

The content of the repeating unit having the alkali-soluble group (x) is preferably from 1 to 50 mol %, more preferably from 3 to 35 mol %, still more preferably from 5 to 20 mol %, based on all the repeating units in the polymer.

Specific examples of the repeating unit having the alkali-soluble group (x) will be shown below which, however, are not construed to limit the invention in any way.

(In the following formulae, $R_x$ represents H, $CH_3$, $CF_3$ or $CH_2OH$.)

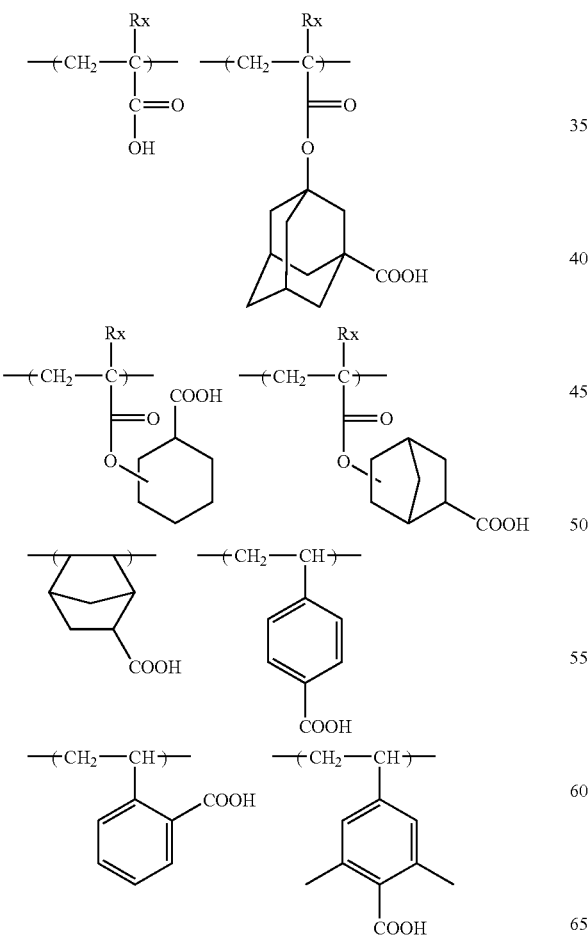

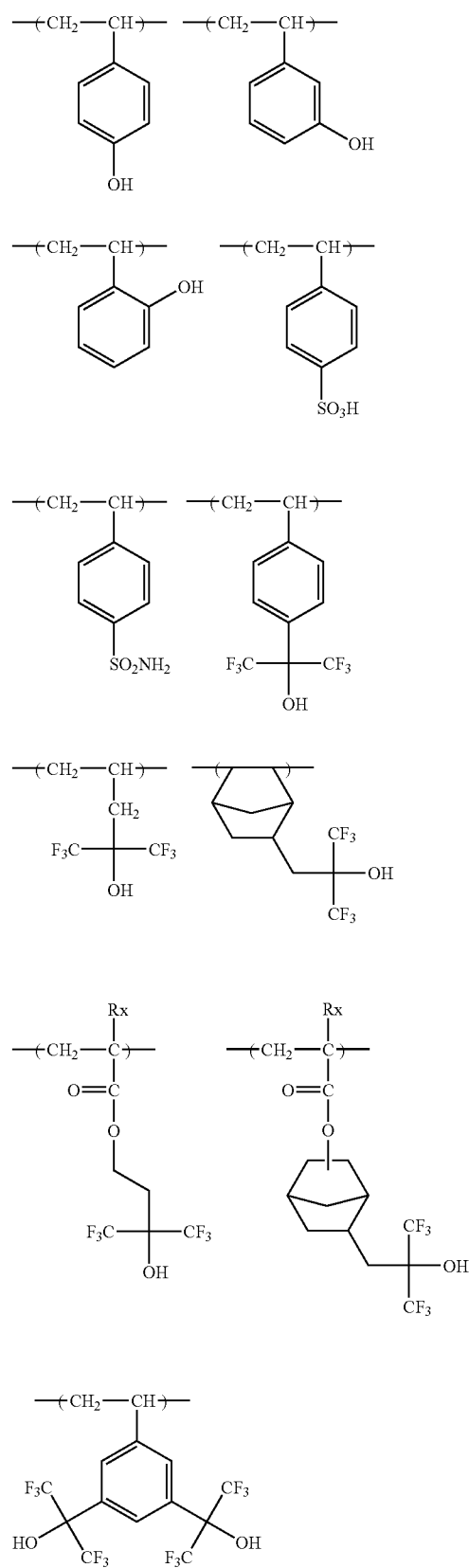

-continued

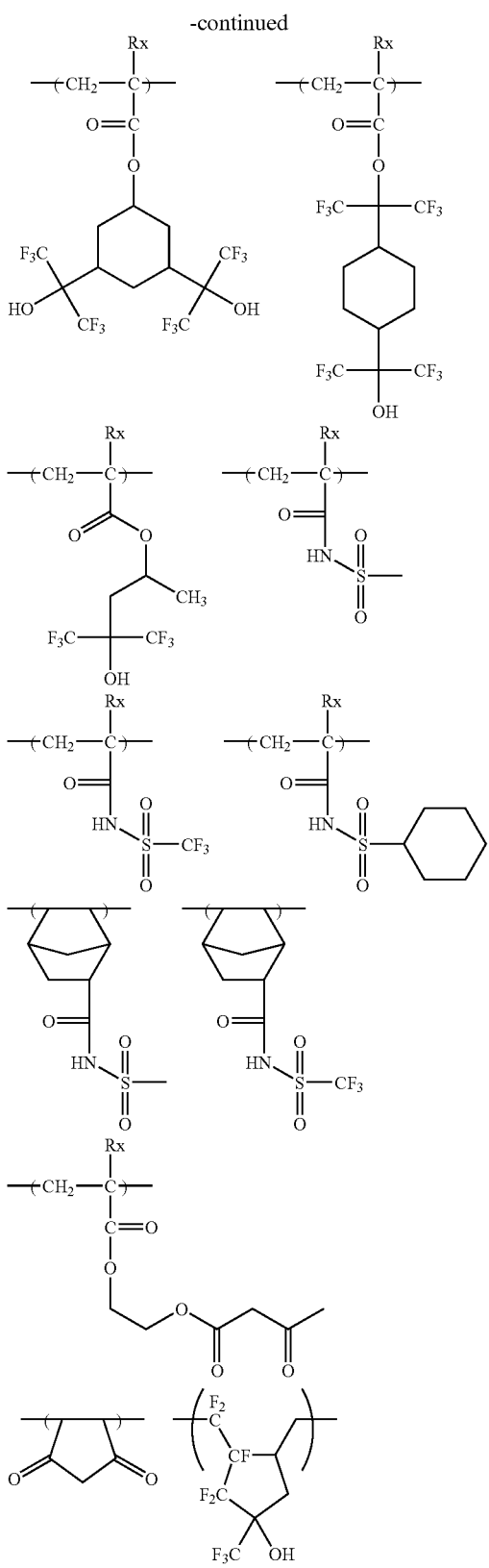

Examples of the group (y) that decomposes by action of an alkali developer to undergo an increase in solubility of the resin in the alkali developer include a group having a lactone structure, an acid anhydride, and an acid imido group, with a lactone group being preferred.

As a repeating unit having the group (y) that decomposes by action of an alkali developer to undergo an increase in solubility of the resin in the alkali developer, a repeating unit wherein the group (y) that decomposes by action of an alkali developer to undergo an increase in solubility of the resin in the alkali developer is connected to the main chain of the resin, such as an acrylic ester or a methacrylic ester is preferred. It is also preferred to introduce the alkali-soluble group into the end of the polymer by using a polymerization initiator or chain transfer agent having the group (y) that decomposes by action of an alkali developer to undergo an increase in solubility of the resin in the alkali developer upon polymerization.

The content of the repeating unit having the group (y) undergoing an increase in solubility in the alkali developer is preferably from 1 to 40 mol %, more preferably from 3 to 30 mol %, still more preferably from 5 to 15 mol %, based on all the repeating units in the polymer.

Specific examples of the repeating unit having the group (y) undergoing an increase in solubility in the alkali developer include the same repeating units having a lactone structure having been illustrated with respect to the resins of component (B).

Examples of the repeating unit (z) that decomposes by action of an acid and constituting the hydrophobic resin (HR) include the same repeating units having an acid-decomposable group having been illustrated with respect to the resins of component (A). The content of the repeating unit (z) decomposable by the action of an acid and constituting the hydrophobic resin (HR) is preferably from 1 to 80 mol %, more preferably from 10 to 80 mol %, still more preferably from 20 to 60 mol %, based on all the repeating units in the polymer.

The hydrophobic resin (HR) may further contain a repeating unit represented by the following general formula (III).

In the general formula (III), $R_4$ represents an alkyl group, a cycloalkyl group, an alkenyl group or a cycloalkenyl group.

$L_6$ represents a single bond or a divalent linking group.

The alkyl group represented by $R_4$ in the general formula (III) is preferably a straight or branched alkyl group containing from 3 to 20 carbon atoms.

The cycloalkyl group is preferably a cycloalkyl group containing from 3 to 20 carbon atoms.

The alkenyl group is preferably an alkenyl group containing from 3 to 20 carbon atoms.

The cycloalkenyl group is preferably a cycloalkenyl group containing from 3 to 20 carbon atoms.

The linking group represented by $L_6$ is preferably an alkylene group (containing preferably from 1 to 5 carbon atoms) or an oxy group.

When the hydrophobic resin (HR) contains a fluorine atom, the content of the fluorine atom is preferably from 5 to 80% by weight, more preferably from 10 to 80% by weight based on the molecular weight of the hydrophobic resin (HR). A repeating unit containing a fluorine atom is contained in the hydrophobic resin (HR) in an amount of preferably from 10 to 100% by weight, more preferably from 30 to 100% by weight.

When the hydrophobic resin (HR) contains a silicon atom, the content of the silicon atom is preferably from 2 to 50% by weight, more preferably from 2 to 30% by weight based on the molecular weight of the hydrophobic resin (HR). A repeating unit containing a silicon atom is contained in the hydrophobic resin (HR) in an amount of preferably from 10 to 100% by weight, more preferably from 20 to 100% by weight.

The weight-average molecular weight of the hydrophobic resin (HR) in terms of a standard polystyrene is preferably from 1,000 to 100,000, more preferably from 1,000 to 50,000, still more preferably from 2,000 to 15,000.

As is the same with the resins of component (A), it is naturally preferred for the hydrophobic resin (HR) to contain impurities such as metals in minimum amounts, and the content of residual monomers and oligomer components be preferably from 0 to 10% by weight, more preferably from 0 to 5% by weight, still more preferably from 0 to 1% by weight. Thus, there can be obtained a resist free of foreign matters in the solution and suffering no change with time of sensitivity. In addition, in view of resolution, resist shape, side wall of resist pattern, and roughness, the molecular weight distribution (Mw/Mn; also referred to as "degree of dispersion" is preferably in the range of from 1 to 5, more preferably from 1 to 3, still more preferably from 1 to 2.

As the hydrophobic resin (HR), various commercially available products can be used or those synthesized in a conventional manner (for example, by radical polymerization) can be used. For example, as a general synthesizing process, there are illustrated a one-shot polymerization process of conducting polymerization by dissolving a monomer species and an initiator in a solvent and heating the resulting solution, and a dropwise polymerization process of dropwise adding a solution of a monomer species and an initiator to a heated solvent over a period of from 1 to 10 hours, with the dropwise polymerization process being preferred. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethylformamide and dimethylacetamide; and solvents capable of dissolving the composition of the invention such as propylene glycol monomethyl ether acetate, propylene glycol monomethyl ether, and cyclohexanone, which will be described hereinafter. It is more preferred to conduct polymerization by using the same solvent as that to be used in the positive resist composition of the invention. Thus, generation of particles during storage can be suppressed.

The polymerization reaction is preferably conducted in an atmosphere of an inert gas such as nitrogen or argon. The polymerization is initiated by using a commercially available radical initiator (e.g., an azo series initiator or a peroxide) as a polymerization initiator. As the radical initiator, azo series initiators are preferred, and azo series initiators having an ester group, a cyano group or a carboxyl group are preferred. Preferred examples of the initiator include azobisisobutyronitrile, azobisdimethylvaleronitrile, and dimethyl 2,2'-azobis(2-methylpropionate). The reaction concentration is from 5 to 50% by weight, preferably from 30 to 50% by weight. The reaction temperature is usually from 10° C. to 150° C., preferably from 30° C. to 120° C., more preferably from 60 to 100° C.

After completion of the reaction, the reaction mixture is allowed to cool to room temperature, followed by purification. As the purifying method, there can be employed common methods such as a liquid-liquid extraction method of removing residual monomers and oligomer components by a combination of washing with water and use of an appropriate solvent, a purifying method in a solution state such as ultra-filtration of removing components having a molecular weight equal to or less than a particular molecular weight by extraction, a re-precipitating method of removing residual monomers and the like by dropwise adding the resin solution to a poor solvent to thereby coagulate the resin in the poor solvent, and a purifying method in a solid state by washing a resin slurry obtained by filtration with a poor solvent. For example, the resin is precipitated as solid by bringing the reaction solution into contact with a solvent (poor solvent) in which the resin is scarcely soluble or insoluble, in an amount by volume 10 times as much as the amount by volume of the reaction solution or less than that, preferably in a 10- to 5-fold amount by volume.

As a solvent (solvent for precipitation or re-precipitation) to be used upon precipitation or re-precipitation of the polymer product from the polymer solution, poor solvents for the polymer may be used. An appropriate solvent can be selected from among hydrocarbons, halogenated hydrocarbons, nitro compounds, ethers, ketones, esters, carbonates, alcohols, carboxylic acids, water, and mixed solvents containing these solvents according to the kind of the polymer. Of these, solvents containing at least an alcohol (particularly, methanol) or water are preferred as the solvents for precipitation or re-precipitation.

The amount of the solvents for precipitation or re-precipitation to be used can properly be selected in consideration of efficiency or yield but, in general, is from 100 to 10,000 parts by weight, preferably from 200 to 2,000 parts by weight, more preferably from 300 to 1,000 parts by weight, per 100 parts by weight of the polymer solution.

The temperature to be employed upon precipitation or re-precipitation can properly be selected in consideration of efficiency or operability but, usually, is from about 0 to about 50° C., preferably around room temperature (for example, from about 20 to about 35° C.). The precipitation or re-precipitation procedure can be conducted in a known manner such as a batchwise manner or a continuous manner using a conventional mixing vessel such as a stirring tank.

The precipitated or re-precipitated polymer is usually subjected to conventional solid-liquid separation such as filtration or centrifugation, and then dried to use. Filtration is conducted by using a solvent-resistance filter medium preferably under pressure. Drying is conducted under ordinary pressure or reduced pressure (preferably under reduced pressure) at a temperature of from about 30 to about 100° C., preferably from about 30 to about 50° C.

Additionally, it is also possible to once precipitate and separate the resin, and then again dissolve in a solvent and bring the solution into contact with a solvent in which the resin is scarcely soluble or insoluble. That is, the reaction solution may be subjected, after completion of the radical polymerization reaction, to a method including a step (Step a) of bringing the reaction solution into contact with a solvent in which the resin is scarcely soluble or insoluble to thereby precipitate the resin, a step (Step b) of separating the resin from the solution, a step (Step c) of again dissolving the separated resin to prepare a resin solution A, a step (Step d) of bringing the resin solution A into contact with a solvent in which the resin is scarcely soluble or insoluble to thereby precipitate the resin in an amount by volume less than 10 times the amount by volume of the resin solution A (preferably in an amount by volume less than 5 times) to thereby precipitate the resin solid, and a step (Step e) of separating the precipitated resin.

Specific examples of the hydrophobic resin (HR) will be shown below. Also, mol ratios of repeating units in individual resins (corresponding to individual repeating units in the order of from left to right), weight-average molecular weights, and degrees of dispersion are shown in Table below.
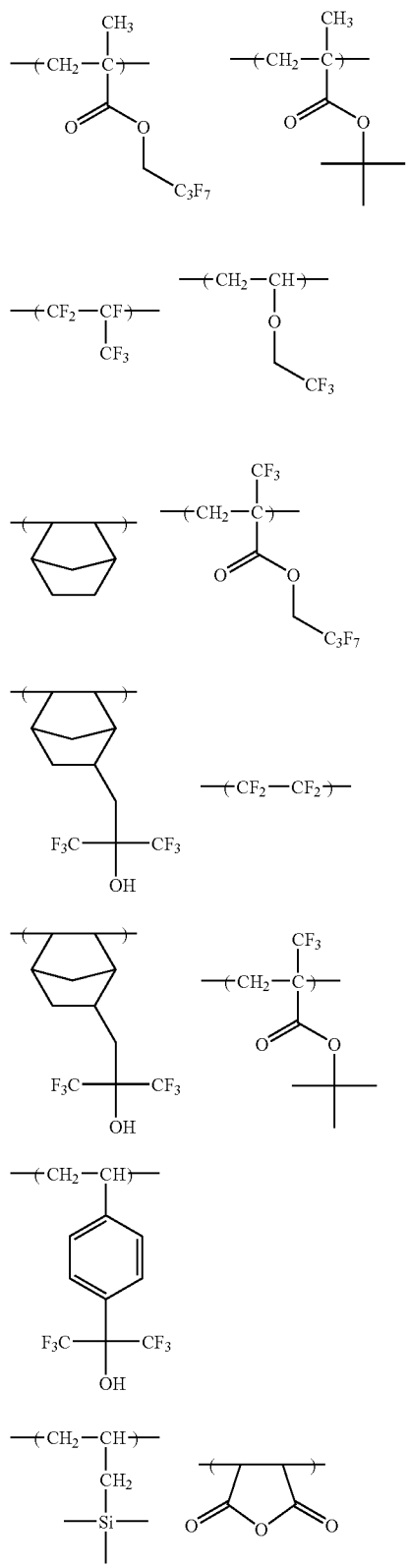
-continued
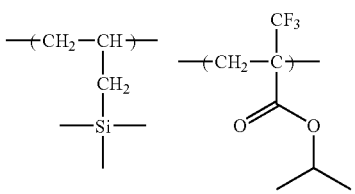
(HR-8)
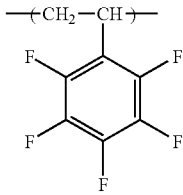
(HR-9)
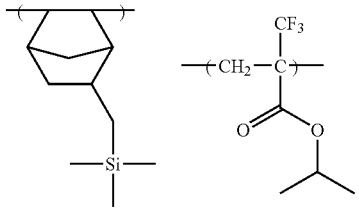
(HR-10)
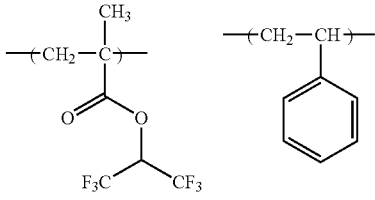
(HR-11)
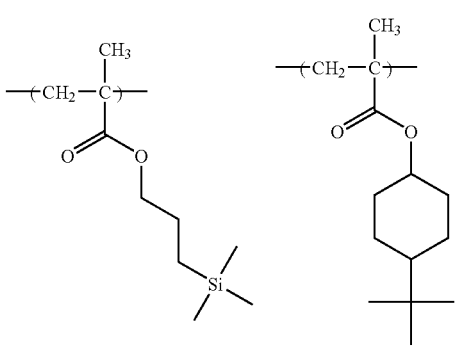
(HR-12)
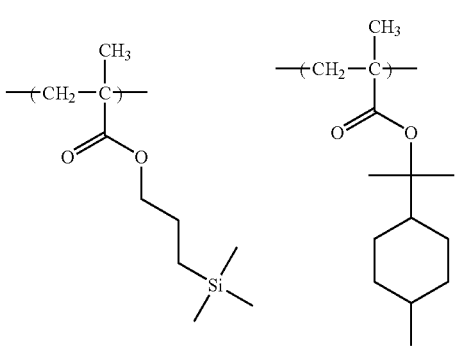
(HR-13)

-continued
(HR-14)
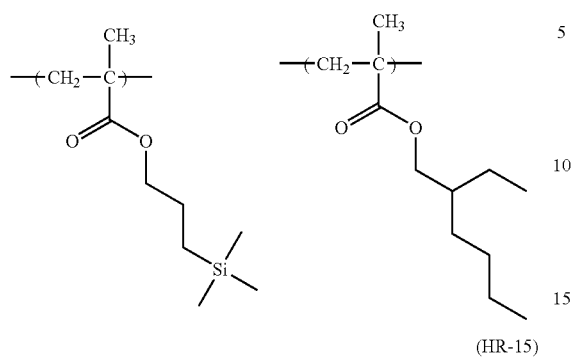
(HR-15)
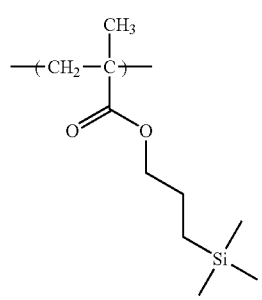
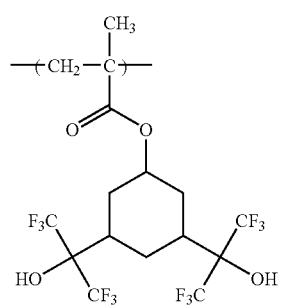
(HR-16)
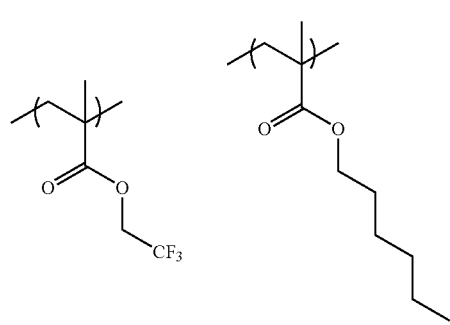
(HR-17)
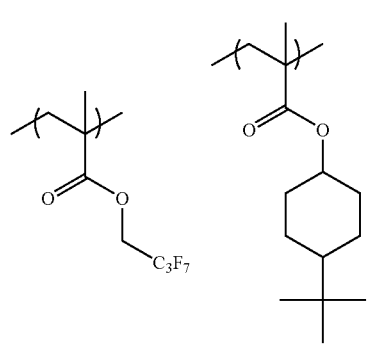
-continued
(HR-18)
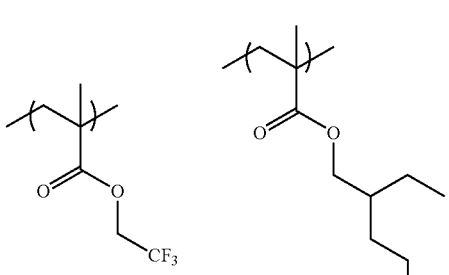
(HR-19)
(HR-20)
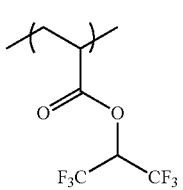
(HR-21)
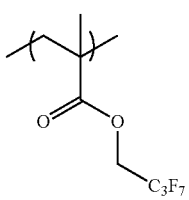
(HR-22)
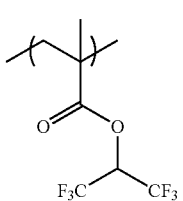
(HR-23)
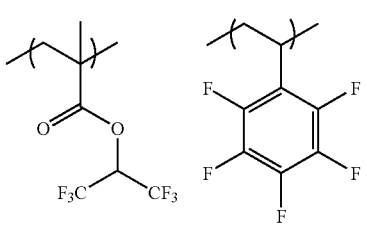

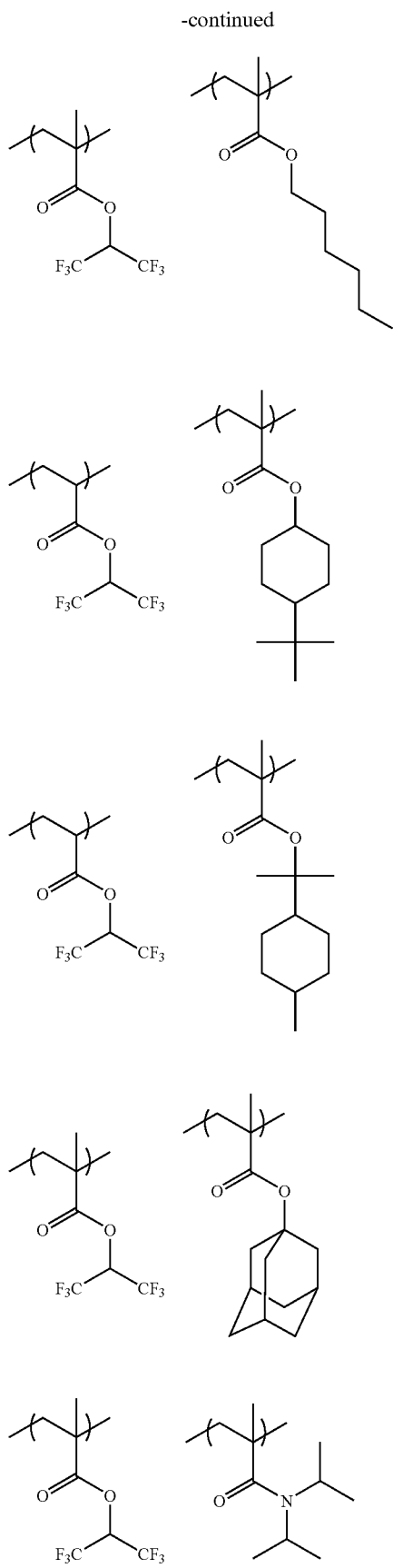
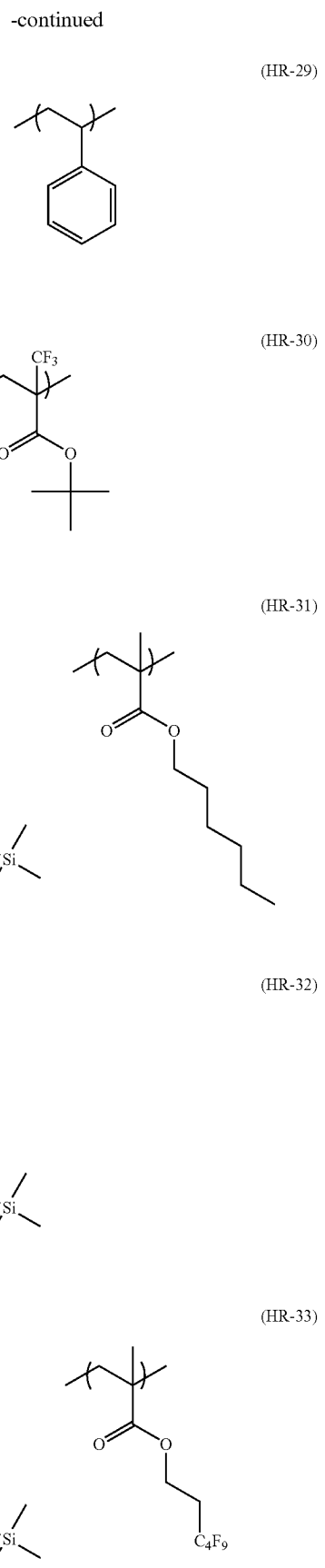

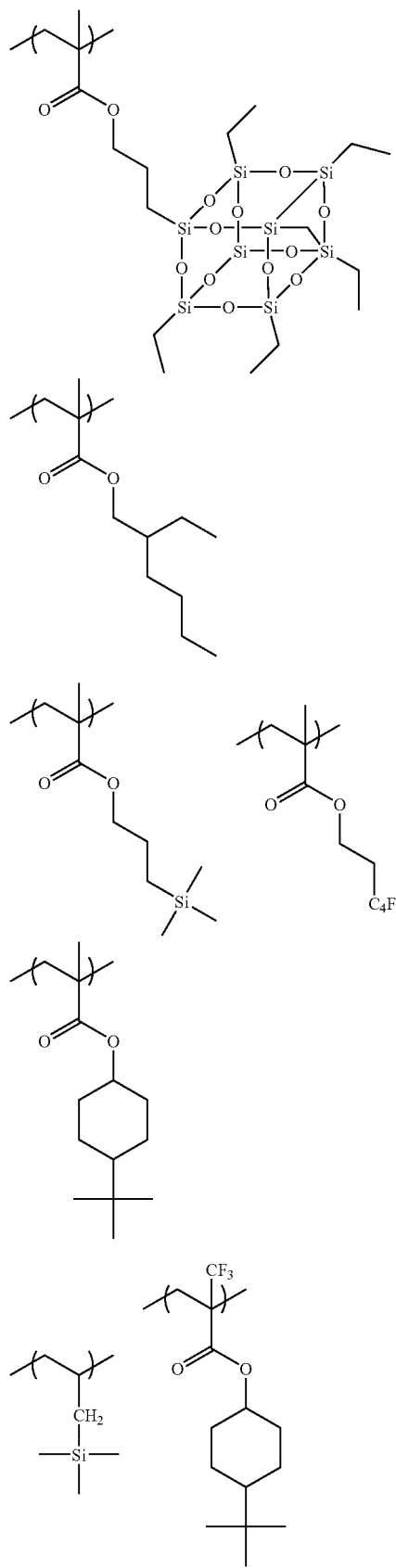
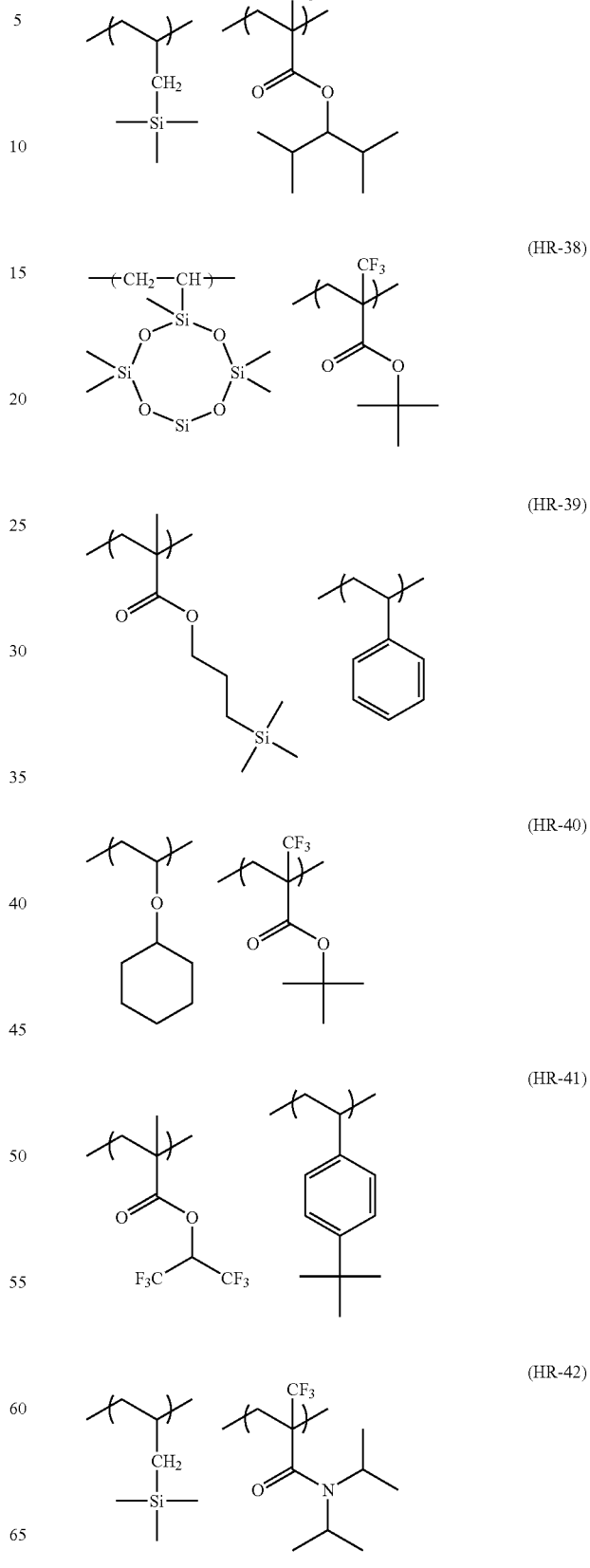

-continued
(HR-43)
(HR-44)
(HR-45)
(HR-46)
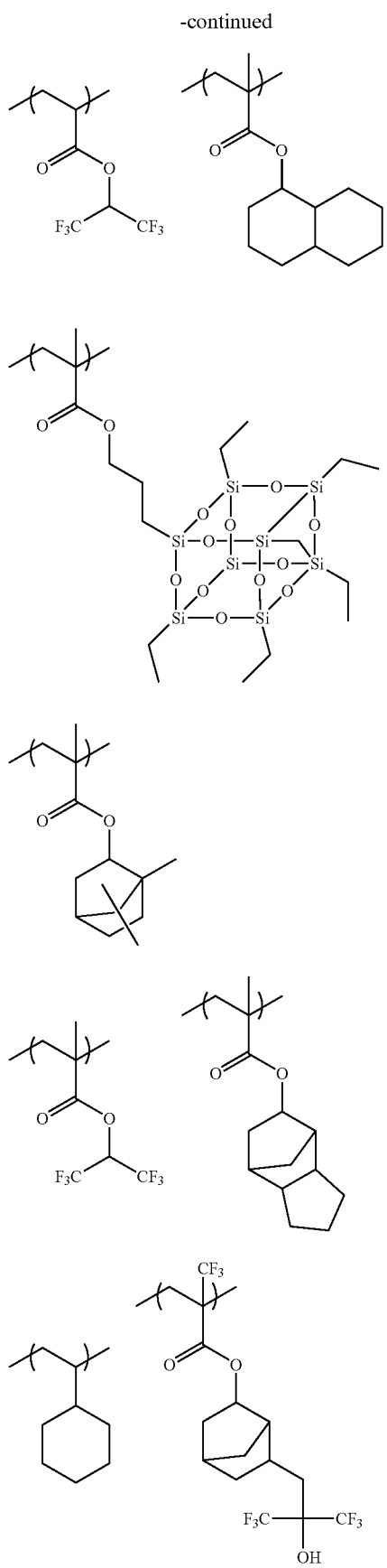
(HR-47)
(HR-48)
(HR-49)
(HR-50)
(HR-51)
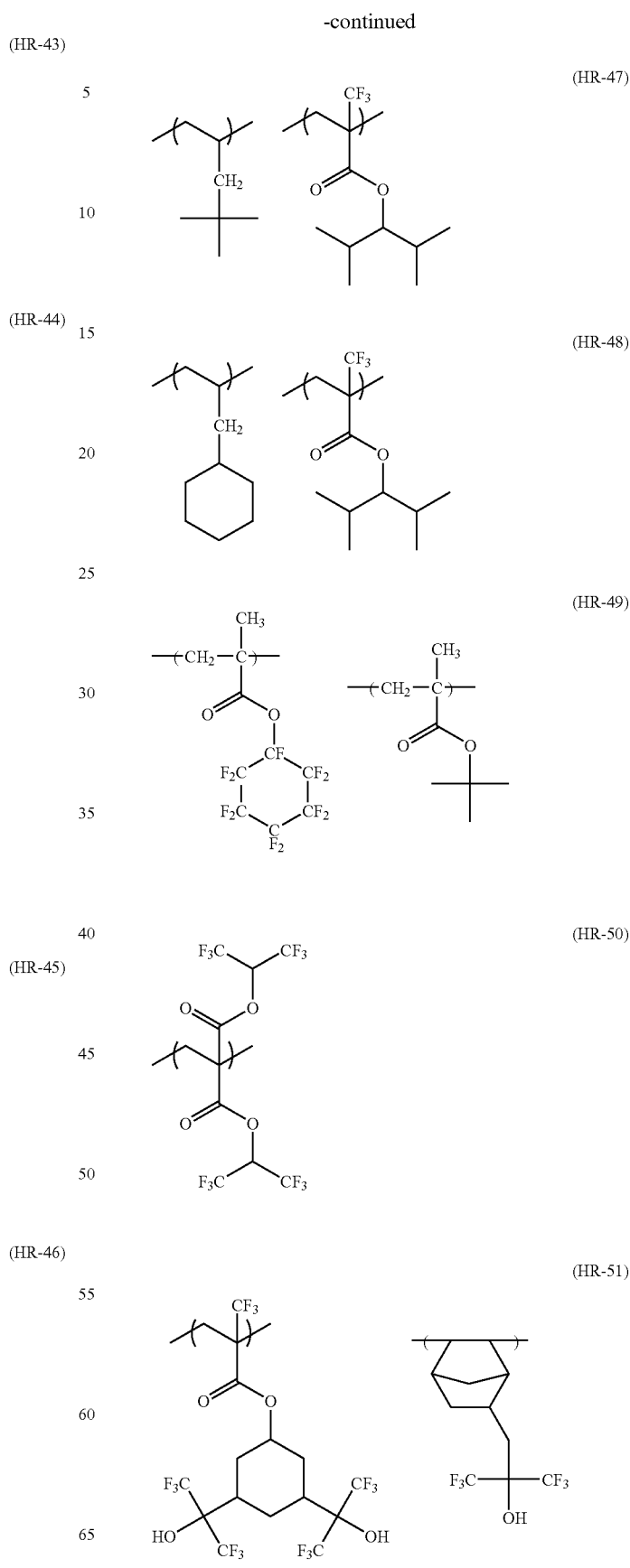

-continued
(HR-52)
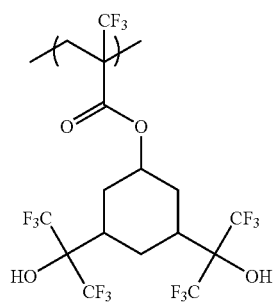 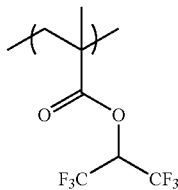
(HR-53)
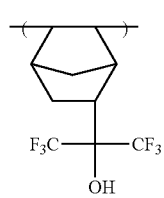
(HR-54)
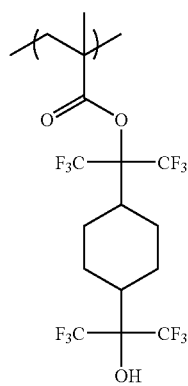
(HR-55)
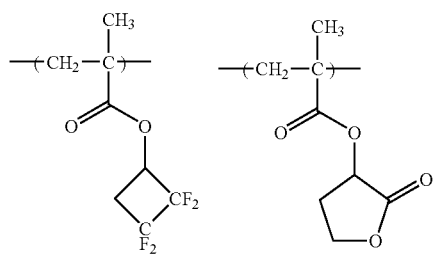
(HR-56)
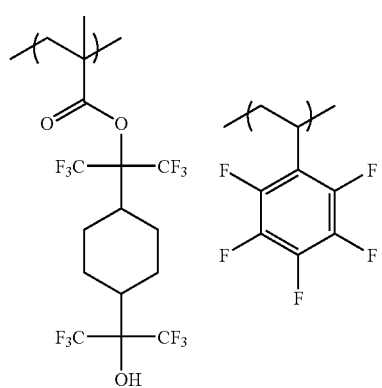
(HR-57)
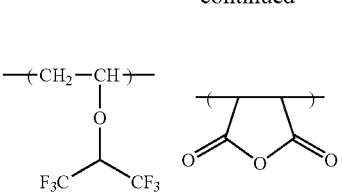
(HR-58)
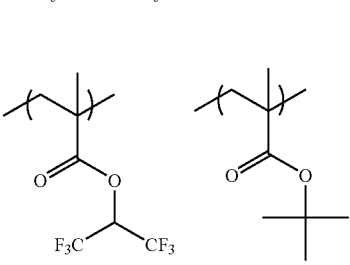
(HR-59)
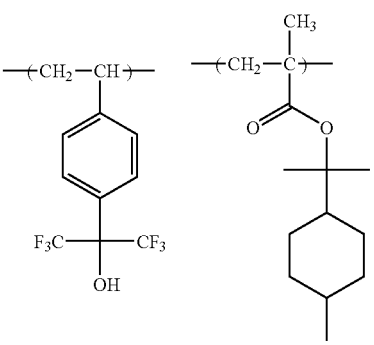
(HR-60)
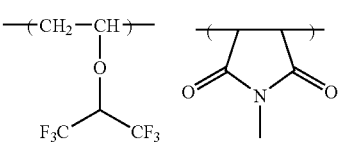
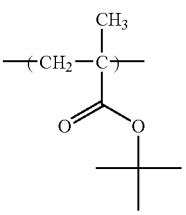
(HR-61)
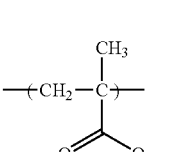

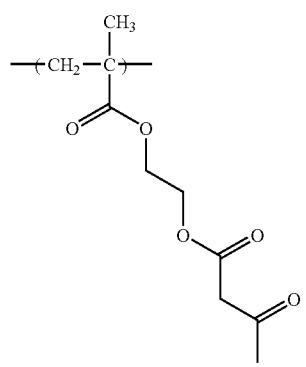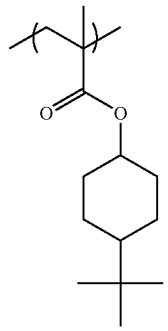
(HR-62)
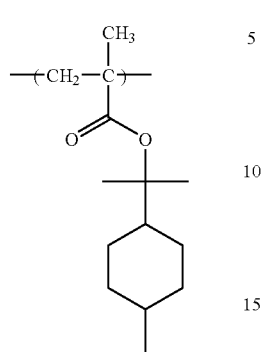
(HR-63)
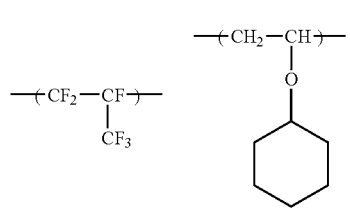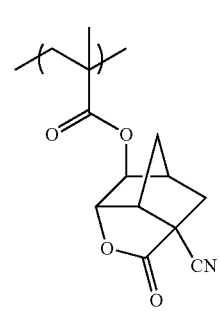
(HR-64)
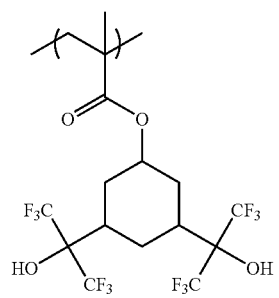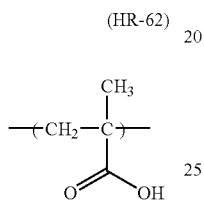
(HR-65)
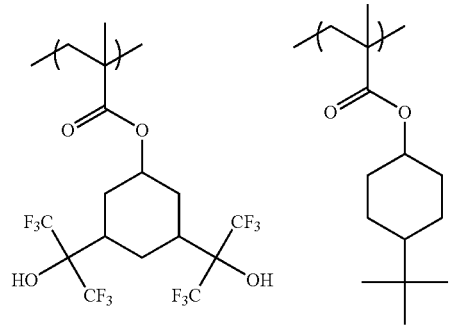
(HR-66)
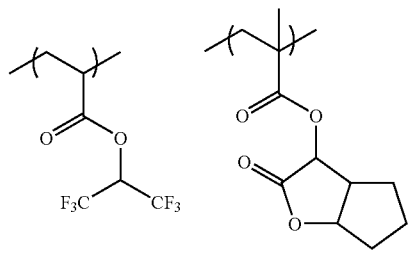
(HR-67)
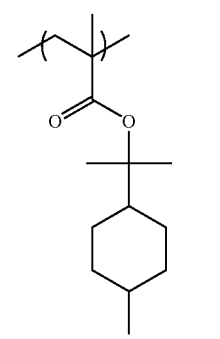
(HR-68)
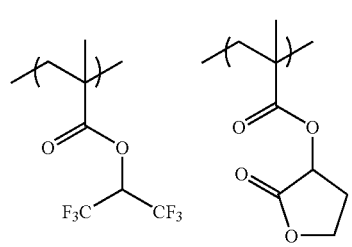
(HR-69)
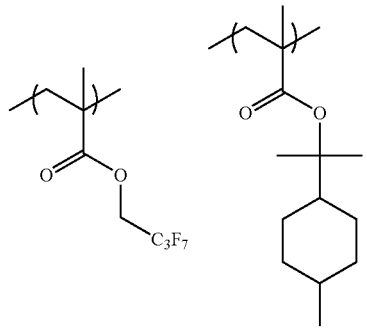

-continued
(HR-70)
(HR-71)
(HR-72)
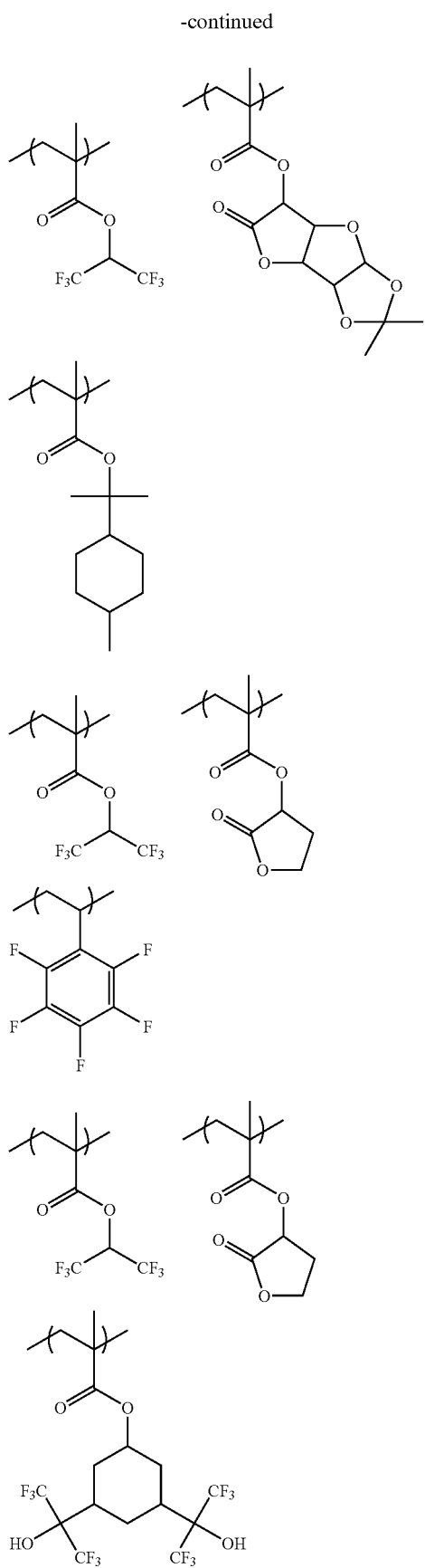
-continued
(HR-73)
(HR-74)
(HR-75)
(HR-76)
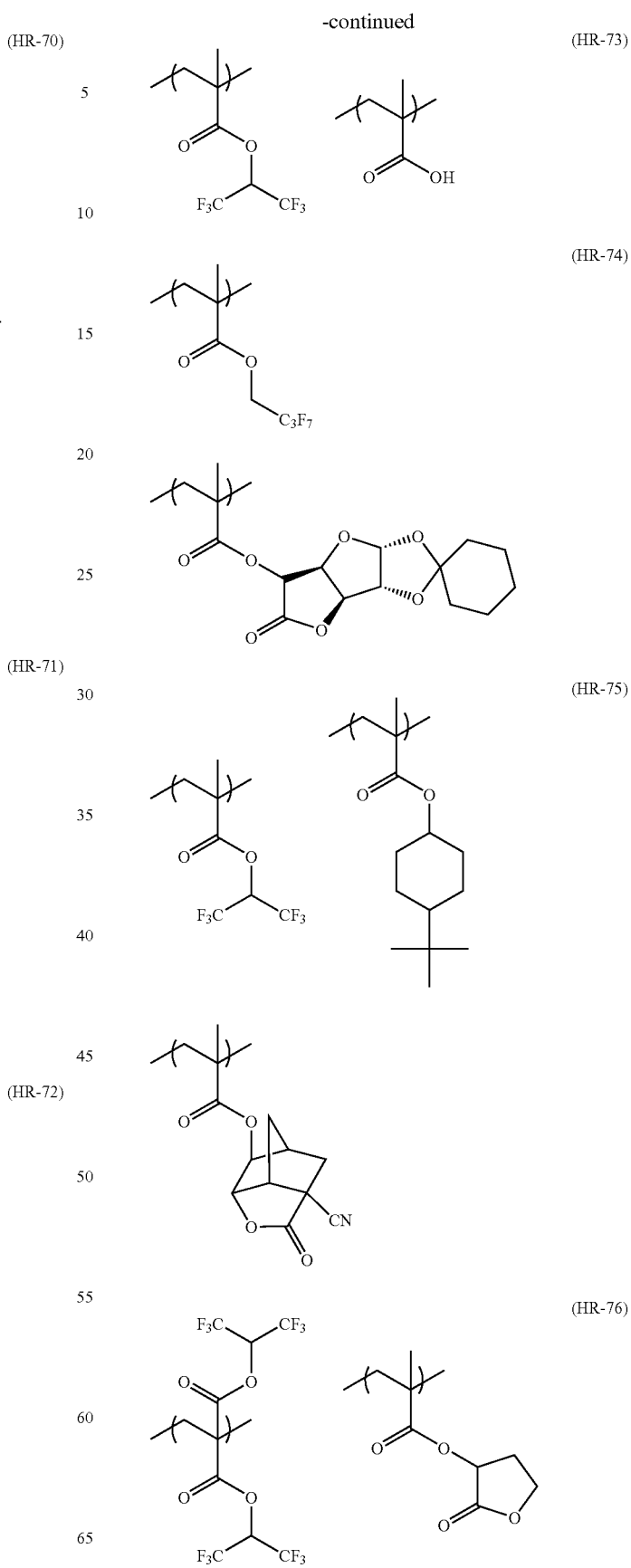

-continued
(HR-77)
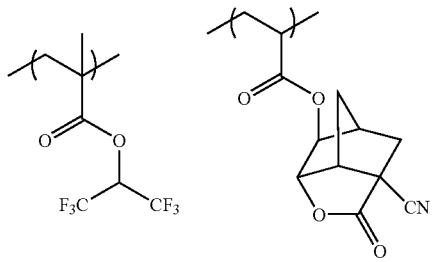
(HR-78)
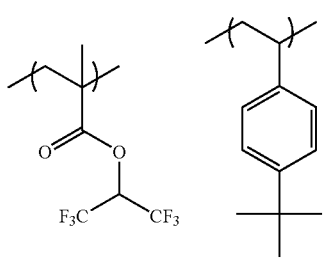
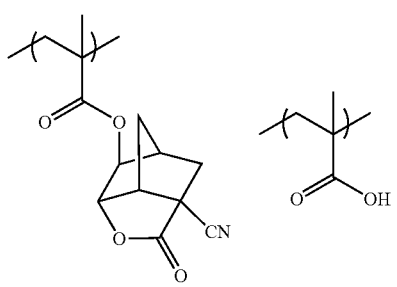
(HR-79)
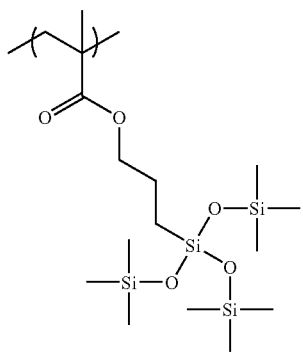
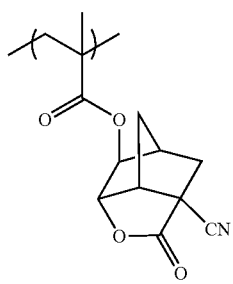
-continued
(HR-80)
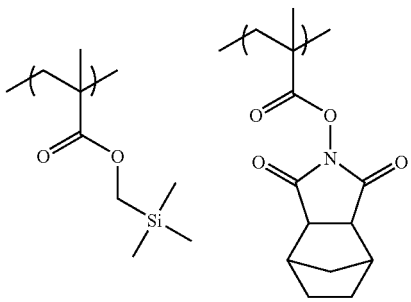
(HR-81)
(HR-82)
(HR-83)
(HR-84)
TABLE
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |

TABLE-continued

| Resin | Composition | Mw | Mw/Mn |
|---|---|---|---|
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

In order that the resist film may not be brought into direct contact with the liquid immersion liquid, a film which is sparingly soluble in the liquid immersion liquid (hereinafter also referred to as "top coat") may be provided between the resist film composed of the resist composition of the invention and the liquid immersion liquid. Examples of functions necessary for the top coat include coating properness to a resist upper layer part, transparency to radiation, especially light of 193 nm and sparing solubility in the liquid immersion liquid. It is preferable that the top coat does not mix with the resist and can be uniformly coated on the resist upper layer.

From the viewpoint of the transparency to light of 193 nm, a polymer which does not contain an abundant amount of an aromatic moiety is preferable as the top coat. Specific examples thereof include hydrocarbon polymers, acrylic ester polymers, polymethacrylic acid, polyacrylic acid, polyvinyl ether, silicon-containing polymers and fluorine-containing polymers. The foregoing hydrophobic resin (HR) is also suitable as the top coat. From the viewpoint of the matter that when impurities elute from the top coat into the liquid immersion liquid, they stain an optical lens, it is preferable that the amount of residual monomer components of the polymer contained in the top coat is low.

In releasing the top coat, a developer may be used, or a release agent may be separately used. A solvent having low penetration into the photosensitive film is preferable as the release agent. In view of the matter that the release step can be carried out simultaneously with the development treatment step of the photosensitive film, it is preferable that the top coat can be released with an alkaline developer. From the viewpoint of releasing the top coat with an alkaline developer, it is preferable that the top coat is acidic. However, from the viewpoint of non-intermix properties with the photosensitive film, the top coat may be neutral or alkaline.

When there is no difference in refractive index between the top coat and the liquid immersion liquid, the resolution is enhanced. In an ArF excimer laser (wavelength: 193 nm), in the case where water is used as the liquid immersion liquid, it is preferable that the top coat for ArF liquid immersion exposure has a refractive index close to the liquid immersion liquid. From the viewpoint of making the top coat have a refractive index close to the liquid immersion liquid, it is preferable that the top coat has a fluorine atom. Also, from the viewpoints of the transparency and refractive index, a thin film is preferable as the top coat.

It is preferable that the top coat neither mixes with the photosensitive film nor mixes with the liquid immersion liquid. From this viewpoint, in the case where the liquid immersion liquid is water, it is preferable that a solvent to be used in the top coat is a medium which is sparingly soluble in the solvent to be used in the photosensitive composition and insoluble in water. Furthermore, in the case where the liquid immersion liquid is an organic solvent, the top coat may be soluble in water or insoluble in water.

The elution of the composition from the photosensitive film to the immersion medium is restrained and development defect can be reduced by the providing the top coat as above.

Before forming a photosensitive film, an antireflection film may be coated on a substrate in advance.

As antireflection films, either inorganic types of titanium, titanium dioxide, titanium nitride, chromium oxide, carbon, amorphous silicon, etc., or organic types comprising a light absorber and a polymer material can be used. As the organic antireflection films, commercially available organic antireflection films such as DUV 30 series and DUV 40 series (products of Brewer Science) and AR-2, AR-3 and AR-5 (products of Shipley Company LLC) can also be used.

As actinic rays or radiation, infrared rays, visible rays, ultraviolet rays, far ultraviolet rays, X-rays and electron beams can be exemplified, preferably far ultraviolet rays of wavelengths of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and an ArF excimer laser, an $F_2$ excimer laser, EUV (13 nm), and electron beams are preferably used.

In a development process, an alkali developer is used as follows. As the alkali developer of a positive photosensitive composition, alkali aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkali developers.

The alkali concentration of the alkali developers is generally from 0.1 to 20 mass %.

The pH of the alkali developers is generally from 10.0 to 15.0.

Example

The invention will be described with reference to examples, but the invention should not be construed as being restricted thereto.

The following polymerizable compounds are synthesized according to the same method as the method disclosed in JP-A-2005-331918.

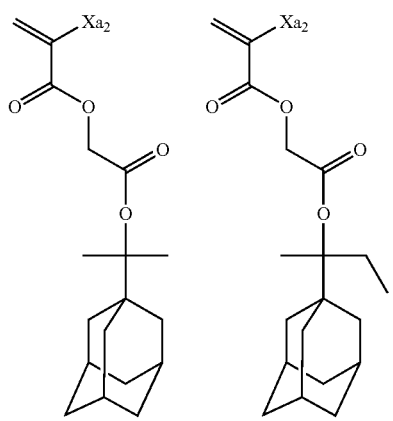

-continued

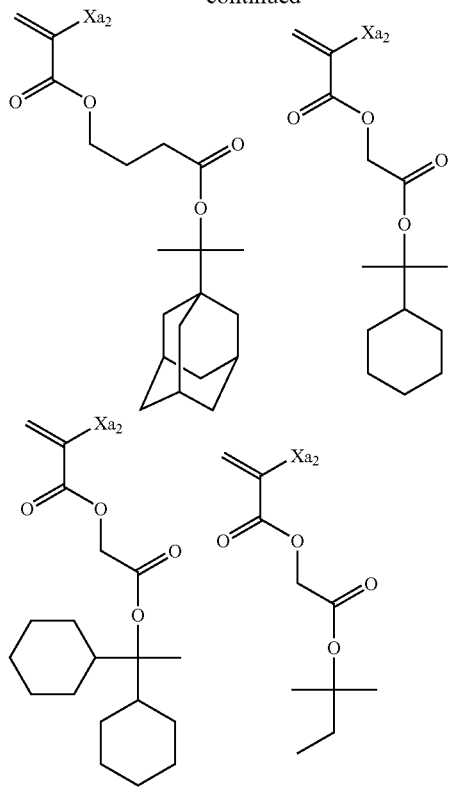

$Xa_2$: a hydrogen atom, a methyl group

Synthesis Example 1

Synthesis of Resin (RA-1)

Cyclohexanone (10.5 g) is put into a three neck flask under nitrogen current and heated at 80° C. Thereto is dropped over 6 hours a solution comprising 83 g of cyclohexanone having dissolved therein 4.3 g of γ-butyrolactone methacrylate, 5.9 g of 3-hydroxyadamantyl-1-methacrylate, 16.0 g of monomer (A) shown below, and a polymerization initiator V-601 (manufactured by Wako Pure Chemical Industries) in proportion of 4 mol % based on the monomer. After termination of dropping, the reaction solution is further reacted at 80° C. for 2 hours. After being allowed to cool, the reaction solution is dropped to a mixed solution of 900 ml of methanol and 100 ml of water over 20 minutes, and the precipitated powder is filtered out and dried to thereby obtain 20 g of resin (RA-1). The weight average molecular weight of resin (RA-1) as the standard polystyrene equivalent is 14,200, and the degree of dispersion (Mw/Mn) is 1.90.

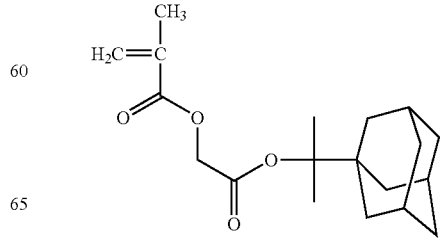

(A)

Other resins are also synthesized according to the same method. The weight average molecular weight is adjusted by changing the amount of the polymerization initiator.
The structures of the resins manufactured are shown below.
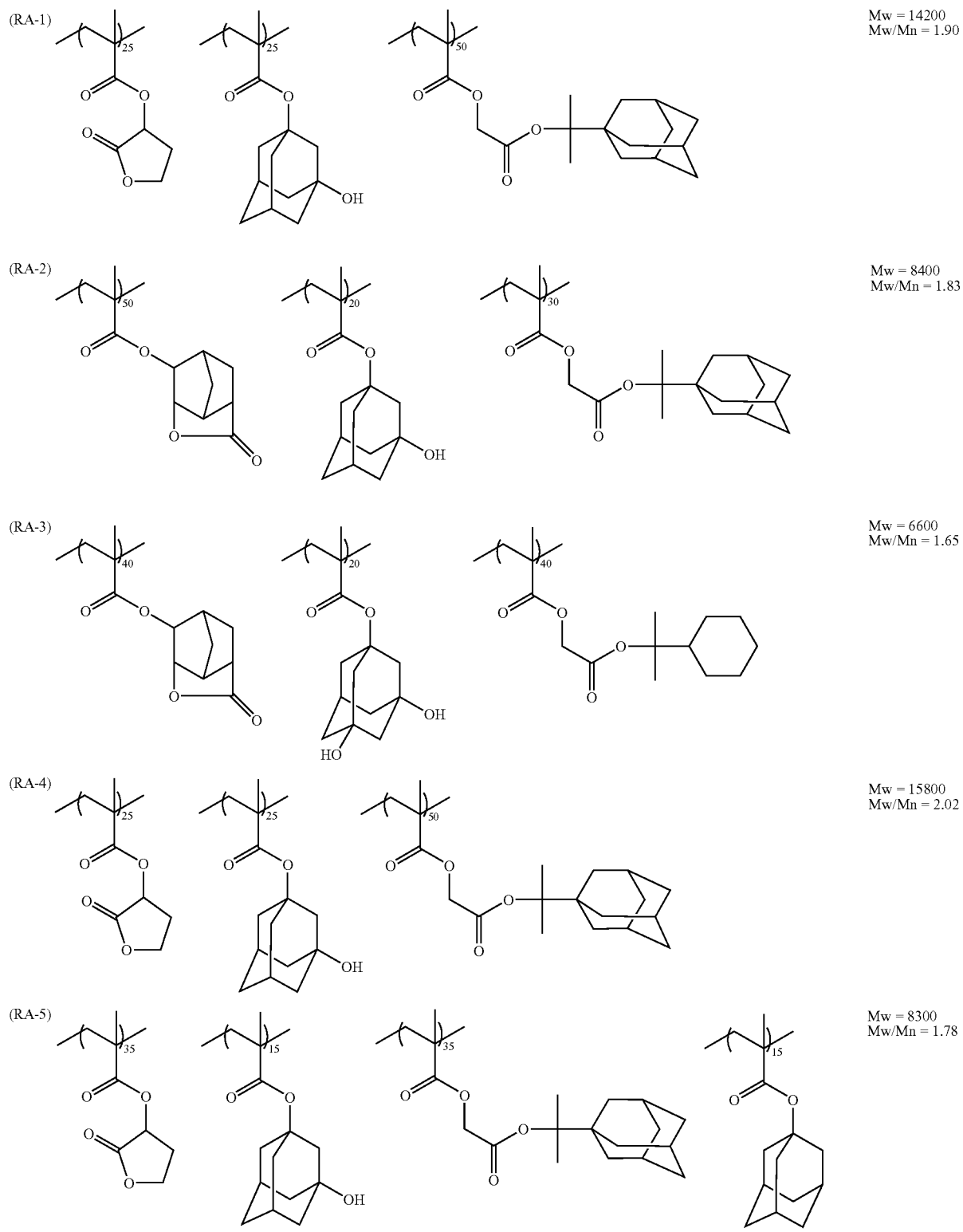

-continued
(RA-5)
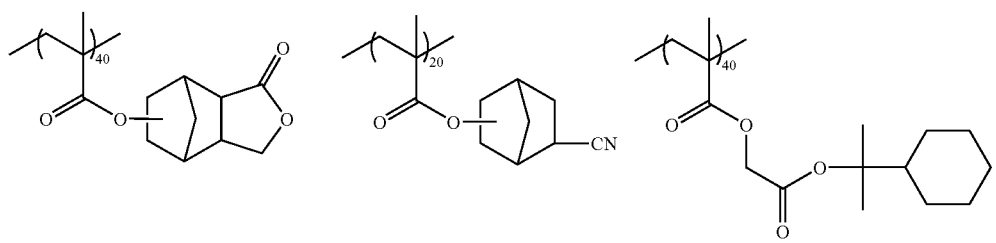
Mw = 5500
Mw/Mn = 1.60
(RA-7)
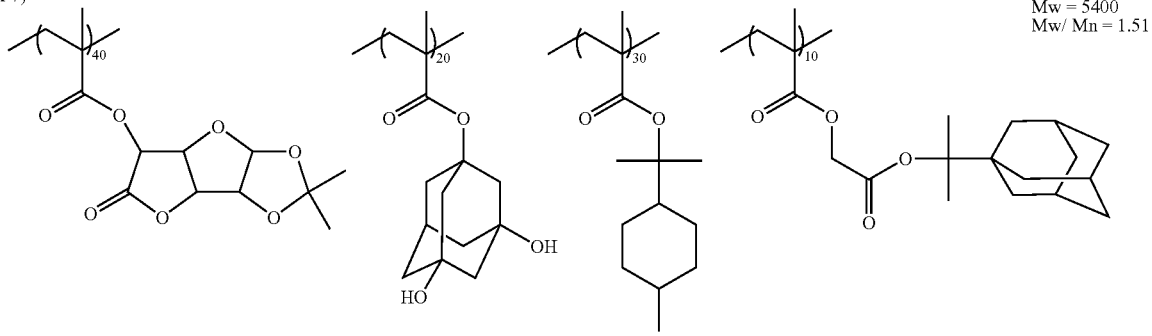
Mw = 5400
Mw/Mn = 1.51
(RA-8)
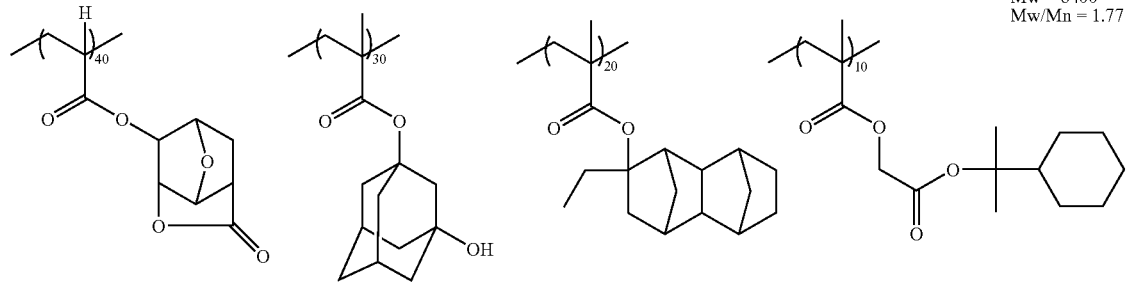
Mw = 8400
Mw/Mn = 1.77
(RA-9)
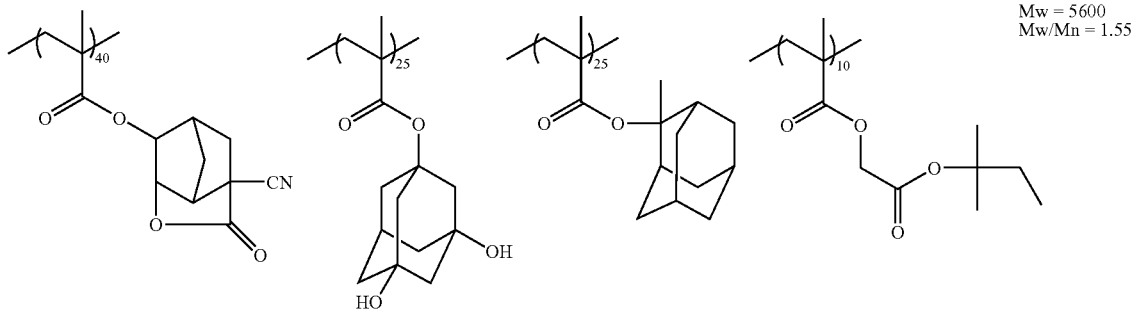
Mw = 5600
Mw/Mn = 1.55
(RA-10)
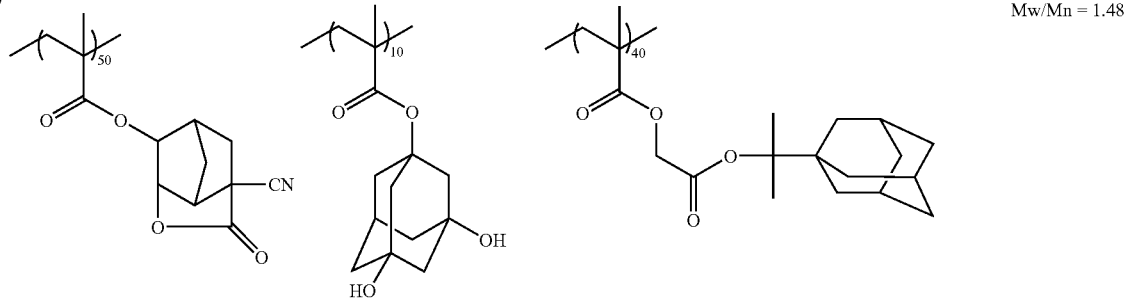
Mw = 4800
Mw/Mn = 1.48

-continued
(RA-11) 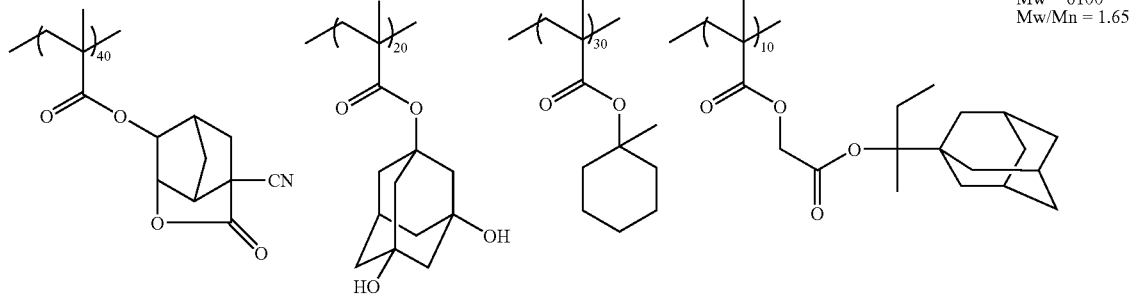
Mw = 6100
Mw/Mn = 1.65
(RA-12) 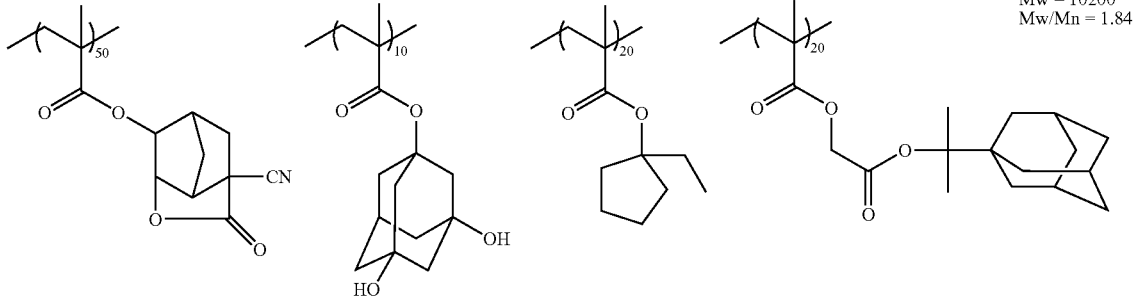
Mw = 10200
Mw/Mn = 1.84
(RA-13) 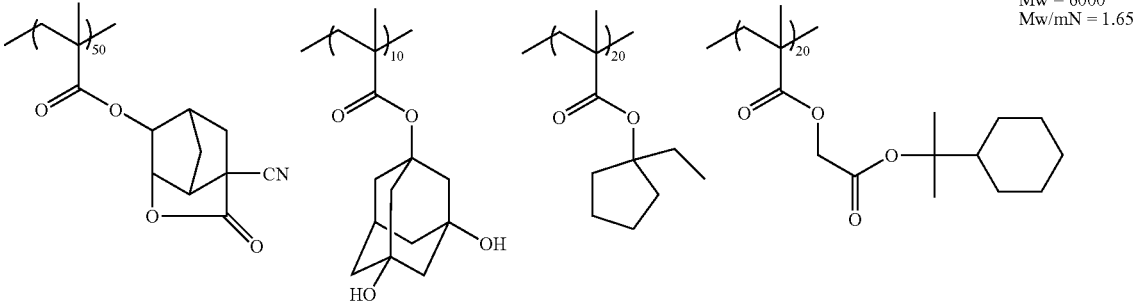
Mw = 6000
Mw/mN = 1.65
(RA-14) 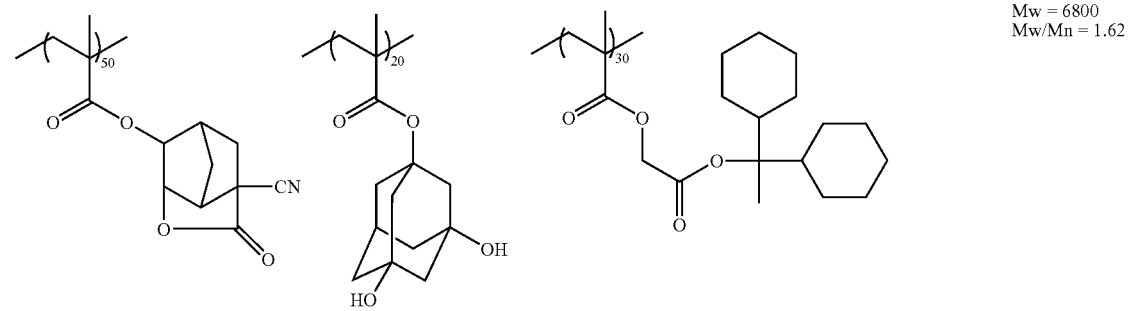
Mw = 6800
Mw/Mn = 1.62
RB-1 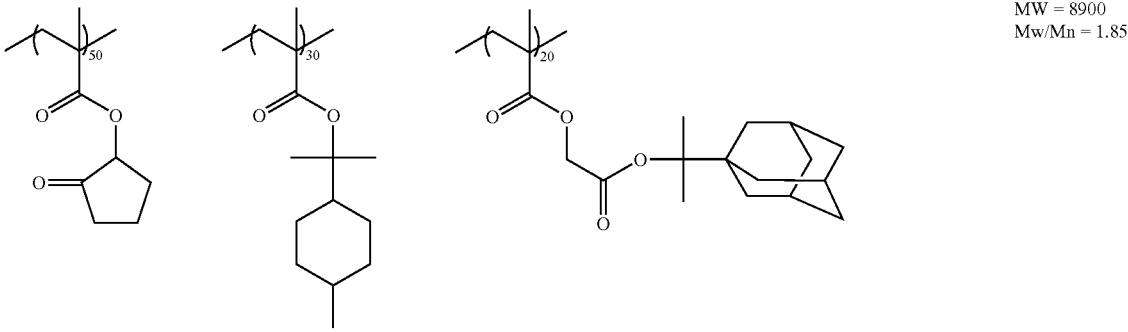
MW = 8900
Mw/Mn = 1.85

-continued
RB-2 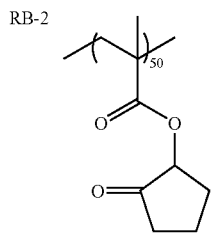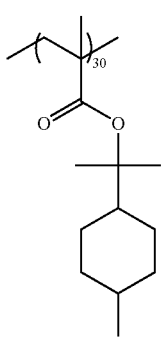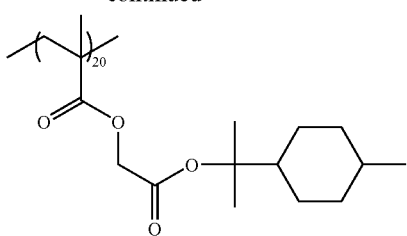
MW = 9800
Mw/Mn = 1.75
RB-3 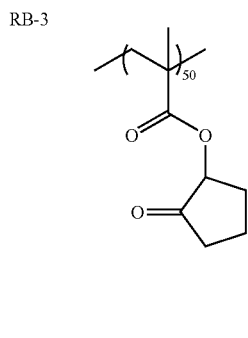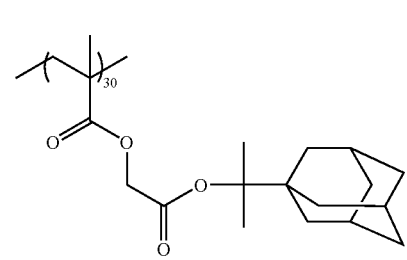
MW = 11200
Mw/Mn = 1.82
RB-4 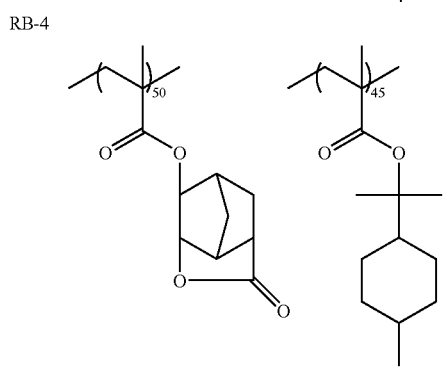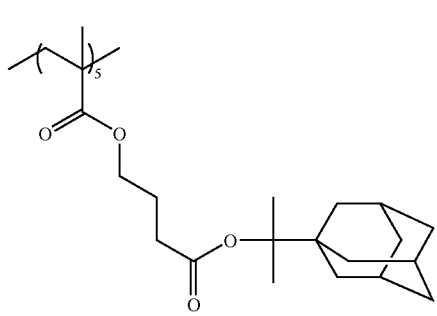
MW = 6700
Mw/Mn = 1.66
RB-5 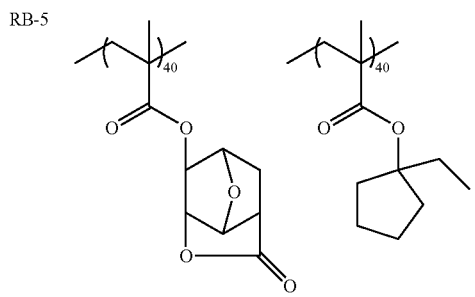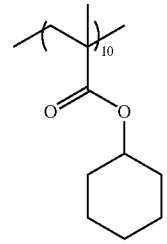
MW = 9600
Mw/Mn = 1.85
RB-6 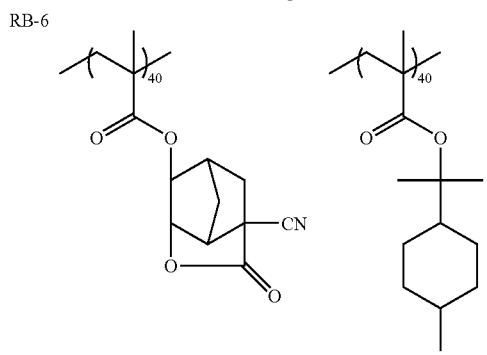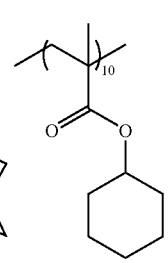
MW = 6500
Mw/Mn = 1.60

-continued
RB-7
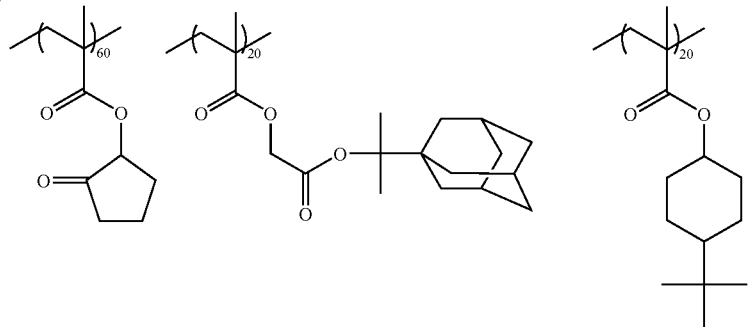
MW = 7700
Mw/Mn = 1.66
RB-8
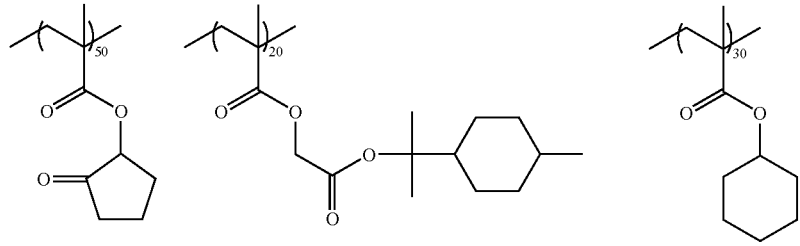
MW = 5400
Mw/Mn = 1.72
RB-9
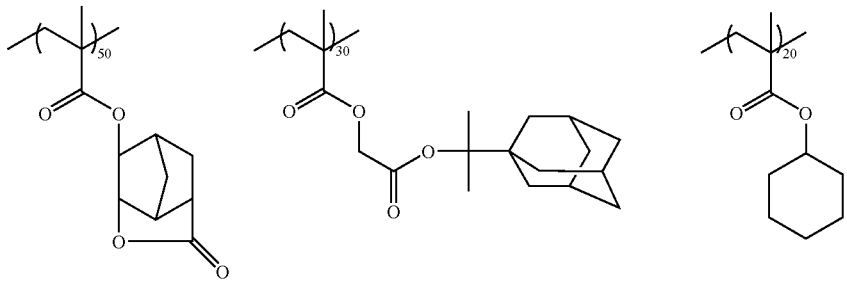
MW = 6700
Mw/Mn = 1.74
RB-10
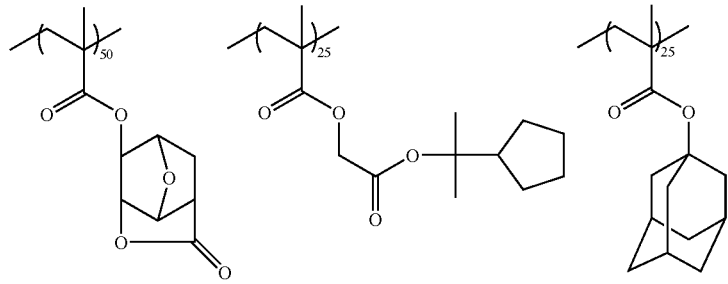
MW = 9400
Mw/Mn = 1.60
RB-11
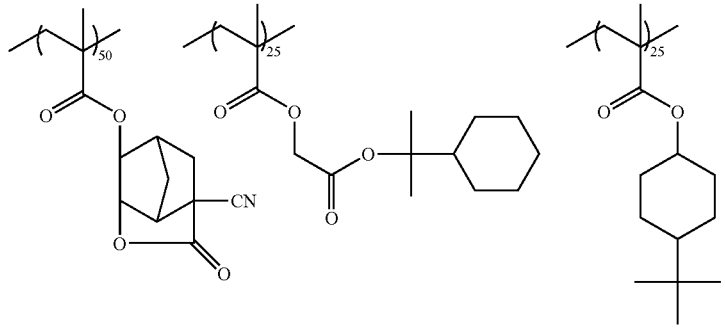
MW = 15000
Mw/Mn = 1.75

-continued
RB-12 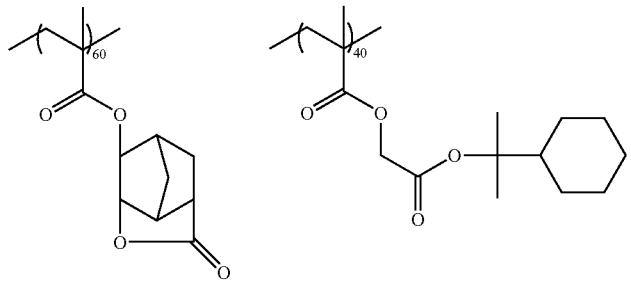
MW = 9000
Mw/Mn = 1.67
RB-13 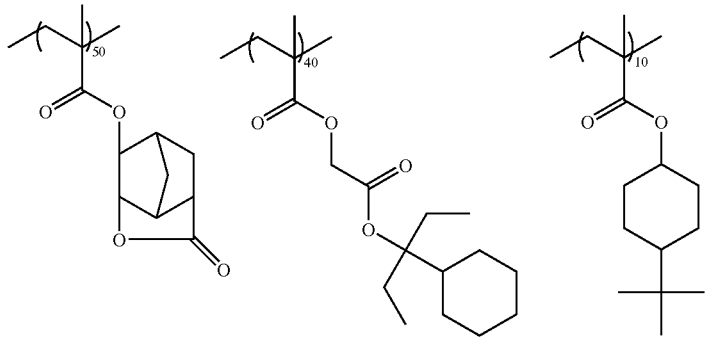
MW = 8200
Mw/Mn = 1.82
RB-14 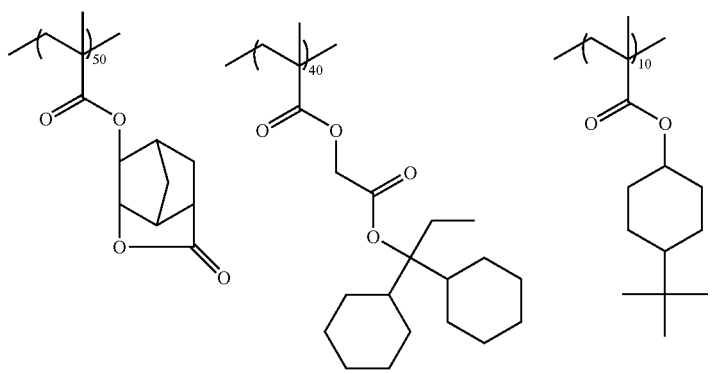
MW = 6700
Mw/Mn = 1.79
(RX-1) 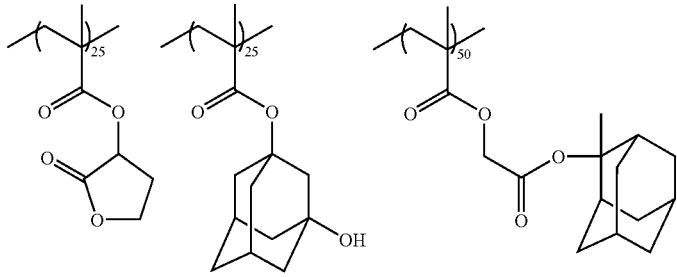
Mw = 14600
Mw/Mn = 1.92
(RX-2) 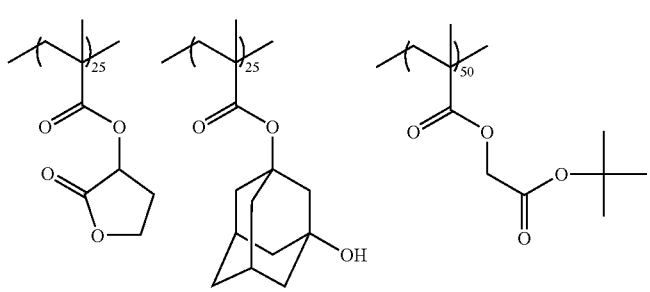
Mw = 13800
Mw/Mn = 1.89

Examples 1 to 28 and Comparative
Examples 1 and 2

Preparation of Resist

The components shown in Tables 1 and 2 below are dissolved in the solvent to prepare a solution having the concentration of solids content of 8 mass %. The obtained solution is filtered through a polyethylene filter having a pore diameter of 0.03 μm to prepare a positive resist solution. Each of the obtained positive resist solutions is evaluated according to the methods shown below, and the results obtained are also shown in Tables 1 and 2.

Evaluation of Resist:

Antireflection film DUV-42 (manufactured by Brewer Science) is uniformly coated in a thickness of 600 Å by a spin coater on a silicone substrate having been treated with hexamethyldisilazane, dried on a hot plate at 100° C. for 90 seconds, and then dried with heating at 190° C. for 240 seconds. After that, each positive resist solution is coated thereon with a spin coater and dried at 120° C. for 60 seconds to form a resist film having a thickness of 160 nm.

The resist film is subjected to exposure through a mask with an ArF excimer laser stepper (manufactured by ASML Co., NA=0.75, ⅔ zonal illumination), and the exposed resist film is heated on a hot plate at 120° C. for 90 seconds immediately after exposure. Further, the resist film is developed with a 2.38 mass % tetramethylammonium hydroxide aqueous solution at 23° C. for 60 seconds, rinsed with pure water for 30 seconds, and then dried to obtain a line pattern.

Evaluation of Falling Down of Pattern:

With the exposure quantity to reproduce a mask pattern of line and space of 85 nm being the optimal exposure quantity, and when the exposure quantity is further increased from the optimal exposure quantity to make the line width of the pattern formed thin, the line width resolved without causing falling down of the pattern is defined as the critical falling down of pattern. The smaller the value, the pattern is resolved without falling down, that is, falling down of pattern is difficult to occur.

Evaluation of Exposure Latitude:

Taking the exposure quantity required to reproduce a mask pattern of line and space of 85 nm as the optimal exposure quantity, the breadth of exposure quantity tolerating 80 nm±10% of a pattern size when exposure quantity is varied is found. The obtained value is divided by the optimal exposure quantity and the exposure latitude is shown in percentage. The greater the value, the smaller is the fluctuation of performance by the variation of exposure quantity, and exposure latitude is good.

TABLE 1

| Example No. | Acid Generator (g) | Resin (10 g) | Basic Compound (g) | Surfactant (g) | Solvent (mass ratio) | Falling Down of Pattern (nm) | Exposure Latitude (%) |
|---|---|---|---|---|---|---|---|
| 1 | z23 (0.5) | RA-1 | DIA (0.05) | W-4 (0.01) | S1/S5 = 60/40 | 55 | 13.9 |
| 2 | z15 (0.4) | RA-2 | PEA (0.05) | W-2 (0.02) | S1/S4/S5 = 80/5/15 | 55 | 13.7 |
| 3 | z67 (0.7) | RA-3 | TEA (0.03) | W-1 (0.01) | S1/S6 = 95/5 | 55 | 13.9 |
| 4 | z23 (0.3) z42 (0.1) | RA-4 | DIA (0.03) | W-4 (0.01) | S1/S5 = 60/40 | 55 | 13.8 |
| 5 | z15 (0.2) | RA-5 | PEA (0.02) | W-4 (0.01) | S1/S5 = 80/20 | 55 | 14.0 |
| 6 | z23 (0.2) z42 (0.2) | RA-6 | DIA (0.02) PEA (0.02) | W-4 (0.01) | S1/S4/S6 = 80/5/15 | 55 | 14.0 |
| 7 | z23 (0.3) z38 (0.3) | RA-7 | TMEA (0.03) | W-3 (0.03) | S1/S5 = 60/40 | 50 | 14.3 |
| 8 | z1 (0.2) z67 (0.2) | RA-8 | PBI (0.04) | W-1 (0.005) | S1/S6 = 80/20 | 50 | 14.2 |
| 9 | z23 (0.3) z61 (0.3) | RA-9 | DBA (0.03) | W-3 (0.02) | S1/S5 = 60/40 | 45 | 14.6 |
| 10 | z67 (0.5) | RA-10 | TPSA (0.05) | W-3 (0.01) | S1/S5 = 60/40 | 45 | 15.0 |
| 11 | z1 (0.2) z9 (0.2) | RA-11 | DIA (0.05) | W-4 (0.01) | S1/S5 = 60/40 | 45 | 14.9 |
| 12 | z23 (0.4) | RA-12 | PEA (0.05) | W-4 (0.01) | S1/S5 = 60/40 | 45 | 14.8 |
| 13 | z23 (0.2) z42 (0.2) | RA-13 | TEA (0.04) | W-4 (0.01) | S1/S5 = 60/40 | 45 | 15.1 |
| 14 | z23 (0.5) | RA-14 | DIA (0.05) | W-4 (0.01) | S1/S5 = 60/40 | 45 | 14.9 |
| Comp. Ex. 1 | z23 (0.5) | RX-1 | DIA (0.05) | W-4 (0.01) | S1/S5 = 60/40 | 60 | 12.8 |
| Comp. Ex. 2 | z23 (0.5) | RX-2 | DIA (0.05) | W-4 (0.01) | S1/S5 = 60/40 | 65 | 10.6 |

TABLE 2

| Example No. | Acid Generator (g) | Resin (10 g) | Basic Compound (g) | Surfactant (g) | Solvent (mass ratio) | Falling Down of Pattern (nm) | Exposure Latitude (%) |
|---|---|---|---|---|---|---|---|
| 15 | z23 (0.5) | RB-1 | DIA (0.05) | W-4 (0.01) | S1 | 50 | 13.5 |
| 16 | z15 (0.4) | RB-2 | PEA (0.05) | W-4 (0.01) | S1 | 45 | 13.7 |
| 17 | z67 (0.7) | RB-3 | DIA (0.04) D-1 (0.01) | W-1 (0.005) W-4 (0.005) | S1 | 45 | 14.2 |

TABLE 2-continued

| Example No. | Acid Generator (g) | Resin (10 g) | Basic Compound (g) | Surfactant (g) | Solvent (mass ratio) | Falling Down of Pattern (nm) | Exposure Latitude (%) |
|---|---|---|---|---|---|---|---|
| 18 | z23 (0.3) z42 (0.1) | RB-4 | DIA (0.04) D-2 (0.01) | W-2 (0.01) | S3 | 45 | 14.3 |
| 19 | z23 (0.3) z38 (0.1) | RB-5 | PEA (0.05) | W-3 (0.01) | S3 | 45 | 13.9 |
| 20 | z23 (0.3) z61 (0.1) | RB-6 | TEA (0.03) | W-2 (0.005) W-3 (0.005) | S3 | 50 | 13.4 |
| 21 | z23 (0.3) z42 (0.1) | RB-7 | DIA (0.04) D-3 (0.01) | W-4 (0.01) | S1/S4 = 50/50 | 45 | 15.0 |
| 22 | z23 (0.3) z38 (0.1) | RB-8 | DIA (0.04) D-4 (0.01) | W-4 (0.01) | S1/S4 = 50/50 | 45 | 14.8 |
| 23 | z23 (0.3) z61 (0.1) | RB-9 | TEA (0.03) | W-2 (0.01) | S1/S4 = 50/50 | 55 | 14.4 |
| 24 | z23 (0.3) z42 (0.1) | RB-10 | DIA (0.03) DBA (0.01) | W-4 (0.01) | S1 | 55 | 13.8 |
| 25 | z23 (0.3) z38 (0.1) | RB-11 | TEA (0.02) PBI (0.02) | W-4 (0.01) | S1 | 45 | 13.4 |
| 26 | z23 (0.3) z61 (0.1) | RB-12 | DIA (0.03) DBA (0.01) | W-4 (0.01) | S3 | 50 | 14.2 |
| 27 | z23 (0.5) | RB-13 | DIA (0.05) | W-4 (0.01) | S3 | 45 | 14.1 |
| 28 | z15 (0.4) | RB-14 | PEA (0.05) | W-4 (0.01) | S3 | 45 | 13.9 |

The abbreviations in the Tables are shown below.

Acid Generators:

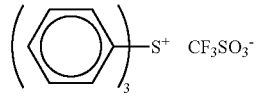
(z1)

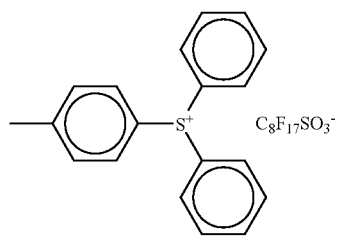
(z9)

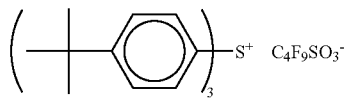
(z15)

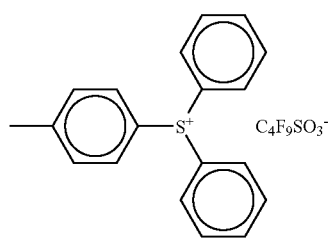
(z23)

-continued

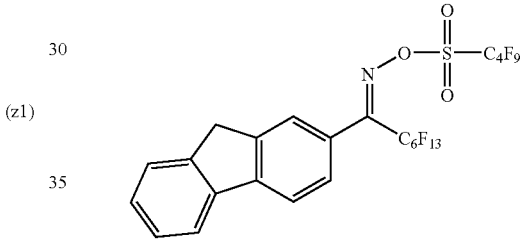
(z38)

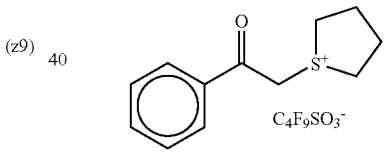
(z42)

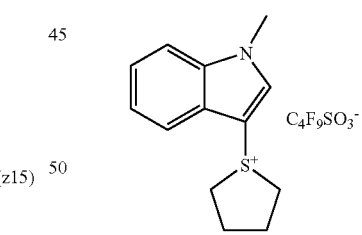
(z61)

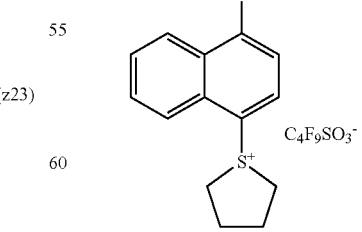
(z67)

Basic Compounds:
TPSA: Triphenylsulfonium acetate
DIA: 2,6-Diisopropylaniline

TEA: Triethanolamine
DBA: N,N-Dibutylaniline
PBI: 2-Phenylbenzimidazole
TMEA: Tris(methoxyethoxyethyl)amine
PEA: N-Phenyldiethanolamine
D-1: Triphenoxyethoxyethylamine
D-2: N,N-Diphenoxyethoxyethylphenoxyethoxyethylamine
D-3: 2-Phenylbenzimidazole
D-4: Dicyclohexylmethylamine Surfactants:
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)

Solvents:
S1: Propylene glycol methyl ether acetate
S2: 2-Heptanone
S3: Cyclohexanone
S4: γ-Butyrolactone
S5: Propylene glycol methyl ether
S6: Ethyl lactate
S7: Propylene carbonate It can be seen from the results shown in Tables 1 and 2 that the positive photosensitive compositions in the invention are excellent in falling down of pattern and exposure latitude.

(Immersion Exposure)

Preparation of Resist:

The components in Example 10 shown in Table 1 and 0.5 g of the resin HR-54 are dissolved in the solvent to prepare a solution having the concentration of solids content of 6 mass %. The obtained solution is filtered through a polyethylene filter having a pore diameter of 0.03 μm to prepare a positive resist solution. Each of the obtained positive resist solutions is evaluated according to the following method.

Evaluation of Resolution:

An organic antireflection film ARC29A (manufactured by Nissan Chemical Industries, Ltd.) is coated on a silicone wafer, and the coating is baked at 205° C. for 60 seconds to thereby form an antireflection film having a thickness of 78 nm. The above-prepared positive resist solution is coated on the antireflection film and baked at 115° C. for 60 seconds to form a resist film having a thickness of 140 nm.

The obtained wafer is subjected to two-beam interference exposure with pure water as the immersion liquid (wet exposure). In the two-beam interference exposure (wet exposure), as shown in FIG. 1, wafer 10 having an antireflection film a resist film is exposed via prism 8 and immersion liquid 9 (pure water) with laser 1, diaphragm 2, shutter 3, three reflection mirrors 4, 5 and 6, and condenser lens 7. The wavelength of laser 1 is 193 nm, and prism 8 for forming line and space pattern of 65 nm is used. Immediately after exposure, the wafer is subjected to heating at 115° C. for 90 seconds, development with a tetramethylammonium hydroxide aqueous solution (2.38%) for 60 seconds, rinsing with pure water, and drying with spinning to obtain a resist pattern, and the obtained resist pattern is observed with a scanning electron microscope S9260 (manufactured by Hitachi, Ltd.). As a result, line and space patterns of 65 nm are resolved without causing falling down of pattern. It is apparent that the positive photosensitive compositions according to the invention have good image forming property also in the exposure method using an immersion liquid.

According to the invention, a positive photosensitive composition improved in falling down of a pattern and exposure latitude even in formation of a pattern having a line width of as fine as 100 nm or less, and a pattern-forming method using the same can be provided.

The entire disclosure of each and every foreign patent application from which the benefit of foreign priority has been claimed in the present application is incorporated herein by reference, as if fully set forth.

What is claimed is:

1. A positive photosensitive composition comprising:
    (A) a compound that generates an acid upon irradiation with actinic ray or radiation; and
    (B) a resin that increases its solubility in an alkali developer by action of an acid,
    wherein the resin (B) has a repeating unit that has an acid-decomposable group and is represented by formula (I):

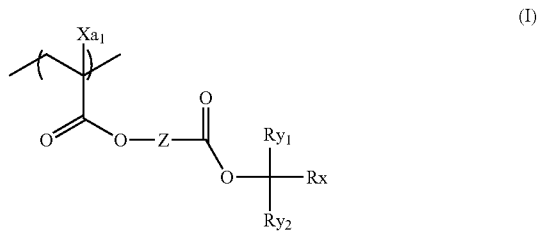

wherein $Xa_1$ represents a hydrogen atom, an alkyl group, a cyano group, or a halogen atom, wherein the alkyl group does not include a fluoroalkyl group, and the halogen atom does not include a fluorine atom; $Ry_1$ and $Ry_2$ each independently represents an alkyl group or a cycloalkyl group; Rx represents an alkyl group having 2 or more carbon atoms, or a cycloalkyl group; and Z represents an acyclic alkylene group.

2. The positive photosensitive composition as claimed in claim 1,
    wherein the resin (B) further has a repeating unit having at least one group selected from a lactone group, a hydroxyl group, a cyano group, and an alkali-soluble group.

3. The positive photosensitive composition as claimed in claim 1,
    wherein the resin (B) further has a repeating unit having a hydroxystyrene structure.

4. The positive photosensitive composition as claimed in claim 1,
    wherein the resin (B) further has a repeating unit that has an acid-decomposable group and is other than the repeating unit represented by formula (I).

5. A pattern-forming method comprising:
    forming a film with the positive photosensitive composition as claimed in claim 1; and exposing and developing the film.

6. The positive photosensitive composition according to claim 1,
    wherein the alkylene group represented by Z is an alkylene group having from 1 to 8 carbon atoms which may contain a linking group having a hetero atom.

7. The positive photosensitive composition according to claim 6, wherein the alkylene group represented by Z is an alkylene group having from 1 to 4 carbon atoms.

8. A resin having:
a repeating unit represented by formula (I); and
a repeating unit having at least one group selected from a lactone group, a hydroxyl group, a cyano group, and an alkali-soluble group:

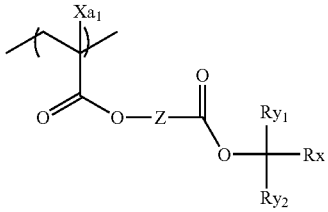

(I)

wherein $Xa_1$ represents a hydrogen atom, an alkyl group, a cyano group, or a halogen atom, wherein the alkyl group does not include a fluoroalkyl group, and the halogen atom does not include a fluorine atom; $Ry_1$ and $Ry_2$ each independently represents an alkyl group or a cycloalkyl group; Rx represents an alkyl group having 2 or more carbon atoms, or a cycloalkyl group; and Z represents an acyclic alkylene group.

9. The resin as claimed in claim 8,
wherein at least one of $Ry_1$ and $Ry_2$ is an alkyl group having 2 or more carbon atoms.

10. The resin according to claim 8,
wherein the alkylene group represented by Z is an alkylene group having from 1 to 8 carbon atoms which may contain a linking group having a hetero atom.

11. The resin according to claim 10,
wherein the alkylene group represented by Z is an alkylene group having from 1 to 4 carbon atoms.

12. A resin having a repeating unit represented by formula (I-a):

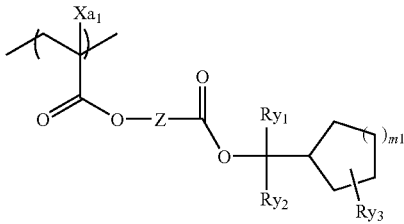

(I-a)

wherein $Xa_1$ represents a hydrogen atom, an alkyl group, a cyano group, or a halogen atom, wherein the alkyl group does not include a fluoroalkyl group, and the halogen atom does not include a fluorine atom; $Ry_1$ and $Ry_2$ each independently represents an alkyl group or a cycloalkyl group; $Ry_3$ represents a hydrogen atom or an alkyl group; Z represents an acyclic alkylene group; and m1 represents 1 or 2.

13. The resin as claimed in claim 12,
wherein at least one of $Ry_1$ and $Ry_2$ is an alkyl group having 2 or more carbon atoms.

14. The resin according to claim 12,
wherein the alkylene group represented by Z is an alkylene group having from 1 to 8 carbon atoms which may contain a linking group having a hetero atom.

15. The resin according to claim 14,
wherein the alkylene group represented by Z is an alkylene group having from 1 to 4 carbon atoms.

16. A polymerizable compound represented by formula (I'):

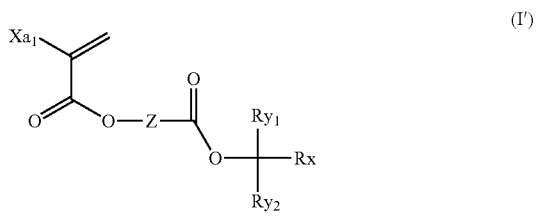

(I')

wherein $Xa_1$ represents a hydrogen atom, an alkyl group, a cyano group, or a halogen atom, wherein the alkyl group does not include a fluoroalkyl group, and the halogen atom does not include a fluorine atom; $Ry_1$ and $Ry_2$ each independently represents an alkyl group or a cycloalkyl group; Rx represents an alkyl group having 2 or more carbon atoms, or a cycloalkyl group; and Z represents an acyclic alkylene group.

17. The polymerizable compound as claimed in claim 16,
wherein at least one of $Ry_1$ and $Ry_2$ is an alkyl group having 2 or more carbon atoms.

18. The polymerizable compound according to claim 16,
wherein the alkylene group represented by Z is an alkylene group having from 1 to 8 carbon atoms which may contain a linking group having a hetero atom.

19. The polymerizable compound according to claim 18,
wherein the alkylene group represented by Z is an alkylene group having from 1 to 4 carbon atoms.

20. A polymerizable compound represented by formula (I-a1):

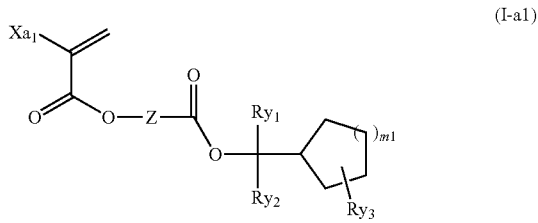

(I-a1)

wherein $Xa_1$ represents a hydrogen atom, an alkyl group, a cyano group, or a halogen atom, wherein the alkyl group does not include a fluoroalkyl group, and the halogen atom does not include a fluorine atom; $Ry_1$ and $Ry_2$ each independently represents an alkyl group or a cycloalkyl group; $Ry_3$ represents a hydrogen atom or an alkyl group; Z represents an acyclic alkylene group; and m1 represents 1 or 2.

21. The polymerizable compound as claimed in claim 20,
wherein at least one of $Ry_1$ and $Ry_2$ is an alkyl group having 2 or more carbon atoms.

22. The polymerizable compound according to claim 20,
wherein the alkylene group represented by Z is an alkylene group having from 1 to 8 carbon atoms which may contain a linking group having a hetero atom.

23. The polymerizable compound according to claim 22,
wherein the alkylene group represented by Z is an alkylene group having from 1 to 4 carbon atoms.

* * * * *